(12) United States Patent
Rimer et al.

(10) Patent No.: US 10,662,070 B2
(45) Date of Patent: May 26, 2020

(54) ZEOLITE COMPOSITIONS AND METHODS FOR TAILORING ZEOLITE CRYSTAL HABITS WITH GROWTH MODIFIERS

(71) Applicant: University of Houston System, Houston, TX (US)

(72) Inventors: Jeffrey D. Rimer, Houston, TX (US); Manjesh Kumar, Houston, TX (US)

(73) Assignee: UNIVERSITY OF HOUSTON SYSTEM, Houston, TX (US)

( * ) Notice: Subject to any disclaimer, the term of this patent is extended or adjusted under 35 U.S.C. 154(b) by 0 days.

(21) Appl. No.: 16/183,862

(22) Filed: Nov. 8, 2018

(65) Prior Publication Data
US 2019/0144291 A1    May 16, 2019

Related U.S. Application Data

(62) Division of application No. 14/305,097, filed on Jun. 16, 2014, now Pat. No. 10,173,903.

(51) Int. Cl.
    *C01B 39/04*    (2006.01)
    *B01J 29/70*    (2006.01)
    (Continued)

(52) U.S. Cl.
    CPC ........... *C01B 39/54* (2013.01); *B01J 29/7015* (2013.01); *B01J 47/00* (2013.01); *C01B 39/04* (2013.01); *C30B 7/14* (2013.01); *C30B 29/14* (2013.01); *C30B 29/34* (2013.01); *C30B 29/60* (2013.01); *B01J 29/035* (2013.01); *B01J 29/06* (2013.01); *B01J 29/85* (2013.01); *B01J 35/002* (2013.01); *B01J 35/0033* (2013.01); *B01J 35/023* (2013.01); *B01J 2229/62* (2013.01); *C01P 2004/03* (2013.01); *C01P 2004/20* (2013.01); *C01P 2004/38* (2013.01); *C01P 2004/60* (2013.01)

(58) Field of Classification Search
CPC ..... C01B 39/04; C01B 39/54; C01P 2004/03; C01P 2004/20; C01P 2004/38; C01P 2004/60; B01J 29/7015; B01J 35/023; B01J 29/83; B01J 29/85
See application file for complete search history.

(56) References Cited

U.S. PATENT DOCUMENTS

| | | | |
|---|---|---|---|
| 10,173,903 B2 * | 1/2019 | Rimer | C01B 39/54 |
| 2012/0202006 A1 * | 8/2012 | Rimer | C01B 37/02 428/131 |

* cited by examiner

*Primary Examiner* — David M Brunsman
(74) *Attorney, Agent, or Firm* — Jackson Walker LLP

(57) ABSTRACT

Embodiments of the invention generally provide compositions of crystalline zeolite materials with tailored crystal habits and the methods for forming such crystalline zeolite materials. The methods for forming the crystalline zeolite materials include binding one or more zeolite growth modifiers (ZGMs) to the surface of a zeolite crystal, which results in the modification of crystal growth rates along different crystallographic directions, leading to the formation of zeolites having a tailored crystal habit. The improved properties enabled by the tailored crystal habit include a minimized crystal thickness, a shortened internal diffusion pathlength, and a greater step density as compared to a zeolite having the native crystal habit prepared by traditional processes. The tailored crystal habit provides the crystalline zeolite materials with an aspect ratio of about 4 or greater and crystal surfaces having a step density of about 25 steps/$\mu m^2$ or greater.

2 Claims, 42 Drawing Sheets

(51) Int. Cl.
  *C01B 39/48* (2006.01)
  *B01J 29/85* (2006.01)
  *C01B 39/54* (2006.01)
  *B01J 47/00* (2017.01)
  *C30B 7/14* (2006.01)
  *C30B 29/14* (2006.01)
  *C30B 29/34* (2006.01)
  *C30B 29/60* (2006.01)
  *B01J 29/06* (2006.01)
  *B01J 35/00* (2006.01)
  *B01J 35/02* (2006.01)
  *B01J 29/035* (2006.01)

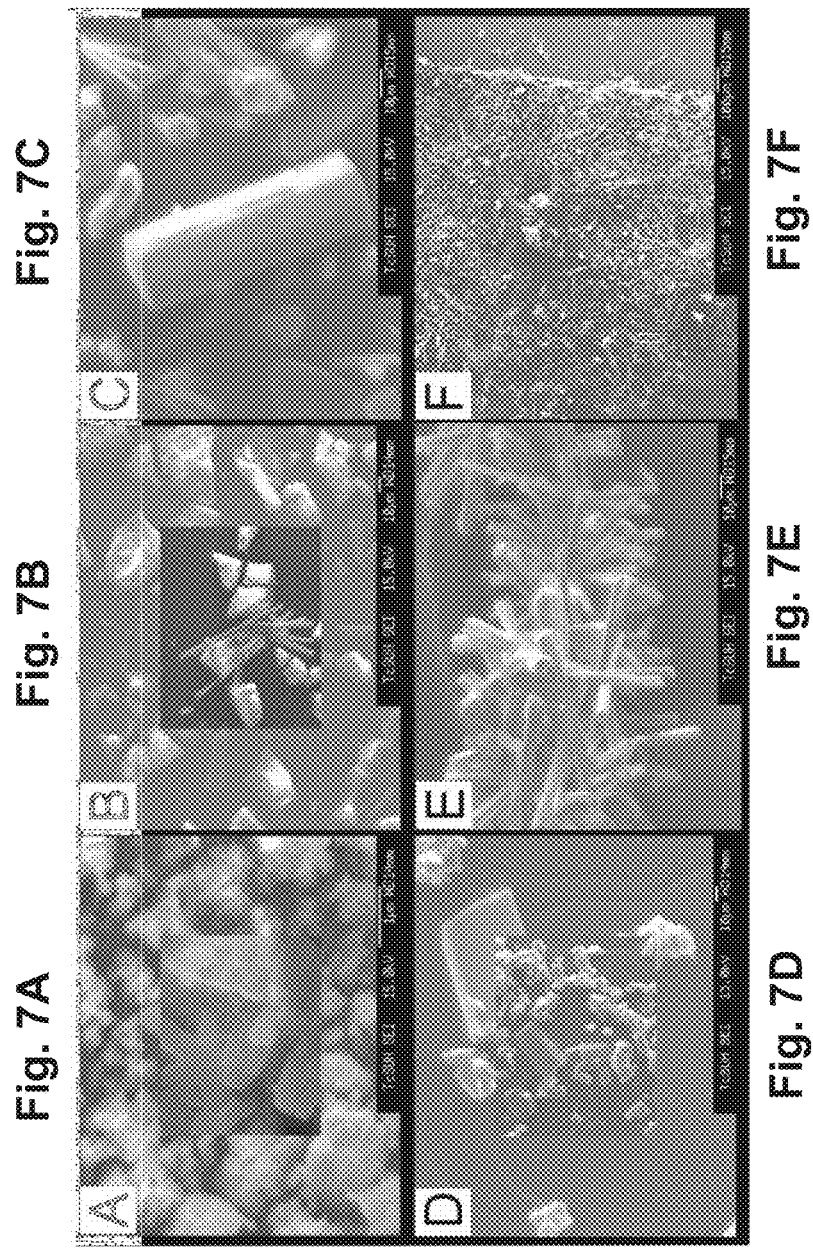

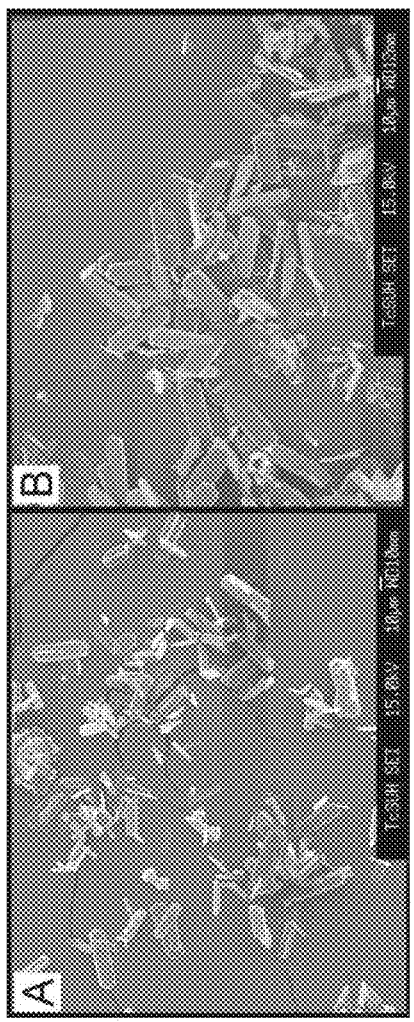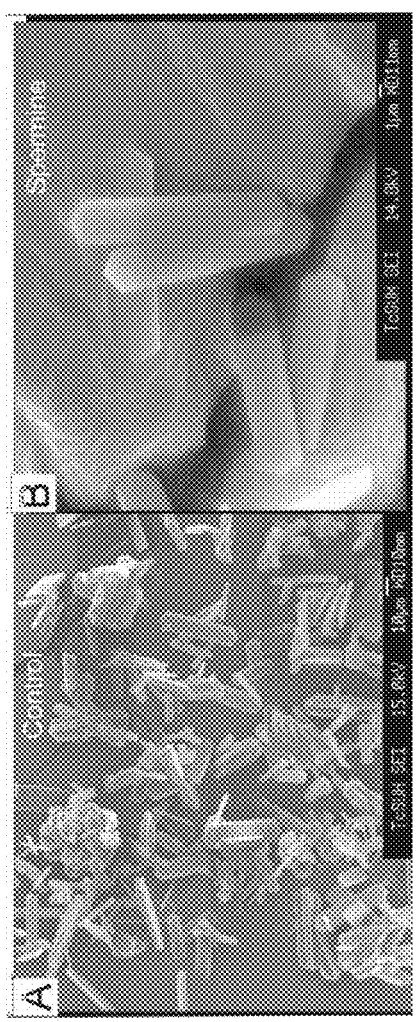
Fig. 8A  Fig. 8B  Fig. 9A  Fig. 9B

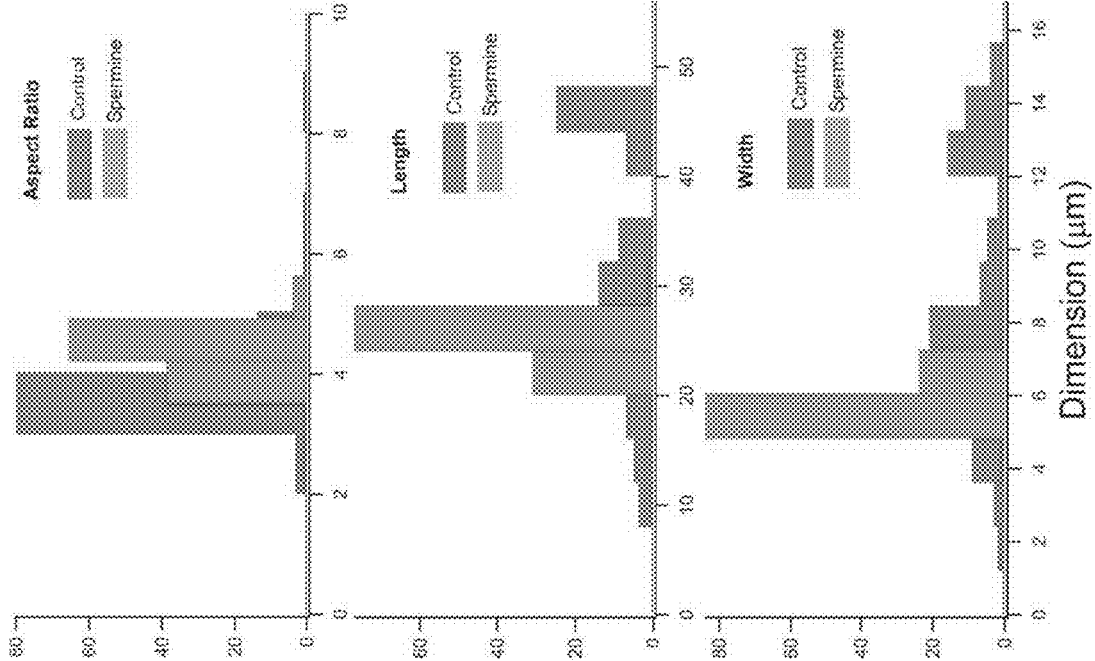

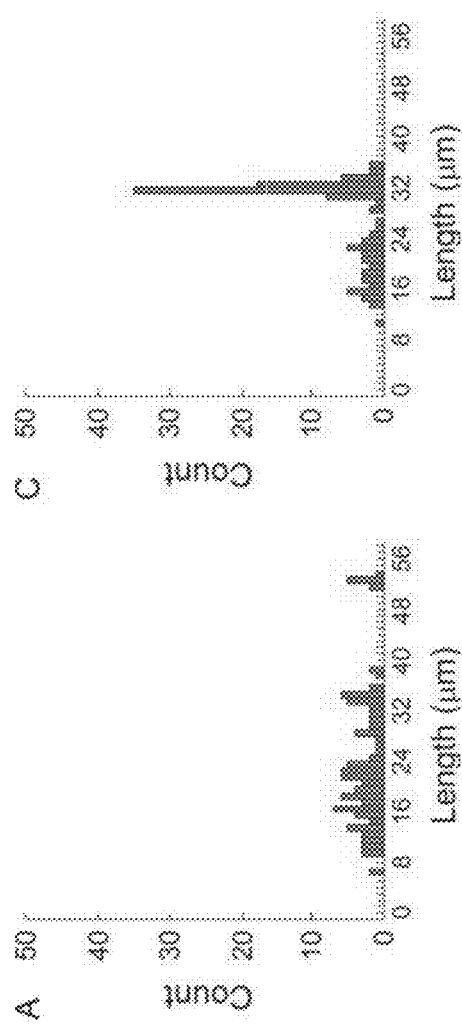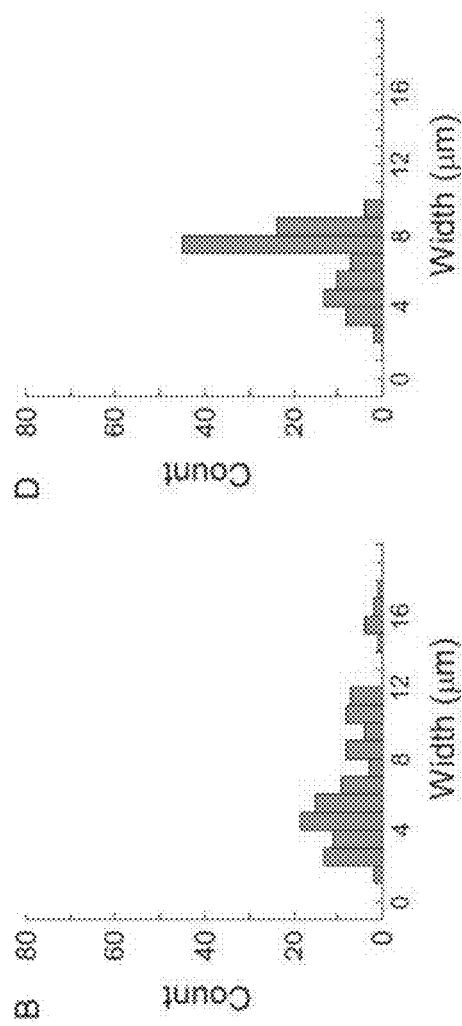
Fig. 11A, Fig. 11B, Fig. 11C, Fig. 11D

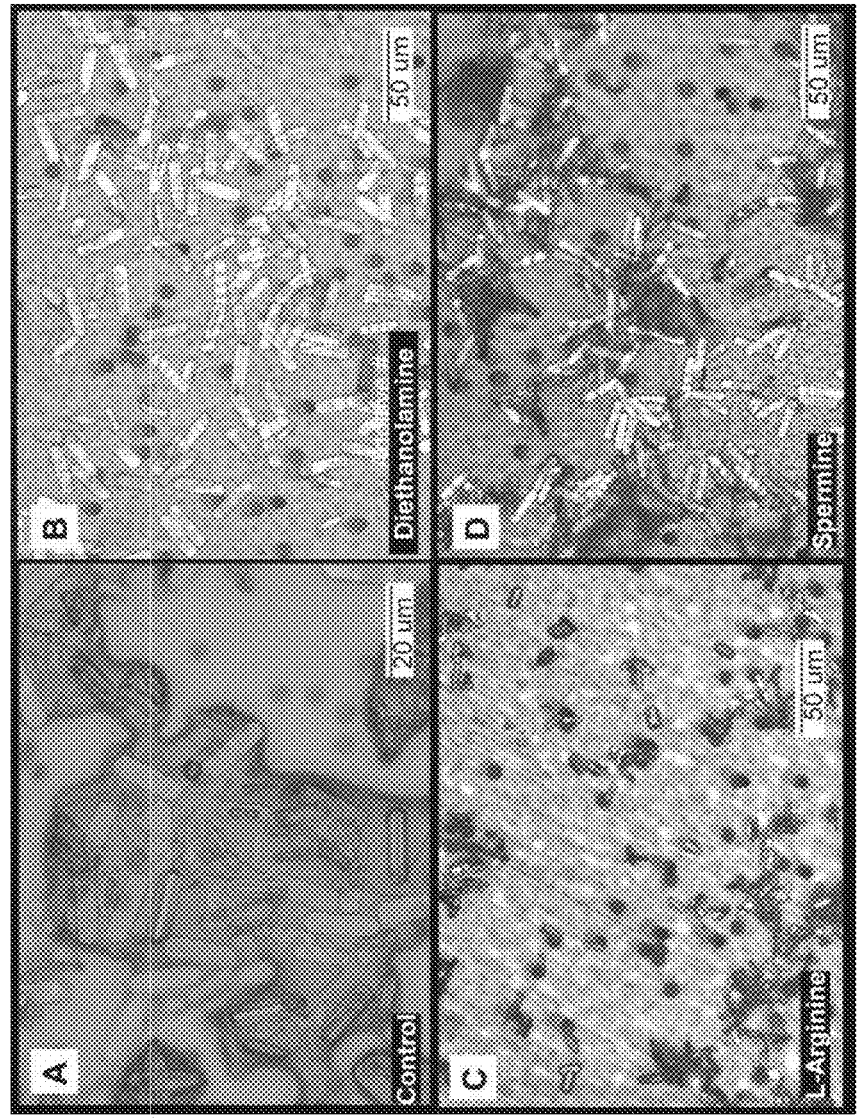

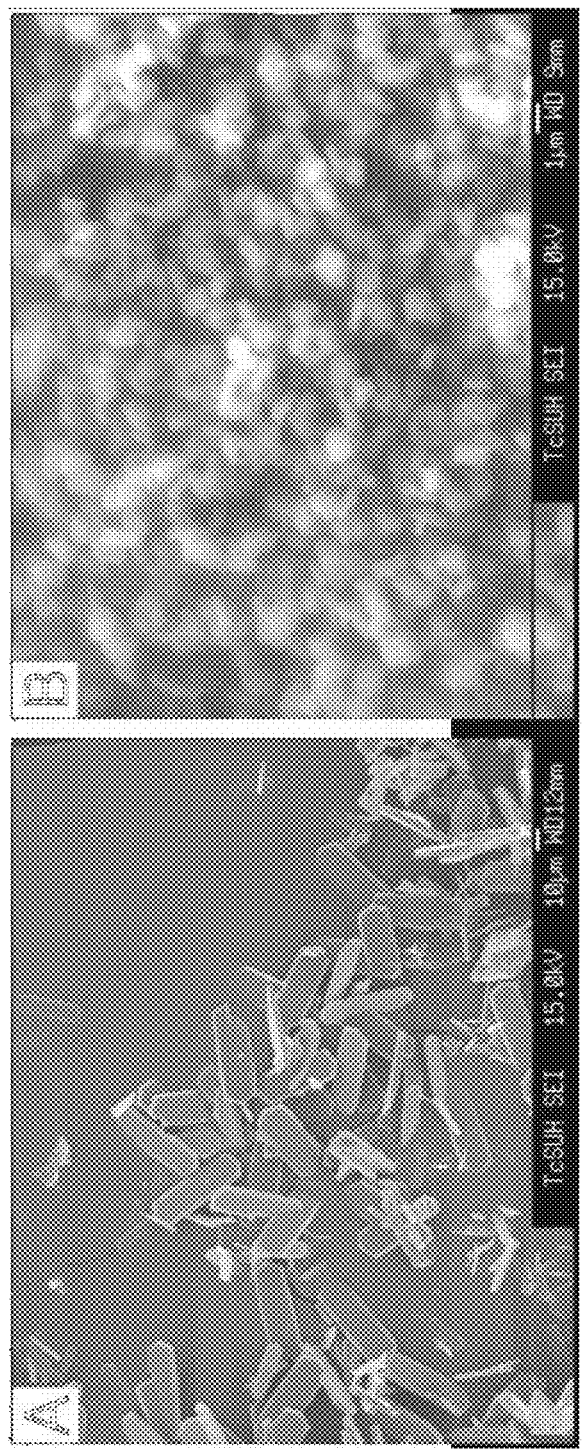

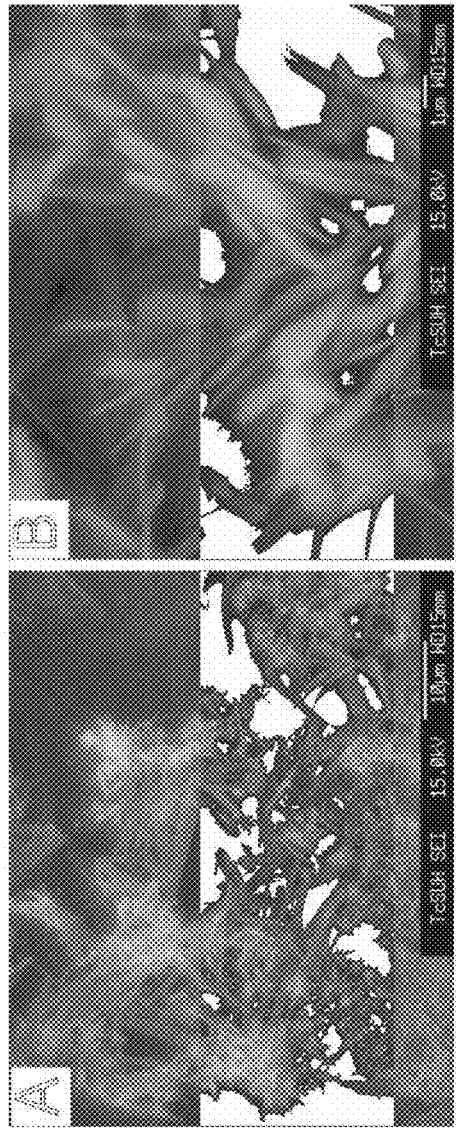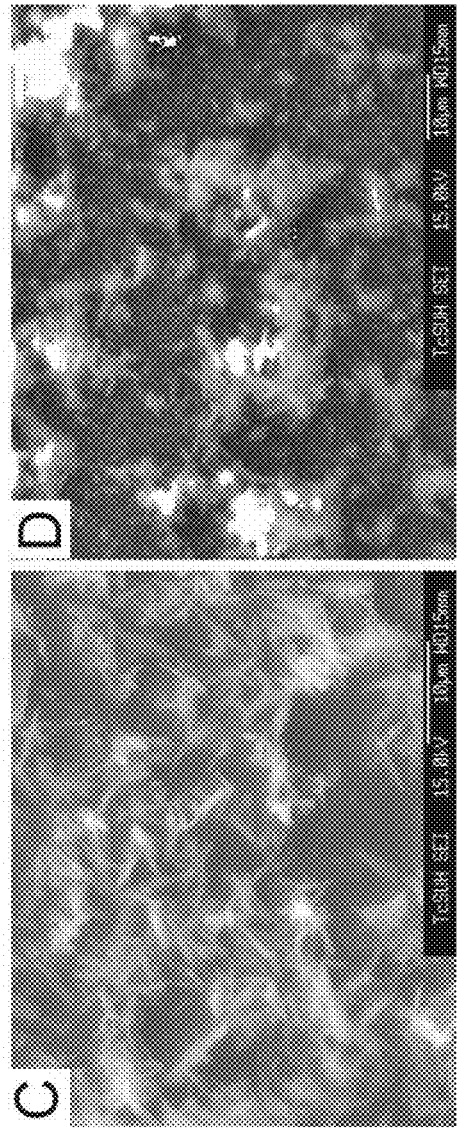

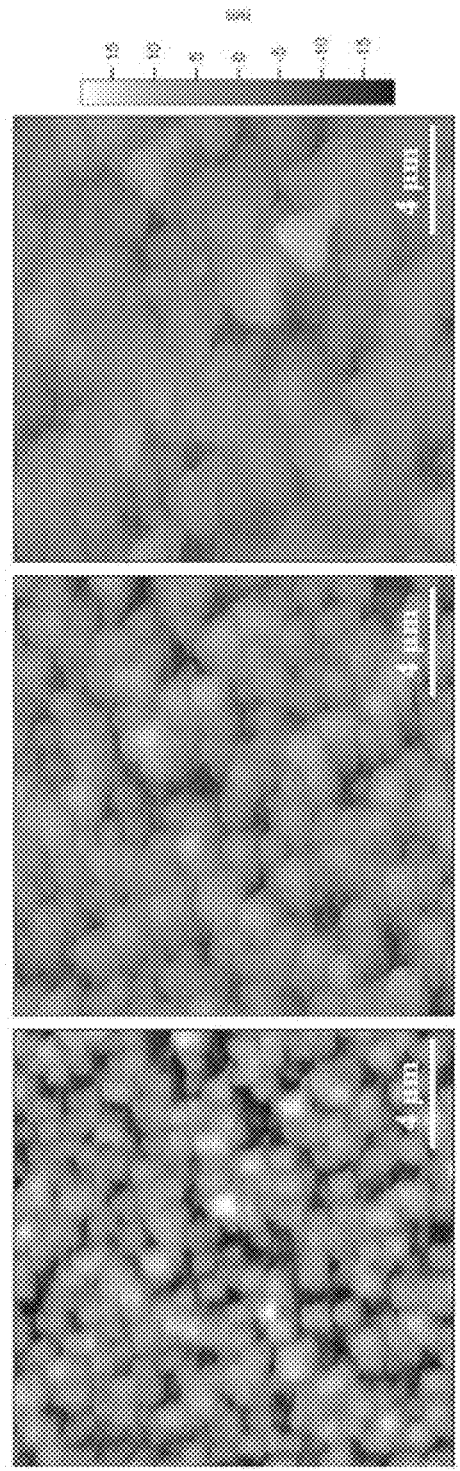

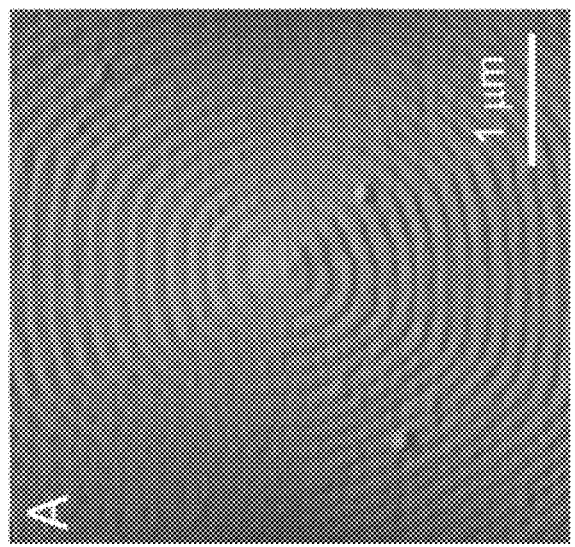
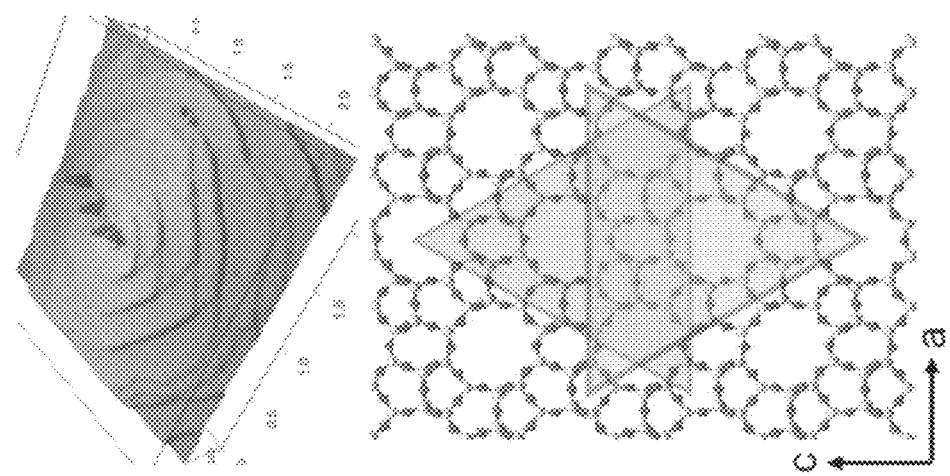
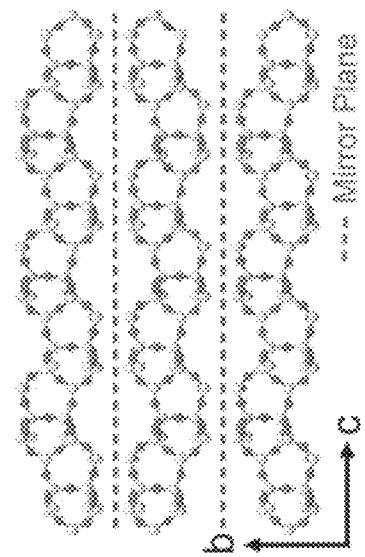
Fig. 19A
Fig. 19B
Fig. 19C
Fig. 19D

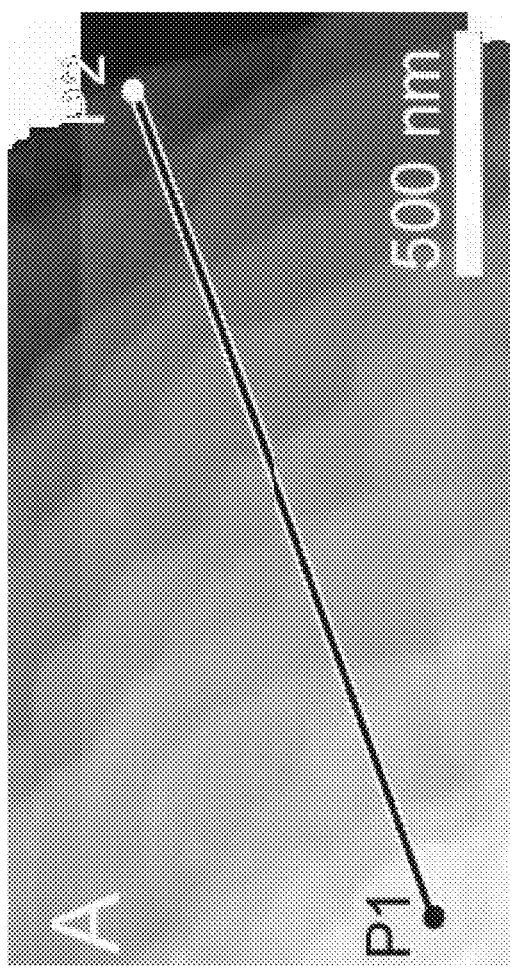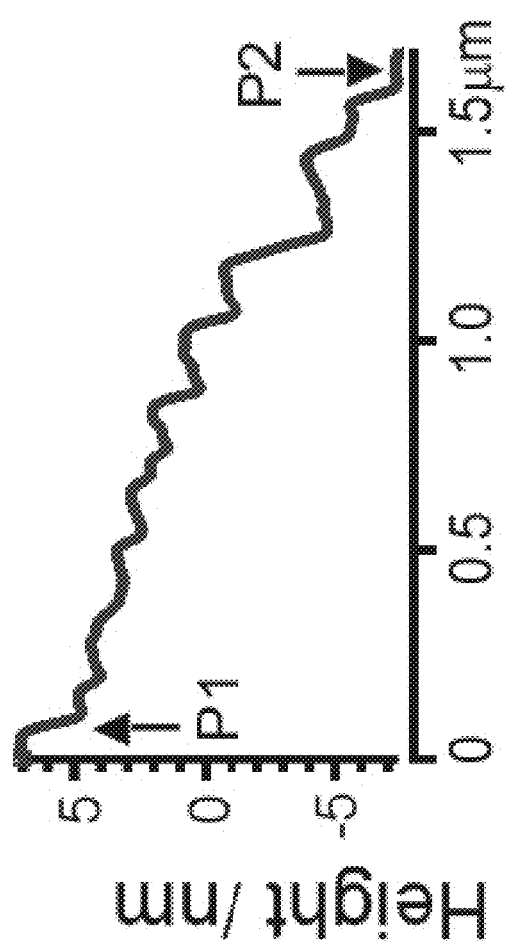
Fig. 26A
Fig. 26B

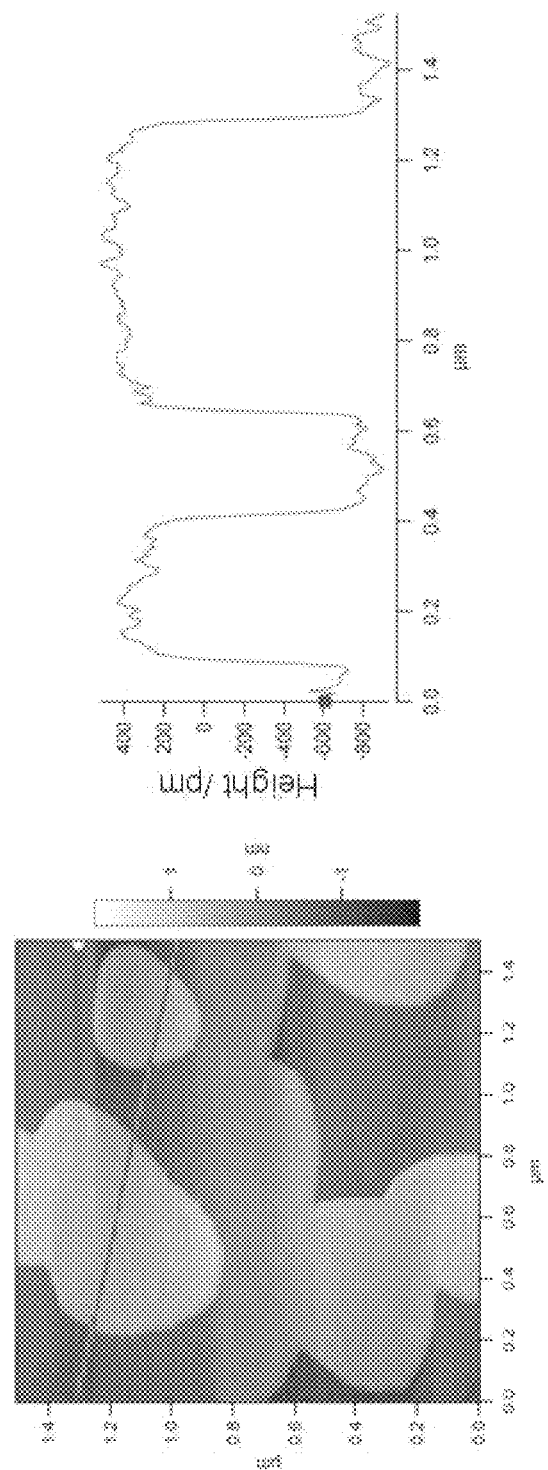

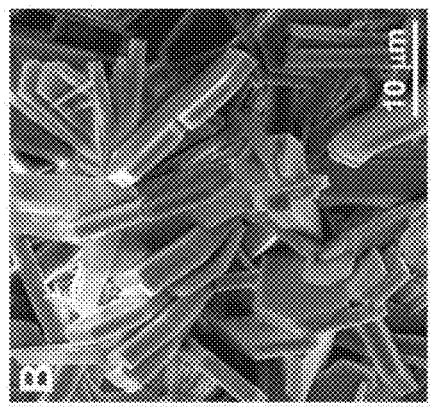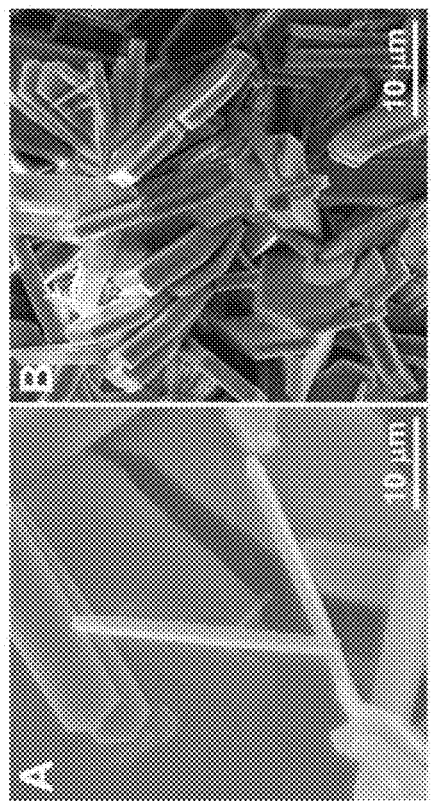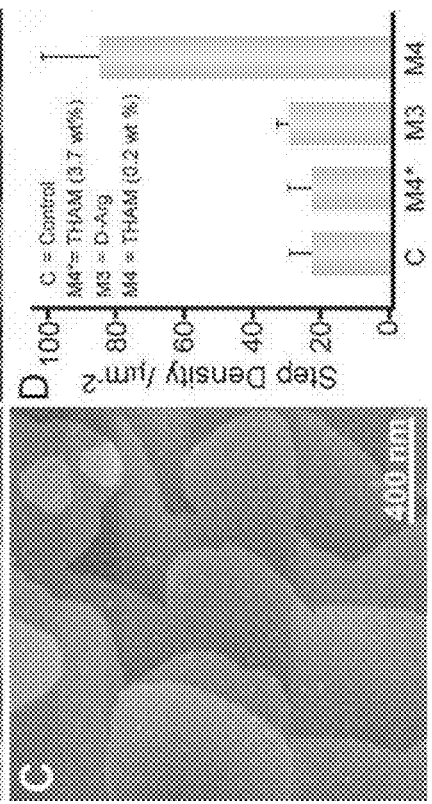
Fig. 32A  Fig. 32B  Fig. 32C  Fig. 32D

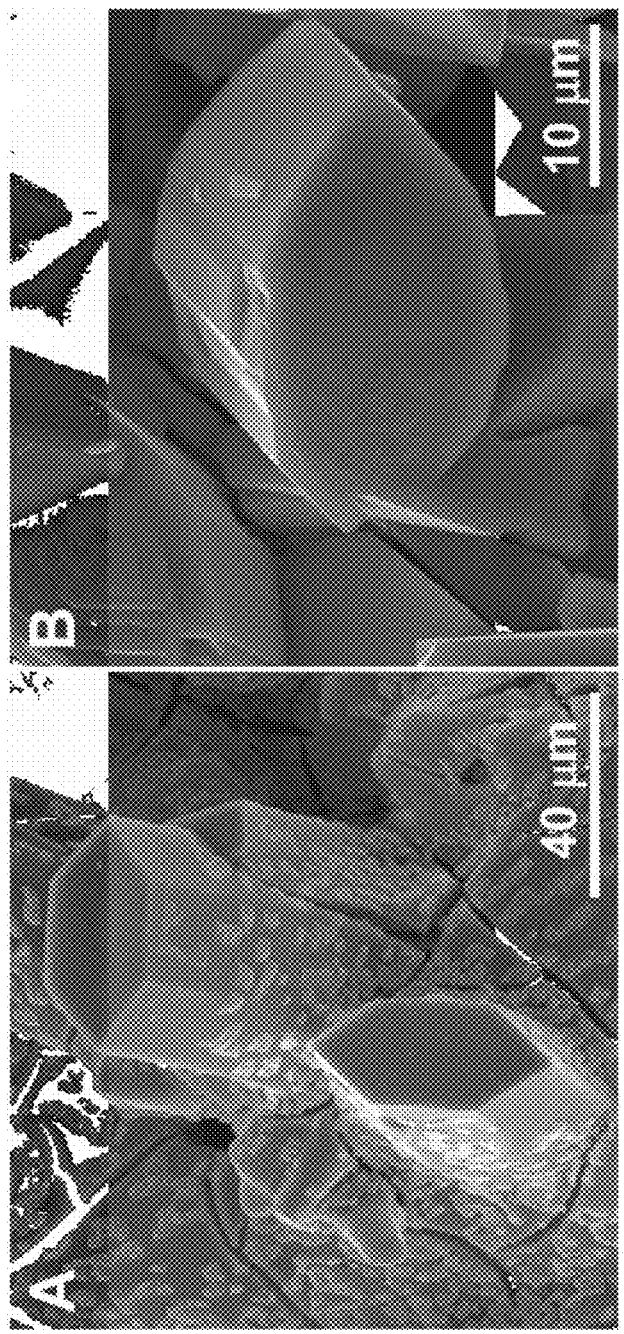

Fig. 37A
Fig. 37B
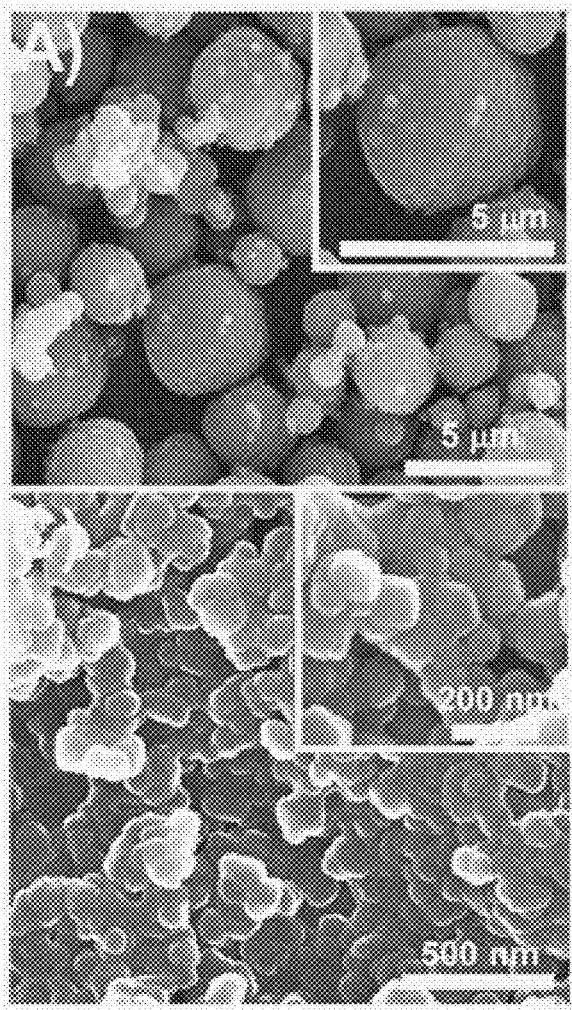
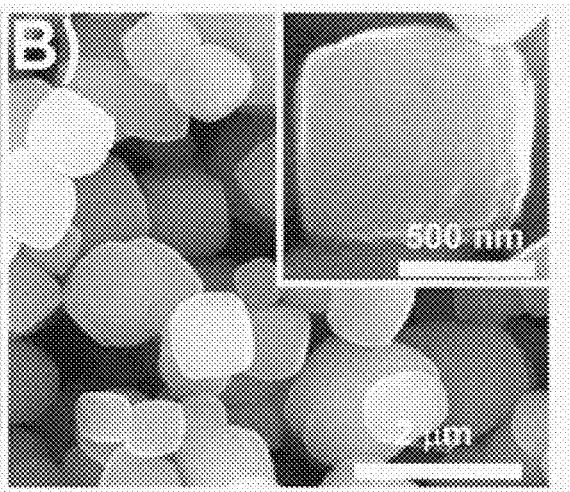
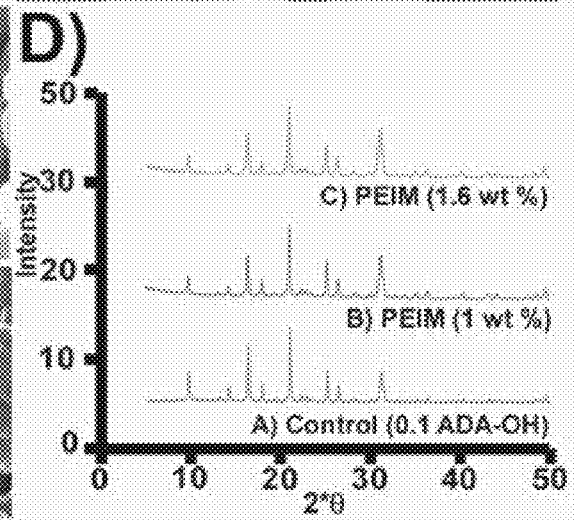
Fig. 37C
Fig. 37D

Fig. 40A
Fig. 40B
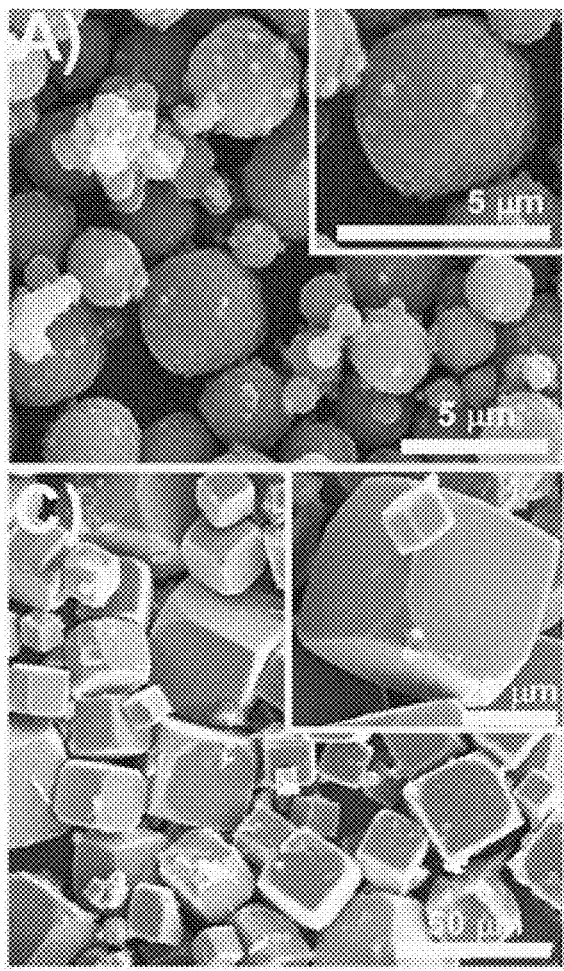
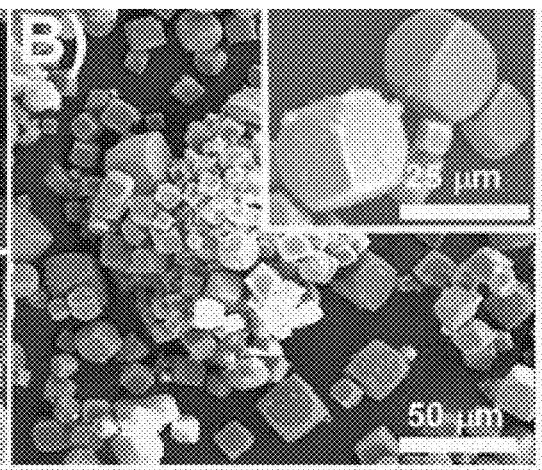
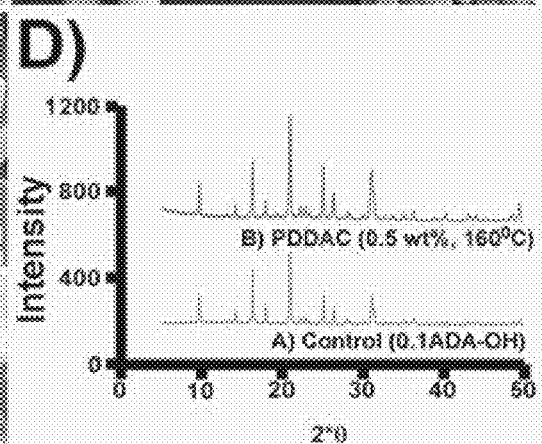
Fig. 40C
Fig. 40D

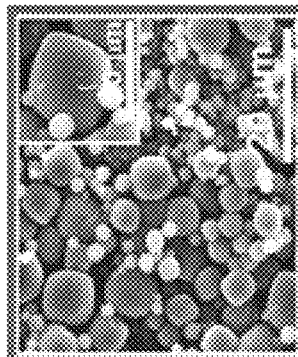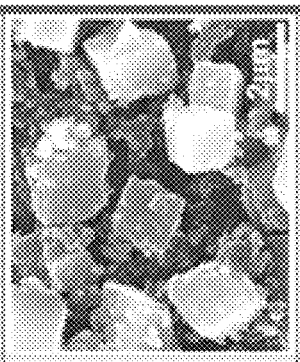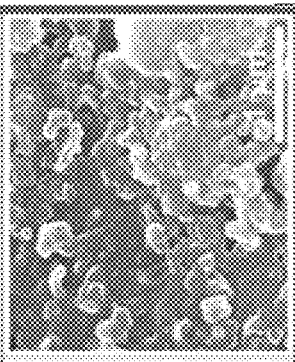
Fig. 41A Fig. 41B Fig. 41C Fig. 41D Fig. 41E Fig. 41F

ZEOLITE COMPOSITIONS AND METHODS FOR TAILORING ZEOLITE CRYSTAL HABITS WITH GROWTH MODIFIERS

This application is a divisional of and claims priority to U.S. patent application Ser. No. 14/305,097, entitled "Zeolite Compositions and Methods for Tailoring Zeolite Crystal Habits with Growth Modifiers," filed Jun. 16, 2014, the entire contents of which are hereby incorporated by reference.

GOVERNMENT RIGHTS

This invention was made in part with government support under Grant No. 1032621 awarded by the National Science Foundation. Accordingly, the United States Government has certain rights in the invention.

BACKGROUND OF THE INVENTION

Field of the Invention

Embodiments of the invention generally relate to zeolite compositions and methods for forming such zeolites, and more particularly to zeolite with desirable crystal habits and methods for tailoring such crystal habits.

Description of the Related Art

The global synthetic zeolite industry accounts for approximately $1.9 billion in annually revenue. Currently, the largest market for zeolites is that of catalysts for petroleum refining; however, there is an increased demand for zeolites in diesel emissions reduction. Moreover, zeolite properties including acidity and nanoporosity are useful for ion exchange and selective separation applications. Research in both industry and academia seek to design more rational synthetic approaches capable of improving zeolite properties for existing petrochemical processes, for emerging applications, and for research objectives aimed to expand zeolite application to non-conventional markets, such as sensor technologies, drug delivery, and enantioselective catalysis, and separations.

The shape-selectivity of zeolites can be exploited for commercial applications in catalysis, ion exchange, and separations by the judicious selection of crystal structures with nanopore geometries commensurate with sorbate molecules. Zeolites tend to form anisotropic crystals with pore openings presented on low surface area faces and channels oriented axially along the longest crystal dimensions, which limit sorbate molecule access to pores on exterior crystal surfaces and increase the internal path length for molecular diffusion. These factors impose severe mass transport limitations that reduce molecular flux and decrease the yield, selectivity, and/or lifetime of zeolite catalysts, which poses a pervasive challenge to optimize zeolite crystal habit. As such, a strategic aim is to design more effective, facile, and inexpensive synthetic pathways to selectively tailor crystal habit with precise and predictive control.

There are several approaches that can be used to modify zeolite morphology. Adjustments to synthesis conditions, such as molar composition, solvent, pH, and temperature, have marginal effects on the kinetics and thermodynamics of crystal growth. Templates, such as surfactants, gels, and porous solids can be used to synthesize crystals with a morphology that mimics spatial features of the template. A third approach is the design of structure-directing agents (SDAs) capable forming specific crystal framework types. Studies of novel SDAs have elegantly demonstrated the synthesis of new crystal frameworks for the zeolite. However, the high costs associated with multistep SDA synthesis and the inability to recycle SDAs due to their thermal decomposition during zeolite post-treatment limits the commercial viability of this technique.

Changes in the synthesis techniques and composition can influence particle shape and size. Examples include the silica concentration, solution pH, the silica source (reagent selection), and the solvent. Process conditions, such as temperature or time of synthesis, can influence the overall size and size distribution of the zeolite crystal. Moreover, changes in the structure-directing agent (SDA) can have an impact on the type of formed crystal framework. Collectively, these approaches cannot achieve predictable control of zeolite crystal habit, particle size, surface structure, and other important properties utilized by the various fields. The use of modified SDAs or mixed SDAs is impractical for industrial applications due to the high cost of these reagents. Also, SDAs are specific to a single zeolite crystal framework or structure and are thus not universally applicable for all zeolite framework types. Additionally, SDAs usually become occluded within the zeolite structure and require additional process steps to remove the entrapped SDA.

Therefore, there is a need for a zeolite having a minimum crystal thickness along the diffusion pathways, such as with an aspect ratio of about 4 or greater, a zeolite with a maximum amount of active growth sites on the exterior surfaces, such as with a step density of about 25 steps/$\mu m^2$ or greater, and methods for synthesizing such zeolites. Also, there is a need to have methods for synthesizing zeolites that are easily adaptable to the synthesis of multiple zeolite framework types, can be tailored for each framework type to selectively control zeolite crystal habit, particle size, and surface structure, are more robust, predictable, and efficient technique compared to traditional methods of altering synthesis composition and/or conditions, and are less expensive than traditional methods.

SUMMARY OF THE INVENTION

Embodiments of the invention generally provide compositions of crystalline zeolite materials with tailored crystal habits and the methods for forming such crystalline zeolite materials. The methods for forming the crystalline zeolite materials include binding or otherwise adhering one or more zeolite growth modifiers (ZGMs) to the surface of a zeolite crystal, which results in the modification of crystal growth rates along different crystallographic directions, leading to the formation of zeolites having a tailored crystal habit. The improved properties enabled by the tailored crystal habit include a minimized crystal thickness, a shortened internal diffusion pathlength, and a greater step density as compared to a zeolite having the native crystal habit prepared by traditional processes. The tailored crystal habit provides the crystalline zeolite materials with an aspect ratio of about 4 or greater and crystal surfaces having a step density of about 25 steps/$\mu m^2$ or greater.

The unique crystal structures of the crystalline zeolite materials is described by the crystal habit in terms of size, shape, morphology, orientation, composition, length-to-width ratio, thickness, aspect ratio, surface defects, polydispersity, and surface structure such as the step density and orientation (or shape) of hillocks, the chirality, and step height of hillocks. Also, the methods for synthesizing or otherwise forming the crystalline zeolite materials are easily adaptable to the synthesis of multiple zeolite framework types and can be tailored for each framework type to selectively control zeolite crystal habit, particle size, and surface structure. In addition, the methods for otherwise forming the crystalline zeolite materials are more robust, predictable, and efficient compared to traditional methods for synthesizing zeolites, as well as potentially less expensive than traditional methods.

In one embodiment, a method for forming a zeolite material includes combining at least one framework source precursor, a ZGM, and a solvent to form a plurality of zeolite crystals within a suspension during a synthesis process. The method further includes that each of the zeolite crystals contains a crystalline zeolite material having a single crystal structure, an upper surface of the crystalline zeolite material extending substantially parallel to a lower surface of the crystalline zeolite material, a length of the upper surface within a range from about 10 nm to about 50 µm, a width of the upper surface within a range from about 10 nm to about 50 µm, a plurality of side surfaces extending between the upper and lower surfaces, and a thickness of the crystalline zeolite material measured between the upper and lower surfaces and extending substantially perpendicular to the upper and lower surfaces. The method further includes that each of the zeolite crystals contains an aspect ratio of about 4 or greater, wherein the aspect ratio is determined as a sum of one half of the length and one half of the width of the upper surface relative to the thickness of the crystalline zeolite material. Also, the method includes that each of the zeolite crystals contains a plurality of vertical channels extending between the upper and lower surfaces, wherein each vertical channel independently has an exclusive diffusion pathway extending from an opening on the upper surface, through the crystalline zeolite material, and to an opening on the lower surface. In many examples, the method provides forming the crystalline zeolite material with an aspect ratio of about 6 or greater, such as about 10 or greater, such as about 15 or greater, such as about 20 or greater, such as about 30 or greater, such as about 50 or greater, such as about 100 or greater.

In another embodiment of a method for forming a zeolite material, the method includes that each of the zeolite crystals contains a crystalline zeolite material having a single crystal structure, an upper surface of the crystalline zeolite material extending substantially parallel to a lower surface of the crystalline zeolite material, wherein the upper surface has a step density of about 25 steps/µm$^2$ or greater, a length of the upper surface within a range from about 10 nm to about 50 µm, a width of the upper surface within a range from about 10 nm to about 50 µm, and a plurality of side surfaces extending between the upper and lower surfaces. In many examples, the method provides forming the crystalline zeolite material with an upper surface having a step density of about 40 steps/µm$^2$ or greater, such as about 80 steps/µm$^2$ or greater, such as about 150 steps/µm$^2$ or greater, such as about 200 steps/µm$^2$ or greater.

Exemplary ZGMs generally contain at least one compound selected from monoamine compounds, polyamine compounds, hydroxylamine compounds, aromatic amine compounds, pyridinium amine compounds or complexes, polymeric amine compounds, amino acids, phosphine compounds, phosphine oxide compounds, phosphonic acid compounds, phosphate compounds, phosphorous-containing amine compounds, isomers thereof, salts thereof, derivatives thereof, or combinations thereof.

In some embodiments, the ZGM contains a nitrogen-containing compound which includes monoamines (e.g., alkyl amine and hydroxylamine), polyamines (e.g., diamine, triamine, and tetraamine), aromatic amines, anilines, pyridinium amines, amino acids, polymeric amines, as well as other amines. In some examples, the ZGM contains a monoamine such as an alkylamine or a hydroxylamine. Exemplary monoamines include dipropylamine, tert-butylamine, N,N-dimethylbutylamine, 2-dimethylethanolamine (DMEA), ethanolamine, diethanolamine, triethanolamine, methylaminoethanol, tris(hydroxymethyl) aminomethane (THAM), 3-amino-1-propanol, isomers thereof, salts thereof, derivatives thereof, or combinations thereof. In other examples, the ZGM contains a polyamine such as triethylenetetramine (TETA), tris(2-aminoethyl) amine (T2TETA), spermine, isomers thereof, salts thereof, derivatives thereof, or combinations thereof. The polyamine may be a diamine or high-order amine. Exemplary diamines useful as ZGMs include ethylenediamine, tetramethylethylenediamine, tetramethylenediamine, hexamethylenediamine, ethylenediamine tetraacetic acid (EDTA), isomers thereof, salts thereof, derivatives thereof, or combinations thereof. In other examples, the ZGM contains an aromatic amine or an aniline, such as nitroaniline or dopamine, or contains a pyridinium amine such as pyridostigmine, 4-(4-diethylaminostyryl)-N-methylpyridinium, isomers thereof, salts thereof, derivatives thereof, or combinations thereof. Some specific examples of pyridinium amines include pyridostigmine bromide or 4-(4-diethylaminostyryl)-N-methylpyridinium iodide. In other examples, the ZGM contains a polymeric amine. Exemplary polymeric amines include polyethyleneimine (e.g., liner or branched PEIM), polylysine (e.g., poly-L-lysine), polythreonine (e.g., poly-L-threonine), isomers thereof, salts thereof, derivatives thereof, or combinations thereof. In other examples, the ZGM contains an amino acid, such as arginine, lysine, histidine, threonine, serine, isomers thereof, salts thereof, derivatives thereof, or combinations thereof.

In some embodiments, the ZGM contains a phosphorous-containing compound which includes phosphine oxides, phosphonic acids, and phosphates, as well as other compounds. In some examples, the ZGM contains a phosphine oxide, such as trimethylphosphine oxide, triethylphosphine oxide, tributylphosphine oxide (TBPO), tris(2-carbamoyl-ethyl) phosphine oxide, isomers thereof, salts thereof, derivatives thereof, or combinations thereof. In other examples, the ZGM contains a phosphonic acid, such as a diphosphonic acid selected from 1,10-decanediphosphonic acid, 1,8-octanediphosphonic acid, 1,7-heptanediphosphonic acid, 1,6-hexanediphosphonic acid, 1,5-pentanediphosphonic acid, 1,4-butanediphosphonic acid, isomers thereof, salts thereof, derivatives thereof, or combinations thereof. In other examples, the ZGM contains a phosphate. Exemplary phosphates include diethyl tert-butylamido phosphate, o-phospho-D/L-serine, diethyl ethylamido phosphate, isomers thereof, salts thereof, derivatives thereof, or combinations thereof.

The method further includes that a synthesis mixture contains at least one framework source precursor, the ZGM, and the solvent. In some examples, the synthesis mixture has a concentration of the ZGM during the synthesis process within a range from about 0.05 wt % to about 20 wt %, more narrowly within a range from about 0.05 wt % to about 10 wt %, more narrowly within a range from about 0.05 wt % to about 5 wt %, more narrowly within a range from about 0.1 wt % to about 3 wt %, and more narrowly within a range from about 0.3 wt % to about 2 wt % of the synthesis mixture. In other examples, the synthesis mixture has a concentration of the ZGM during the synthesis process within a range from about 1 wt % to about 60 wt %, more narrowly within a range from about 5 wt % to about 50 wt %, more narrowly within a range from about 10 wt % to about 45 wt %, and more narrowly within a range from about 20 wt % to about 40 wt % of the synthesis mixture.

In some examples, the method further includes combining a structure directing agent (SDA) with the at least one framework source precursor, the ZGM, the solvent, and an optional mineralizing agent to form a synthesis mixture during the synthesis process. In many examples, the SDA contains at least one ammonium source, such as a tetraalkylammonium compound (e.g., a tetraalkylammonium hydroxide), a quaternary ammonium-type surfactant, or a dimer or a trimer of a tetraalkylammonium compound. Exemplary tetraalkylammonium hydroxides include tetramethylammonium hydroxide, tetraethylammonium hydroxide, tetrapropylammonium hydroxide, tetrabutylammonium hydroxide, tetraarylammonium hydroxide, derivatives thereof, or combinations thereof. Exemplary quaternary ammonium-type surfactant contains a cation selected from $[C_{22}H_{45}-N(CH_3)_2-C_6H_{12})_2-H]^{2+}$ (22-$N_2$H), $[C_{18}H_{37}-N(CH_3)_2-C_6H_{12})_3-C_{18}H_{37}]^{3+}$ (18-$N_3$-18), $[C_{22}H_{45}-N(CH_3)_2-C_6H_{12})_4-C_{22}H_{45}]^{4+}$ (22-$N_4$-22), $[(C_3H_7)_3N(C_7H_{14})N(C_3H_7)_3]^{2+}$ (dC7), $[(C_3H_7)_3N(C_6H_{12})N(C_3H_7)_3]^{2+}$ (dC6), $[(C_3H_7)_2N((C_6H_{12})N(C_3H_7)_3)_2]^{3+}$ (tC6), derivatives thereof, and salts thereof. Generally, the quaternary ammonium-type surfactant contains an anion such as bromide, iodide, chloride, or hydroxide. In some examples, the SDA contains piperidine, alkyl piperidine, salts thereof, derivatives thereof, or combinations thereof.

In some examples, the synthesis process includes combining at least one framework source precursor, the ZGM, the solvent, and an optional mineralizing agent to form a synthesis mixture, wherein the synthesis mixture is initially free of SDAs and/or zeolite seed crystals. However, as the synthesis process progresses, zeolite seed crystals are formed in situ and proceed to grow during the growth process. The solvent generally contains water, an organic solvent, or combinations thereof. The water is generally deionized water and the organic solvent may be an alcohol, such as methanol, ethanol, propanol, butanol, or combinations thereof. The method may further include combining a mineralizing agent with the at least one framework source precursor, the ZGM, and the solvent to form the synthesis mixture. The mineralizing agent is generally a source of hydroxide (OH—) or fluoride (F) for the synthesis mixture.

In other examples, the synthesis process includes combining a plurality of zeolite seed crystals along with at least one framework source precursor, the ZGM, the solvent, and an optional mineralizing agent to form a synthesis mixture. Therefore, the synthesis mixture may start with zeolite seed crystals for providing the initial crystal framework structure of the zeolite. In some examples, the synthesis process includes combining an SDA along with at least one framework source precursor, the ZGM, and the solvent to form a synthesis mixture. In further examples, the synthesis process includes combining a plurality of zeolite seed crystals and an SDA along with at least one framework source precursor, the ZGM, and the solvent to form a synthesis mixture.

Zeolite crystals and crystalline zeolite materials formed by processes utilizing ZGMs described herein generally have exemplary crystal structures with frameworks selected from AEI, AEL, AFO, AFT, ANA, APC, ATN, ATT, ATV, AWW, BEA, BIK, GAS, CFI, CHA, CHI, CLO, DAG, DOR, DON, EDI, EMT, ERi, EUO, FAU, FER, GIS, GOO, HEU, KFI, LEV, LOV, LTA, LTL, MEL, MER, MFI, MON, MOR, MTW, MTT, MWW, PAU, PHI, RHO, ROG, SOD, STI, THO, TON, substituted forms thereof, or derivatives thereof. In many examples, synthesis mixtures containing ZGMs are utilized to form and grow the crystalline zeolite materials with a framework of AEL, ANA, BEA, CHA, FAU, FER, GIS, LEV, LTL, MFI, MOR, MTW, SOD, STI, substituted forms thereof, and derivatives thereof.

The crystalline zeolite materials described herein generally contain at least one material selected from silicate, aluminosilicate, silicoaluminophosphate, aluminumphosphate, but may also contain other elements. The synthesis mixture contains at least one framework source precursor or may contain multiple framework source precursors depending on the desired composition and framework-type of the zeolite. The framework source precursor may include a silica source, an alumina source, a phosphate source, an aluminosilicate source, a silicoaluminophosphate source, a titania source, a germania source, hydrates thereof, derivatives thereof, or combinations thereof. The framework source precursor may be derived from or contain a clay mineral, such as kaolinite, diatomite, or saponite, and utilized as source of silica or alumina. The framework source precursor generally contains a silica source, such as colloidal silica, fumed silica, silica salts, metallic silicates, hydrates thereof, derivatives thereof, or combinations thereof. Other exemplary silica sources include alkyl orthosilicate, orthosilicic acid, silicic acid, salts thereof, hydrates thereof, derivatives thereof, or combinations thereof. Alkyl orthosilicates that are useful as the silica source include tetramethyl orthosilicate, tetraethyl orthosilicate, tetrapropyl orthosilicate, tetrabutyl orthosilicate, salts thereof, hydrates thereof, derivatives thereof, or combinations thereof. In many examples, the framework source precursor also contains an alumina source, such as alumina, aluminum sulfate, aluminum nitrate, aluminum isopropoxide, aluminum butoxide, aluminum chloride, aluminum fluoride, aluminum phosphate, aluminum hydroxide, sodium aluminate, potassium aluminate, aluminates thereof, hydrates thereof, salts thereof, derivatives thereof, or combinations thereof. In several specific examples, the alumina source is aluminum sulfate hydrate or aluminum nitrate hydrate. In other examples, the framework source precursor contains a phosphate source, such as phosphoric acid, trimethylphosphine, triethylphosphine, tripropylphosphine, tributylphosphine, trimethyl phosphate, triethyl phosphate, tripropyl phosphate, tributyl phosphate, aluminum phosphate, aluminophosphate, phosphates thereof, salts thereof, derivatives thereof, or combinations thereof.

In another embodiment of a method for forming a zeolite material, the method includes combining at least one framework source precursor, a ZGM, an optional mineralizing agent, and a solvent to form a synthesis mixture, forming zeolite seed crystals within the synthesis mixture during a synthesis step, wherein each of the zeolite seed crystals has a single crystalline structure and a first crystal habit. The method further includes maintaining the synthesis mixture at a predetermined temperature for a predetermined time during a growth step, wherein the ZGM is adsorbed to outer surfaces of the zeolite seed crystals within the synthesis mixture and each of the zeolite seed crystals forms a zeolite crystal having the single crystalline structure and a second crystal habit different than the first crystal habit. The ZGM is generally adsorbed to upper and lower surfaces of the zeolite seed crystals while side surfaces of the zeolite seed crystals remain substantially free of the ZGM during the growth step. The method further includes growing the zeolite crystals from the zeolite seed crystals at a faster rate in a two-dimension plane than in a third dimension perpendicular to the two-dimension plane during the growth process. Also, the ZGM is generally maintained at a concentration within the second zeolite suspension to enable the faster growth rate in the two-dimension plane than in the third dimension. In examples utilizing zeolite seed crystals in the initial synthesis mixture, the zeolite seed crystals (e.g., the first crystal habit) generally have an aspect ratio of less than 4 (e.g., about 0.5 to about 3.5), wherein the aspect ratio is determined as a sum of one half of a length and one half of a width of an upper surface of the zeolite seed crystal relative to a thickness of the zeolite seed crystal. Additionally, the formed zeolite crystals (e.g., the second crystal habit) have an aspect ratio of about 4 or greater (e.g., about 10 to about 100 or greater), wherein the aspect ratio is determined as a sum of one half of a length and one half of a width of an upper surface of the zeolite crystal relative to a thickness of the zeolite crystal.

In another embodiment of a method for forming a zeolite material, the method further includes combining an SDA with the at least one framework source precursor, the ZGM, and the solvent to form the synthesis mixture. The method further includes forming a plurality of zeolite seed crystals in a first zeolite suspension during a synthesis process, wherein each of the zeolite seed crystals has a single crystalline structure and a first crystal habit, and combining a ZGM and the plurality of zeolite seed crystals to form a plurality of zeolite crystals in a second zeolite suspension during a growth process, wherein each of the zeolite crystals has the single crystalline structure and a second crystal habit different than the first crystal habit. The method includes maintaining the second zeolite suspension at a predetermined temperature for a predetermined time during the growth step. In some examples, the method includes growing the zeolite crystals from the zeolite seed crystals at a faster rate in a two-dimension plane than in a third dimension perpendicular to the two-dimension plane during the growth process. Generally, the ZGM is maintained at a concentration within the second zeolite suspension to enable the faster growth rate in the two-dimension plane than in the third dimension. In some examples, the concentration of the ZGM is within a range from about 0.05 wt % to about 5 wt % of the second zeolite suspension, more narrowly within a range from about 0.1 wt % to about 3 wt % of the second zeolite suspension. In other examples, the concentration of the ZGM is within a range from about 5 wt % to about 50 wt % of the second zeolite suspension, more narrowly within a range from about 20 wt % to about 40 wt % of the second zeolite suspension.

In some examples, the second crystal habit of each of the zeolite crystals contains an upper surface of the zeolite crystal extending substantially parallel to a lower surface of the zeolite crystal, a length of the upper surface within a range from about 10 nm to about 50 µm, a width of the upper surface within a range from about 10 nm to about 50 µm, a plurality of side surfaces extending between the upper and lower surfaces, a thickness of the zeolite crystal measured between the upper and lower surfaces and extending substantially perpendicular to the upper and lower surfaces, an aspect ratio of about 4 or greater, wherein the aspect ratio is determined as a sum of one half of the length and one half of the width of the upper surface relative to the thickness of the zeolite crystal, and a plurality of vertical channels extending between the upper and lower surfaces, wherein each vertical channel independently has an exclusive diffusion pathway extending from an opening on the upper surface, through the zeolite crystal, and to an opening on the lower surface. In many examples, the aspect ratio is about 6 or greater, such as about 50 or greater or such as within a range from about 10 to about 100.

In some examples, the second crystal habit of each of the zeolite crystals contains an upper surface of the crystalline zeolite material extending substantially parallel to a lower surface of the crystalline zeolite material, wherein the upper surface has a step density of about 25 steps/µm$^2$ or greater, a length of the upper surface within a range from about 10 nm to about 50 µm, a width of the upper surface within a range from about 10 nm to about 50 µm, and a plurality of side surfaces extending between the upper and lower surfaces. The upper, lower, and side surfaces may each independently have a step density of about 40 steps/µm$^2$ or greater, such as about 80 steps/µm$^2$ or greater.

In another embodiment of a method for forming a zeolite material, the method includes combining at least one framework source precursor, an SDA, and a solvent to form a plurality of zeolite seed crystals within a first zeolite suspension during a synthesis process, combining a ZGM and the plurality of zeolite seed crystals to form a plurality of zeolite crystals within a second zeolite suspension during a growth process, and maintaining the second zeolite suspension at a predetermined temperature for a predetermined time during the growth step. Each of the formed zeolite crystals contains a crystalline zeolite material having a single crystal structure, an aspect ratio of about 4 or greater and/or a step density of about 25 steps/µm$^2$ or greater.

In another embodiment, a composition of a zeolite contains a crystalline zeolite material having a single crystal structure, an upper surface of the crystalline zeolite material extending substantially parallel to a lower surface of the crystalline zeolite material, a length of the upper surface within a range from about 10 nm to about 50 µm, a width of the upper surface within a range from about 10 nm to about 50 µm, a plurality of side surfaces extending between the upper and lower surfaces, a thickness of the crystalline zeolite material measured between the upper and lower surfaces and extending substantially perpendicular to the upper and lower surfaces, an aspect ratio of about 4 or greater, wherein the aspect ratio is determined as a sum of one half of the length and one half of the width of the upper surface relative to the thickness of the crystalline zeolite material, and a plurality of vertical channels extending between the upper and lower surfaces, wherein each vertical channel independently has an exclusive diffusion pathway extending from an opening on the upper surface, through the crystalline zeolite material, and to an opening on the lower surface. In some examples, the aspect ratio is about 6 or greater, such as about 10 or greater, such as about 15 or greater, such as about 20 or greater, such as about 30 or greater, such as about 50 or greater, such as about 100 or greater. In other examples, the aspect ratio is within a range from about 10 to about 100.

In another embodiment, a composition of a zeolite contains a crystalline zeolite material having a single crystal structure, an upper surface of the crystalline zeolite material extending substantially parallel to a lower surface of the crystalline zeolite material, wherein the upper surface has a step density of about 25 steps/µm$^2$ or greater, a length of the upper surface within a range from about 10 nm to about 50 µm, a width of the upper surface within a range from about 10 nm to about 50 µm, and a plurality of side surfaces extending between the upper and lower surfaces. In one example, a composition of a zeolite contains a crystalline zeolite material having an aspect ratio of about 4 or greater and a step density of about 25 steps/µm$^2$ or greater.

Generally, the crystalline zeolite material has a thickness within a range from about 5 nm to about 450 nm, more narrowly within a range from about 50 nm to about 250 nm, and more narrowly within a range from about 100 nm to about 150 nm. Each length of the upper surface and the lower surface of the crystalline zeolite material is independently within a range from about 10 nm to about 50 μm, more narrowly within a range from about 0.1 μm to about 20 μm, more narrowly within a range from about 0.5 μm to about 5 μm, more narrowly within a range from about 0.6 μm to about 4 μm, and more narrowly within a range from about 0.8 μm to about 2 μm. Similarly, each width of the upper surface and the lower surface of the crystalline zeolite material is independently within a range from about 10 nm to about 50 μm, more narrowly within a range from about 0.1 μm to about 20 μm, more narrowly within a range from about 0.5 μm to about 5 μm, more narrowly within a range from about 0.6 μm to about 4 μm, and more narrowly within a range from about 0.8 μm to about 2 μm. In some examples, each of the upper, lower, and side surfaces of the crystalline zeolite material has an n-sided polyhedral geometry, whereas n is 3, 4, 5, 6, 7, or 8. The n-sided polyhedral geometry may be triangular, square, rectangular, pentagonal, hexagonal, heptagonal, or octagonal. In other examples, each of the upper, lower, and side surfaces of the crystalline zeolite material has a rounded geometry that includes circular, elliptical, orbicular, curvilinear, or derivatives thereof.

In some examples, the composition of the zeolite further contains a plurality of tortuous channels extending between the upper and lower surfaces, the upper surface and the side surfaces, the lower surface and the side surfaces, or two of the side surfaces. The zeolite may contain a plurality of channels extending throughout the crystalline zeolite material. The channels that extend between the upper and lower surfaces are vertical channels, and each vertical channel independently has an exclusive or non-exclusive diffusion pathway extending from an opening on the upper surface, through the crystalline zeolite material, and to an opening on the lower surface. In some examples, the plurality of vertical channels contains from about 50 vertical channels to about 1,000 vertical channels. The vertical channels may be coupled with at least one cage or pore within the crystalline zeolite material. In general, each opening of the vertical channels generally has a diameter of less than 20 Å, such as within a range from about 2 Å to about 15 Å, more narrowly within a range from about 3 Å to about 10 Å, and more narrowly within a range from about 4 Å to about 8 Å.

In some examples, the zeolite has a 2-dimensional or 3-dimensional pore network therefore the crystalline zeolite material contains additional channels besides vertical channels. The channels that extend between the side surfaces are horizontal channels, and each horizontal channel independently has an exclusive diffusion pathway extending from an opening on one side surface, through the crystalline zeolite material, and to an opening on another side surface. In some examples, the two openings of the exclusive diffusion pathway are disposed on opposing side surfaces. In other examples, the two openings of the exclusive diffusion pathway are disposed on non-opposing side surfaces, wherein non-opposing side surfaces include adjacent or neighboring sides, as well as staggered or alternating sides. In another type of zeolite, the channels that extend between the side surfaces are horizontal channels, and each horizontal channel independently has a non-exclusive diffusion pathway extending from an opening on one side surface, through the crystalline zeolite material, and to an opening on another side surface. In some examples, the two openings of the non-exclusive diffusion pathway are on opposing side surfaces. In other examples, the two openings of the non-exclusive diffusion pathway are on non-opposing side surfaces. In some examples, the plurality of horizontal channels contains from about 50 horizontal channels to about 1,000 horizontal channels. The horizontal channels may be coupled with at least one cage or pore within the crystalline zeolite material. In general, each opening of the horizontal channels generally has a diameter of less than 20 Å, such as within a range from about 2 Å to about 15 Å, more narrowly within a range from about 3 Å to about 10 Å, and more narrowly within a range from about 4 Å to about 8 Å.

In other examples, the upper and lower surfaces of the crystalline zeolite material or the side surfaces of the crystalline zeolite material contain stepped layers or hillocks having active growth sites. The active growth sites are generally on the steps, kinks, and/or terrace sites of the crystalline zeolite material. In some examples, the stepped layers or hillocks have triangular geometry or rectangular geometry. In other examples, the stepped layers or hillocks have rounded geometry or elliptical geometry. Generally, each of the upper surface, the lower surface, and the side surfaces independently has a step density of about 25 steps/μm$^2$ or greater, such as about 40 steps/μm$^2$ or greater, such as about 80 steps/μm$^2$ or greater, such as about 150 steps/μm$^2$ or greater, such as about 200 steps/μm$^2$ or greater.

Zeolite crystals and crystalline zeolite materials formed by processes utilizing ZGMs described herein may have any crystal structure with typical zeolite frameworks. The zeolite compositions described herein generally contain zeolite crystals and crystalline zeolite materials having single crystal structures. Exemplary crystal structures of the formed zeolite crystals and crystalline zeolite materials, as well as zeolite seed crystals (that may optionally be used) have a framework of AEI, AEL, AFO, AFT, ANA, APC, ATN, ATT, ATV, AWW, BEA, BIK, GAS, CFI, CHA, CHI, CLO, DAG, DOR, DON, EDI, EMT, ERi, EUO, FAU, FER, GIS, GOO, HEU, KFI, LEV, LOV, LTA, LTL, MEL, MER, MFI, MON, MOR, MTW, MTT, MWW, PAU, PHI, RHO, ROG, SOD, STI, THO, TON, substituted forms thereof, or derivatives thereof. In many examples, the formed zeolite crystals and crystalline zeolite materials, as well as zeolite seed crystals (that may optionally be used) have a framework of AEL, ANA, BEA, CHA, FAU, FER, GIS, LEV, LTL, MFI, MOR, MTW, SOD, STI, substituted forms thereof, and derivatives thereof.

The crystalline zeolite materials described herein generally contain at least one material selected from silicate, aluminosilicate, silicoaluminophosphate, aluminumphosphate, derivatives thereof, or combinations thereof, but may also contain other elements. In one example, the crystalline zeolite material consists essentially of silicon and oxygen, such as silicalite-1 with the MFI structure. In another example, the crystalline zeolite material contains silicon, aluminum, and oxygen. In other examples, the crystalline zeolite material contains silicon, aluminum, phosphorous, and oxygen. The crystalline zeolite material may further contain at least one element selected from titanium, germanium, gallium, phosphorous, boron, or combinations thereof. In addition, the crystalline zeolite material may further contain at least one element selected from sodium, potassium, calcium, magnesium, yttrium, or combinations thereof.

In another embodiment, a method for forming a zeolite material can include combining at least one framework source precursor, an adamantane structure directing agent, an organic zeolite growth modifier, and a solvent to form a synthesis mixture; and maintaining the synthesis mixture at a predetermined temperature for a predetermined time and forming a plurality of zeolite crystals within a suspension during a synthesis process, wherein each of the zeolite crystals includes a crystalline zeolite material having a single crystal structure; an upper surface of the crystalline zeolite material extending substantially parallel to a lower surface of the crystalline zeolite material; a length of the upper surface within a range from about 10 nm to about 50 µm; a width of the upper surface within a range from about 10 nm to about 50 µm; a plurality of side surfaces extending between the upper and lower surfaces; and a thickness of the crystalline zeolite material extending substantially perpendicular between the upper and lower surfaces.

In another embodiment, a method for forming a zeolite material can include combining at least one framework source precursor, an organic zeolite growth modifier with an alcohol group, and a solvent to form a plurality of zeolite crystals within a suspension during a synthesis process, wherein each of the zeolite crystals can include a crystalline zeolite material having a single crystal structure; an upper surface of the crystalline zeolite material extending substantially parallel to a lower surface of the crystalline zeolite material, wherein the upper surface has a step density of about 25 steps/µm$^2$ or greater; a length of the upper surface within a range from about 10 nm to about 50 µm; a width of the upper surface within a range from about 10 nm to about 50 µm; and a plurality of side surfaces extending between the upper and lower surfaces.

In another embodiment, a composition of a zeolite can include a crystalline zeolite material comprised of a plurality of zeolite crystals, each zeolite crystal having a single cubic crystal structure; an upper surface of the zeolite crystal extending substantially parallel to a lower surface of the zeolite crystal; a length of the upper surface within a range from about 10 nm to about 1 µm; a width of the upper surface within a range from about 10 nm to about 1 µm; a plurality of side surfaces extending between the upper and lower surfaces; a thickness of the crystalline zeolite material extending substantially perpendicular between the upper and lower surfaces; an aspect ratio of about 4 or greater, wherein the aspect ratio is determined as a sum of one half of the length and one half of the width of the upper surface relative to the thickness of the crystalline zeolite material; and a plurality of vertical channels extending between the upper and lower surfaces, wherein each vertical channel independently has an exclusive diffusion pathway extending from an opening on the upper surface, through the crystalline zeolite material, and to an opening on the lower surface.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 7A-7F are scanning electron micrographs of MOR crystals;

FIGS. 8A-8B are scanning electron micrographs of silicalite-1 (MFI) crystals;

FIGS. 9A-9B are scanning electron micrographs of silicalite-1 (MFI) crystals;

FIGS. 10A-10C are graphs that illustrate statistical analysis of optical microscopy images of silicalite-1 (MFI) crystals;

FIGS. 11A-11D are graphs that illustrate size distributions for the length and width of silicalite-1 basal surfaces;

FIGS. 12A-12D are optical micrographs of silicalite-1 (MFI) crystals;

FIGS. 13A-13B are scanning electron micrographs of silicalite-1 crystals;

FIGS. 15A-15D are micrographs of silicalite-1 crystals;

FIGS. 18A-18C are atomic force microscopy (AFM) images;

FIGS. 19A-19B depict schematics of the surface growth on a zeolite crystal;

FIG. 19C depicts that spiral dislocations on silicalite-1 crystal surfaces;

FIG. 19D depicts that the triangle-like shape of hillocks and growth terraces flip orientation with each layer;

FIG. 26A is an image for silicalite-1 formed by methods described herein;

FIG. 26B is a chart that illustrates height cross-section of the image in FIG. 26A;

FIG. 28 is an AFM height image of an area of 1.5×1.5 µm$^2$ on a (010) surface of a silicalite-1 control crystal;

FIG. 29 is a graph that illustrates the height profile (measured along the red line in the height image) revealing two steps with 0.7-nm height;

FIGS. 32A-32C are SEM images of silicalite-1 crystals formed during other experiments described herein;

FIG. 32D is a chart showing a comparison of the step density for crystals synthesized in the presence of ZGMs or in the absence of ZGM (control);

FIGS. 33A-33B are micrographs of aluminosilicate mordenite (MOR);

FIG. 37A is a SEM image of chabazite crystals grown according to further embodiments described herein.

FIG. 37B is a SEM image of chabazite crystals grown at 180 degrees Celsius in the presence of PEIM at a first concentration, according to embodiments described herein;

FIG. 37C is a SEM image of chabazite crystals grown at 180 degrees Celsius in the presence of PEIM at a second concentration, according to embodiments described herein;

FIG. 37D is a graph of the powder XRO patterns of chabazite grown using PEIM, according to further embodiments described herein;

FIG. 40A is a SEM image of chabazite crystals grown in the absence of a ZGM, according to another embodiment;

FIG. 40B is a SEM image of chabazite crystals grown in the presence of POOAC, according to embodiments described herein;

FIG. 40C is a SEM image of chabazite crystals grown in the presence of POOAC, according to embodiments described herein;

FIG. 40D depicts powder XRO patterns for chabazite crystals grown using POOAC, according to embodiments described herein; and FIGS. 41A-41F depicts further ZGM molecules useable in the formation of zeolites, according to one or more embodiments.

DETAILED DESCRIPTION

Embodiments of the invention generally provide compositions of crystalline zeolite materials with tailored crystal habits and the methods for forming such crystalline zeolite materials. The methods for forming the crystalline zeolite materials include binding or otherwise adhering one or more zeolite growth modifiers (ZGMs) to the surface of a zeolite crystal, which results in the modification of crystal growth rates along different crystallographic directions, leading to the formation of zeolites having a tailored crystal habit. The improved properties enabled by the tailored crystal habit include a minimized crystal thickness, a shortened internal diffusion pathlength, and a greater step density as compared to a zeolite having the native crystal habit prepared by traditional processes. The tailored crystal habit provides the crystalline zeolite materials with an aspect ratio of about 4 or greater and crystal surfaces having a step density of about 25 steps/µm$^2$ or greater. The unique crystal structures of the crystalline zeolite materials is described by the crystal habit in terms of size, shape, morphology, orientation, composition, length-to-width ratio, thickness, aspect ratio, surface defects, polydispersity, and surface structure such as the step density and orientation (or shape) of hillocks, the chirality, and step height of hillocks. Also, the methods for synthesizing or otherwise forming the crystalline zeolite materials are easily adaptable to the synthesis of multiple zeolite framework types and can be tailored for each framework type to selectively control zeolite crystal habit, particle size, and surface structure. In addition, the methods for otherwise forming the crystalline zeolite materials are more robust, predictable, and efficient compared to traditional methods for synthesizing zeolites, as well as potentially less expensive than traditional methods.

Figure 1A:
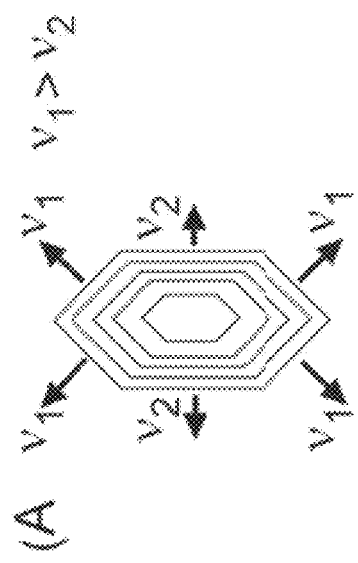
FIG. 1A depicts a native crystal habit of a zeolite prior to being exposed to ZGM molecules.
Figure 1B:
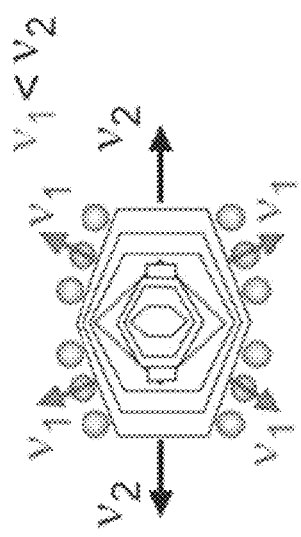
FIG. 1B depicts a tailored crystal habit of the zeolite subsequent to being exposed to ZGM molecules during a growth step.

FIG. 1A depicts a native crystal habit of a zeolite prior to being exposed to ZGM molecules that bind to specific surfaces and alter anisotropic growth of the zeolite crystal, as described in embodiments herein. Subsequently, a tailored crystal habit of the zeolite is formed from the native crystal habit due to the ZGM molecules adhered on the specific surfaces of the zeolite crystal, as illustrated in FIG. 1B. Therefore, FIGS. 1A-1B effectively illustrate a transition from a native crystal habit to a tailored crystal habit by utilizing ZGM molecules during the methods described herein. In some examples, the native habit of a zeolite seed crystal is tailored to form a desired habit of the formed zeolite crystal. The ZGM is a crystal growth inhibitor by blocking the subsequent addition of solute molecules to the crystal surface, leading to the formation of zeolites. FIG. 1B depicts that, once fully grown, the zeolites exhibit different morphology, characteristics, and properties then would otherwise be observed in absence of a ZGM in the synthesis process.

Embodiments of the invention provide methods for tailoring the crystal habit of zeolites using ZGMs is provided—the ZGMs are molecules with specificity for binding to select crystal faces and altering the anisotropic rates of surface step growth. These methods provide a new paradigm in zeolite shape engineering, whereby the selectivity of the ZGM binding is utilized to achieve unparalleled control of a tailored crystal habit for the zeolite.

ZGMs generally possess two moieties: a "binder" that interacts with crystal surface sites and a "perturber" that sterically hinders the attachment of growth units. Effective ZGMs closely mimic crystal surface features and orient in solute vacancies via hydrogen-bond, van der Waal, or electrostatic interactions. Zeolite growth near equilibrium is described by a layer-by-layer model, in which hillocks nucleate with well-defined steps that advance across the surface by the addition of growth units to step sites, as depicted in FIG. 1C.

Zeolite particles exhibit anisotropic shapes and crystal orientations wherein nanoporous channels are often aligned in sub-optimal orientations that reduce access to pore openings (e.g., pore cavities oriented on low surface area faces of the crystal) and increase the diffusion length of sorbate molecules within the pores. The catalytic activity of zeolites can be improved by increasing the surface area of pore openings and reducing the internal diffusion pathlength by tuning the thickness of zeolite crystals. Changes in the surface structure (e.g., step, terrace, and kink sites) may improve catalytic properties and could open possibilities for the use of zeolites in enantioselective catalysis, separations, and other fields. Moreover, the control of zeolite crystal habit and surface structure may have additional benefits for other applications that include, but are not limited to, separations and ion exchange.

Figure 1C:
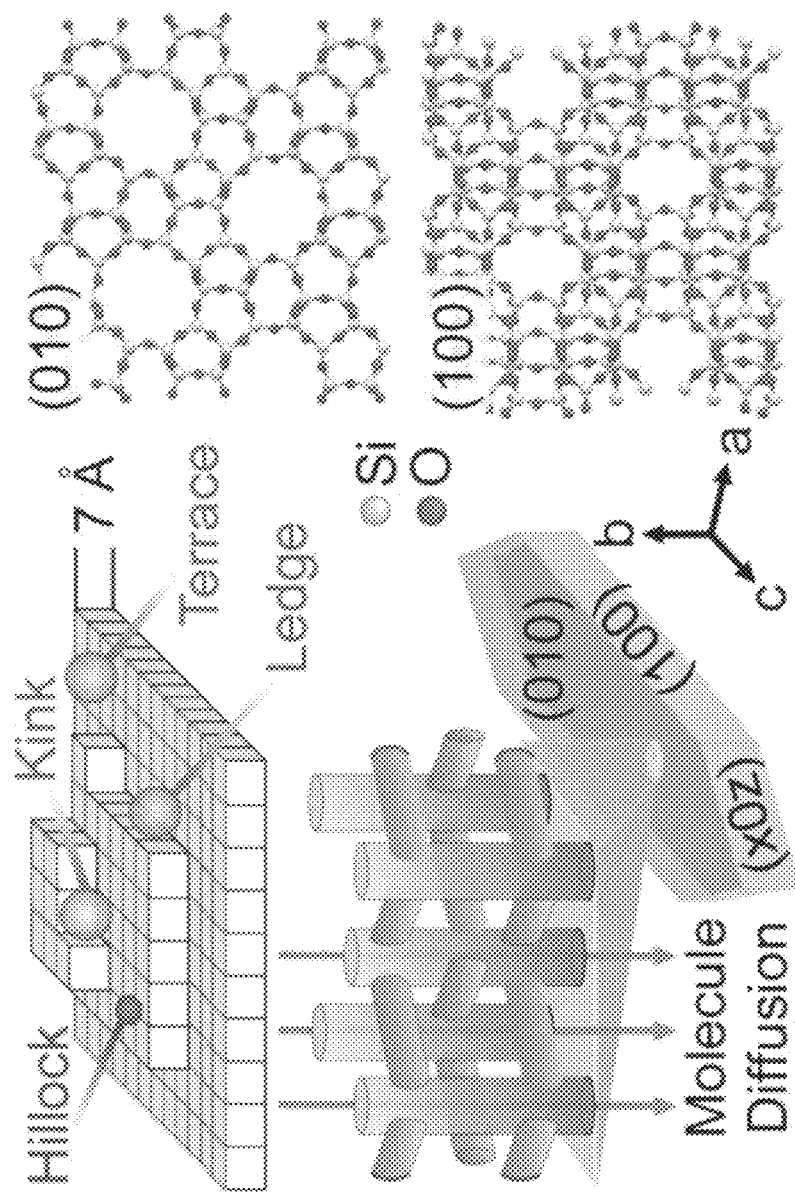
FIG. 1C depicts an exemplary crystal framework of a MFI structure.

FIG. 1C depicts an exemplary crystal framework of a MFI structure, such as for silicalite-1. The MFI structure has straight and sinusoidal channels oriented in the b [010] and a [100] directions, respectively. The rates of hillock nucleation and step advancement are influenced by ZGM binding to terrace, ledge, or kink sites on crystal surfaces. ZGMs that adsorb or bind to kink sites are the most potent inhibitors of step advancement (e.g., exhibit high efficacy at low concentrations). ZGMs that adsorb or bind to ledge sites also reduce the rate of step growth. Also, ZGMs that adsorb or bind to terrace sites inhibit hillock nucleation.

The zeolite silicalite-1, the siliceous analogue of ZSM-5, has a MFI framework structure containing intersecting straight and sinusoidal channels. Silicalite-1 crystals exhibit hexagonal platelet morphologies with two distinct surfaces, the (010) and (100) faces, and a third surface, (x0z), with variable Miller index. Straight channels oriented along the [010] direction present the least tortuous path for sorbate molecule diffusion. As such, a desired outcome of MFI shape-engineering is the design of thin platelets with reduced length along [010] pores to increase the diffusional flux of sorbate molecules.

The composition and structure of ZGMs is selected such that the ZGM exhibits molecular recognition for binding to specific zeolite crystal faces in order to subsequently alter the crystal habit. In some embodiments, the methods provide the inclusion of ZGMs in zeolite synthesis coupled with the judicious selection of inhibitor functional groups, chemical composition, structure, chirality, and spatial orientation as a novel method to rationally form zeolites with tailored crystal habit. In addition, the adsorption or binding of ZGMs to zeolite crystals is used to modify the overall surface architecture of the formed zeolite crystal, which includes the density and orientation of steps, terraces, and kink sites. This also includes the use of ZGMs to specifically alter the chirality of steps and terraces on the zeolite surfaces.

Figure 1D:
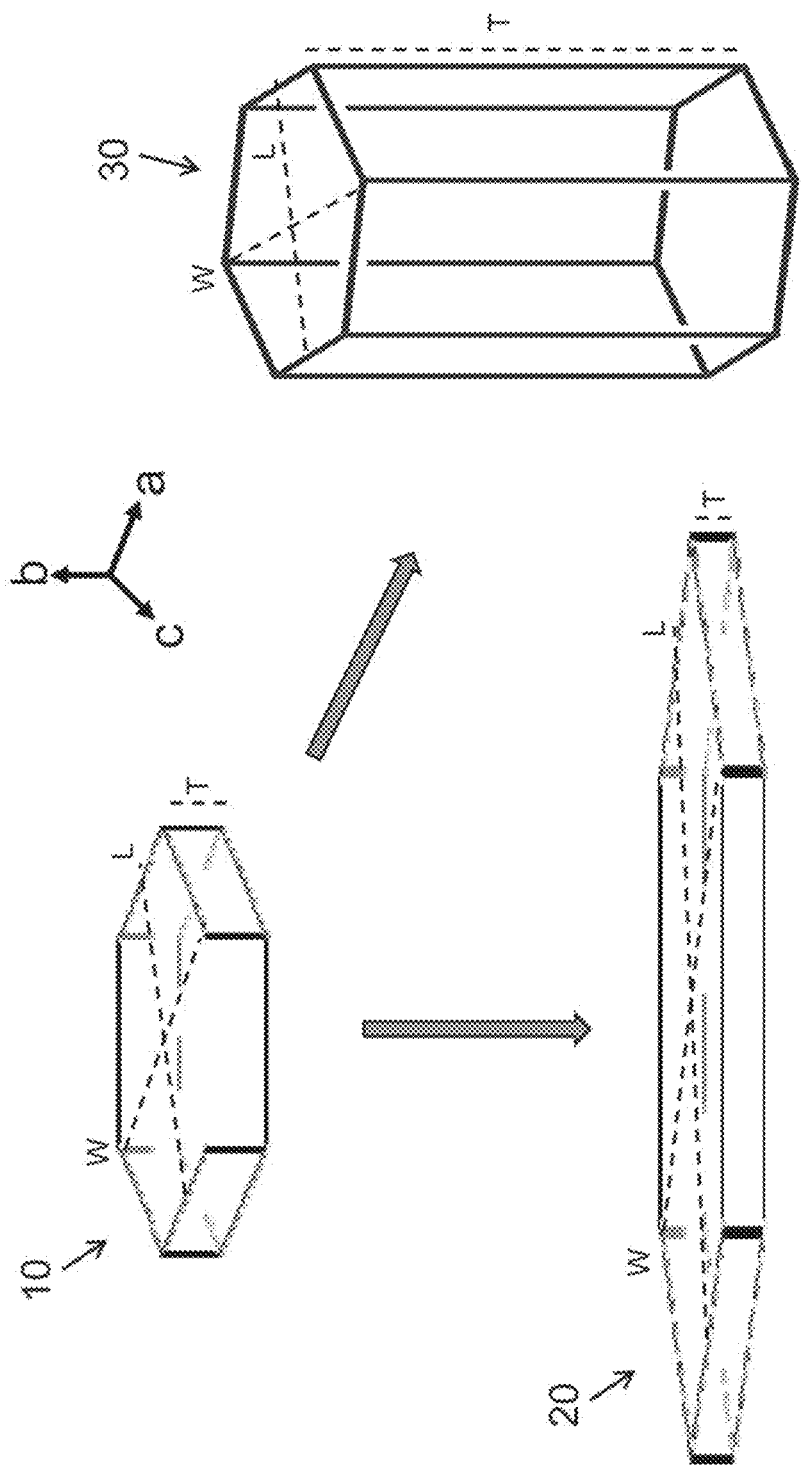
FIG. 1D depicts exemplary tailored crystal habits that may be formed during methods described in some embodiments.

FIG. 1D illustrates a zeolite crystal 10 containing a crystalline zeolite material having a single crystal structure. Prior to exposing the zeolite crystal 10 to a ZGM during a synthesis or growth process, the zeolite crystal 10 has a native crystal habit that includes a length (L) of the crystalline zeolite material including the length of the upper and lower surfaces and a width (W) of the crystalline zeolite material including the width of the upper and lower surfaces, as depicted in FIG. 1D. The length (L) and the width (W) extend in the ac-plane that is also parallel or substantially parallel to the upper and lower surfaces of the zeolite crystal 10. The native crystal habit also includes a thickness (T) of the crystalline zeolite material including the thickness of a plurality of side surfaces extending between the upper and lower surfaces. The thickness (T) of the crystalline zeolite material extends along the b-direction and is perpendicular or substantially perpendicular to the upper and lower surfaces.

In one embodiment described herein, the methods for forming the crystalline zeolite materials include binding or otherwise adhering one or more ZGMs to the surface of the zeolite crystal 10, which results in the modification of crystal growth rates along different crystallographic directions, leading to the formation of zeolites having a different and tailored crystal habit. In some examples, the ZGMs adhere or bind on the upper and lower surfaces of the zeolite crystal 10 and therefore the crystal growth rate along the b-direction is reduced or is completely or substantially ceased while the crystal growth rate proceeds along the ac-plane to form a zeolite crystal 20 having a tailored habit, as depicted in FIG. 1D. The zeolite crystal 20 has a greater aspect ratio than the zeolite crystal 20 with the native habit. In other examples, the ZGMs adhere or bind on the side surfaces of the zeolite crystal 10 and therefore the crystal growth rate along the ac-plane is reduced or is completely or substantially ceased while the crystal growth rate proceeds along the b-direction to form a zeolite crystal 30 having a tailored habit, as depicted in FIG. 1D. The zeolite crystal 30 has a smaller aspect ratio than the zeolite crystal 20 with the native habit. The zeolite crystals 10, 20, and 30 generally have identical or substantially the same composition and crystalline framework as each other. However, the native habit of the zeolite crystal 10 has been altered to form the tailored habit of the zeolite crystal 20 or 30. Therefore, the aspect ratio of the zeolite crystal 20 has increased and is greater than the aspect ratio of the zeolite crystal 10. Also, the aspect ratio of the zeolite crystal 30 has decreased and is less than the aspect ratio of the zeolite crystal 10.

The aspect ratio is determined as a sum of one half of the length (L) and one half of the width (W) of the crystalline zeolite material including the length of the upper and lower surfaces relative to the thickness (T) of the crystalline zeolite material including the thickness of a plurality of side surfaces. The aspect ratio may be expressed as $A_R=[½(L)+½(W)]/T$, or alternately, $A_R=(L+W)/(2(T))$. In many examples described herein, the zeolite crystals formed by the methods utilizing ZGMs generally have an aspect ratio of about 4 or greater, such as about 6 or greater, such as about 10 or greater, such as about 15 or greater, such as about 20 or greater, such as about 30 or greater, such as about 50 or greater, such as about 100 or greater. In other examples, the aspect ratio is within a range from about 10 to about 100. In some examples, the zeolite crystal 10 may be a zeolite seed crystal formed in situ the reaction mixture and/or is added into the reaction mixture during the synthesis processes described herein. A zeolite seed crystal generally has the first, initial, or native crystal habit and may have an aspect ratio of less than 4, such as within a range from about 0.5 to about 3.5.

FIG. 1D illustrates zeolite crystals 10, 20, and 30 that have upper and lower surfaces with a hexagonal crystal structure along the ac-plane and side surfaces with a rectangular crystal structure along the b-direction. However, the zeolite crystals containing crystalline zeolite materials formed by methods described herein may have any crystal structure including, but are not limited to, the crystal structures of zeolite crystals 10, 20, and 30. In some examples, each surface of the zeolite crystals formed by methods described herein, including the upper, lower, and side surfaces, has an n-sided polyhedral geometry, whereas n is 3, 4, 5, 6, 7, 8, or 10. The n-sided polyhedral geometry may be triangular, square, rectangular, pentagonal, hexagonal, heptagonal, octagonal, or decagonal. In other examples, each of the upper, lower, and side surfaces of the zeolite crystals has a rounded geometry that includes circular, elliptical, orbicular, curvilinear, or derivatives thereof.

In some examples, a zeolite crystal contains a plurality of vertical channels extending along the b-direction between the upper and lower surfaces of the crystalline zeolite material. Each vertical channel independently may have an exclusive diffusion pathway extending along the b-direction from an opening on the upper surface, through the crystalline zeolite material, and to an opening on the lower surface. In other examples, a zeolite crystal contains a plurality of horizontal channels extending along the ac-plane between two side surfaces of the crystalline zeolite material. Each horizontal channel independently may have an exclusive diffusion pathway extending along the ac-plane from an opening on one side surface, through the crystalline zeolite material, and to an opening on an opposing side surface.

The zeolite growth modifiers (ZGMs) used in the methods described by embodiments herein to adhere or bind to the surface of a zeolite crystal, which results in the modification of crystal growth rates along different crystallographic directions, leading to the formation of zeolites having a tailored crystal habit. Exemplary ZGMs generally contain at least one chemical compound selected from, but are not limited to, the chemical groups of monoamine, polyamine, hydroxylamine, aromatic amine, pyridinium amine, polymeric amine, amino acid, phosphine oxide, phosphonic acid, phosphate, phosphorous-containing amine, isomers thereof, salts thereof, derivatives thereof, or combinations thereof.

Figure 2:
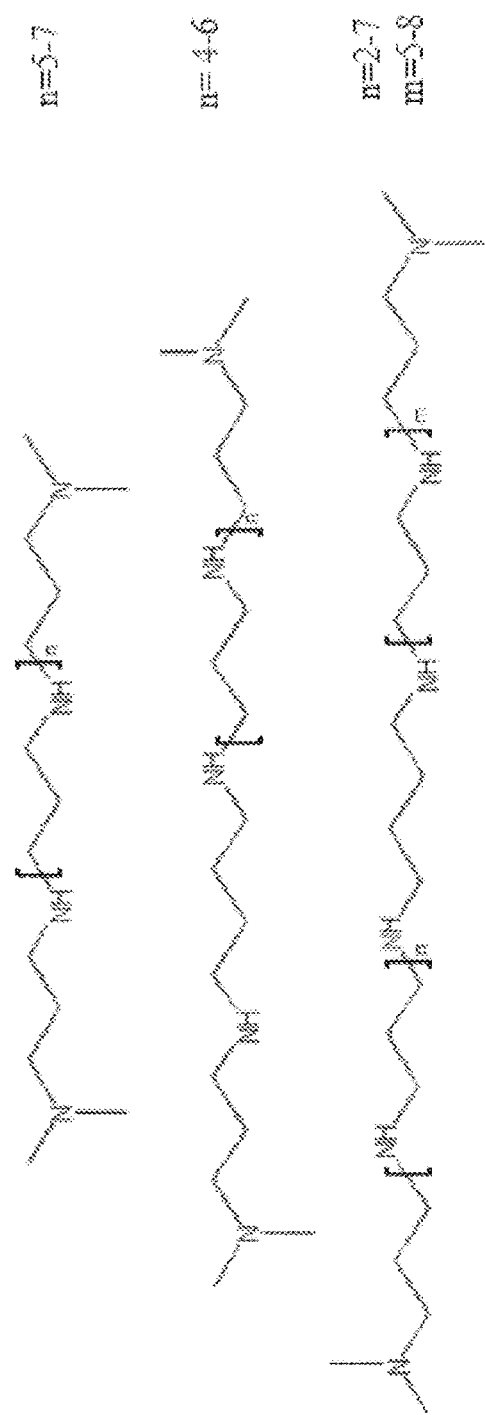
FIG. 2 illustrates chemical structures of several long-chain polyamines.

The ZGMs are determined based on structural and/or compositional similarities with long-chain polyamines (LC-PAs), silicateins, and silaffins. FIG. 2 illustrates chemical structures of several LCPAs. These molecules (or macromolecules) have been isolated from diatom or sponge cell walls, and have been shown to play a key role in facilitating silica condensation, as well as directing the growth of the exoskeleton in these marine organisms. More specifically, silaffins and silacinids are peptides on the order of about 30 amino acids that contain heavily phosphorylated serine and/or threonine residues. Silaffins contain mainly lysine, praline, and serine, while serine, aspartate, and glutamate are often found in higher than average ratios in silacinids. LCPAs are non-protein propyleneamine chains connected via 1,4-diamino butane or putrescine molecules, which exhibit variable levels of methylation on the terminal amines (FIG. 2).

Many of the ZGMs described herein have similar or overlapping structures and/or functional groups of the molecules to those presented in FIG. 2—notably the functional sequences between amine groups, the hydroxyl and methyl terminal chains, and the phosphate residues on the protein backbone. Table 1 provides generic chemical structures, chemical formulas (Structures 1-7), and chemical groups of ZGM compounds, as well as specific exemplary ZGM compounds that are utilized in methods described herein.

TABLE 1

Exemplary Zeolite Growth Modifiers (ZGMs)

| Compound Name | Chemical Formula | Chemical Structure | Chemical Group |
|---|---|---|---|
| Monoamines | $R_1$, $R_2$, $R_3$ (independently) = hydrogen, alkyl, alkene, alkyne, phenyl, aryl, hydroxyl, carboxyl, alkoxy, ether, aldehyde, ester, ketone, amide, nitro, thiol, ions thereof, isomers thereof, salts thereof, derivatives thereof, or combinations thereof. | $R_3$—N($R_1$)—$R_2$ | Structure 1 |
| dipropylamine | $(CH_3CH_2CH_2)_2NH$ | (structure) | monoamine |
| tert-butylamine | $(CH_3)_3CNH_2$ | (structure) | monoamine |
| N,N-dimethylbutylamine | $H_3CH_2CH_2CH_2N(CH_3)_2$ | (structure) | monoamine |

TABLE 1-continued

Exemplary Zeolite Growth Modifiers (ZGMs)

| Compound Name | Chemical Formula | Chemical Structure | Chemical Group |
|---|---|---|---|
| 2-dimethylethanolamine (DMEA) | $(CH_3)_2NCH_2CH_2OH$ | | monoamine (hydroxyl amine) |
| ethanolamine | $H_2NCH_2CH_2OH$ | | monoamine (hydroxyl amine) |
| diethanolamine | $HN(CH_2CH_2OH)_2$ | | monoamine (hydroxyl amine) |
| triethanolamine | $N(CH_2CH_2OH)_3$ | | monoamine (hydroxyl amine) |
| methyaminoethanol | $H_3CNHCH_2CH_2OH$ | | monoamine (hydroxyl amine) |
| tris(hydroxymethyl) aminomethane (THAM) | $H_2NC(CH_2OH)_3$ | | monoamine (hydroxyl amine) |
| 3-amino-1-propanol | $H_2NCH_2CH_2CH_2OH$ | | monoamine (hydroxyl amine) |
| para-nitroaniline | $4-NO_2C_6H_4NH_2$ | | aromatic amine (aniline) |
| meta-nitroaniline | $3-NO_2C_6H_4NH_2$ | | aromatic amine (aniline) |
| ortho-nitroaniline | $2-NO_2C_6H_4NH_2$ | | aromatic amine (aniline) |
| dopamine | 4-(2-aminoethyl)benzene-1,2-diol | | aromatic amine |
| Polyamines | $R_4$, $R_5$, $R_6$, $R_7$ (independently) = hydrogen, alkyl, alkene, alkyne, phenyl, aryl, hydroxyl, carboxyl, alkoxy, ether, aldehyde, ester, ketone, amine, amide, nitro, thiol, ions thereof, isomers thereof, salts thereof, derivatives thereof, or combinations thereof. | | Structure 2 |

TABLE 1-continued

Exemplary Zeolite Growth Modifiers (ZGMs)

| Compound Name | Chemical Formula | Chemical Structure | Chemical Group |
|---|---|---|---|
| | $R_8$ = alkyl, alkyne, phenyl, aryl, hydroxyl, carboxyl, alkoxy, ether, aldehyde, ester, ketone, amine, amide, nitro, thiol, ions thereof, isomers thereof, salts thereof, derivatives thereof, or combinations thereof. | | |
| ethylenediamine | $H_2NCH_2CH_2NH_2$ | | polyamine (diamine) |
| tetramethylethylenediamine | $(H_3C)_2NCH_2CH_2N(CH_3)_2$ | | polyamine (diamine) |
| tetramethylenediamine | $H_2N(CH_2)_4NH_2$ | | polyamine (diamine) |
| hexamethylenediamine | $H_2N(CH_2)_6NH_2$ | | polyamine (diamine) |
| ethylenediamine tetraacetic acid (EDTA) | $(HO_2CCH_2)_2NCH_2CH_2N(CH_2CO_2H)_2$ | | polyamine (diamine) |
| triethylenetetramine (TETA) | $H_2NCH_2CH_2(NHCH_2CH_2)_2NH_2$ | | polyamine |
| tris(2-aminoethyl)amine (T2TETA) | $(H_3NCH_2CH_2)_3N$ | | polyamine |
| spermine | $NH_2(CH_2)_3NH(CH_2)_2NH-(CH_2)_3NH_2$ | | polyamine |
| Polymeric Amines | $R_8$ = hydrogen, alkyl, alkene, alkyne, phenyl, aryl, hydroxyl, carboxyl, alkoxy, ether, aldehyde, ester, ketone, ions thereof, isomers thereof, salts thereof, derivatives thereof, or combinations thereof.<br>$R_{10}$ and $R_{11}$ (independently) = alkyl, alkene, alkyne, phenyl, aryl, hydroxyl, carboxyl, alkoxy, ether, aldehyde, ester, ketone, amine, amide, ions thereof, isomers thereof, salts thereof, derivatives thereof, or combinations thereof. | $[R_{10}N(R_9)R_{11}]_n$ | Structure 3 |
| polyethyleneimine (linear) (PEIM) | $H(NHCH_2CH_2)_4NH_2$ | | polymeric amine |

TABLE 1-continued

Exemplary Zeolite Growth Modifiers (ZGMs)

| Compound Name | Chemical Formula | Chemical Structure | Chemical Group |
|---|---|---|---|
| polyethyleneimine (branched) (PEIM B) | $H(NHCH_2CH_2)_4NH_2$ | | polymeric amine |
| poly-L-lysine | $(HNCH((CH_2)_4NH_2)CO)_n$ | | polymeric amine |
| poly-L-threonine | $(HNCH(CH(CH_3)OH)CO)_n$ | | polymeric amine |
| poly-L-lysine hydrobromide | $(HNCH((CH_2)_4NH_2)CO)_n \cdot HBr$ | | polymeric amine |
| Amino acids | $R_{12}$ = alkyl, alkyne, phenyl, aryl, hydroxyl, carboxyl, alkoxy, ether, aldehyde, ester, ketone, amine, amide, ions thereof, isomers thereof, salts thereof, derivatives thereof, or combinations thereof. | | Structure 4 |
| D-arginine (D-Arg) | $H_2NC(=NH)NH(CH_2)_3CH(NH_2)CO_2H$ | | amino acid |
| L-lysine | $HO_2CCH(NH_2)(CH_2)_4NH_3$ | | amino acid |

TABLE 1-continued

Exemplary Zeolite Growth Modifiers (ZGMs)

| Compound Name | Chemical Formula | Chemical Structure | Chemical Group |
|---|---|---|---|
| L-threonine | $CH_2CH(OH)CH(NH_2)CO_2H$ | | amino acid |
| serine | $HO_2CCH(NH_2)CH_2OH$ | | amino acid |
| histidine | $HO_2CCH(NH_2)CH_2(C_3N_2H_3)$ | | amino acid |
| Pyridinium Amine Complexes | $R_{13}$ = hydrogen, alkyl, alkene, alkyne, phenyl, aryl, hydroxyl, carboxyl, alkoxy, ether, aldehyde, ester, ketone, amine, amide, thiol, phosphine, phosphazene, ions thereof, isomers thereof, salts thereof, derivatives thereof, or combinations thereof. $R_{14}$, $R_{15}$, $R_{16}$, $R_{17}$, $R_{18}$ (independently) = hydrogen, alkyl, alkene, alkyne, phenyl, aryl, hydroxyl, carboxyl, alkoxy, ether, aldehyde, ester, ketone, amine, amide, nitro, thiol, ions thereof, isomers thereof, salts thereof, derivatives thereof, or combinations thereof. | | Structure 5 |
| pyridostigmine bromide | $[(C_3H_2N-CH_3)$-2-$OC(O)N(CH_3)_2]Br$ | | pyridinium amine complex |
| 4-(4-diethylaminostyryl)-N-methylpyridinium iodide | $[(C_3H_2N-CH_3)$-3-$CHCH-(C_6H_4)$-4-$N(CH_2CH_3)_2]I$ | | pyridinium amine complex |
| Phosphine Oxides | $R_{19}$, $R_{20}$, $R_{21}$ (independently) = hydrogen, alkyl, alkene, alkyne, phenyl, aryl, hydroxyl, carboxyl, alkoxy, ether, aldehyde, ester, ketone, amine, amide, nitro, thiol, ions thereof, isomers thereof, salts thereof, derivatives thereof, or combinations thereof. | | Structure 6 |

TABLE 1-continued

Exemplary Zeolite Growth Modifiers (ZGMs)

| Compound Name | Chemical Formula | Chemical Structure | Chemical Group |
|---|---|---|---|
| trimethylphosphine oxide | $(CH_3)_3P(O)$ | | phosphine oxide |
| triethylphosphine oxide | $(CH_3CH_2)_3P(O)$ | | phosphine oxide |
| tributylphosphine oxide (TBPO) | $[CH_3(CH_2)_3]_3P(O)$ | | phosphine oxide |
| tris(2-carbamoylethyl) phosphine oxide | $C_9H_{18}N_3O_4P$ | | phosphine oxide |
| Phosphonic Acids & Phosphates | $R_{22}$, $R_{23}$ (independently) = hydrogen, alkyl, alkene, alkyne, phenyl, aryl, hydroxyl, carboxyl, alkoxy, ether, aldehyde, ester, ketone, amine, amide, nitro, thiol, ions thereof, isomers thereof, salts thereof, derivatives thereof, or combinations thereof. $R_{24}$ = phosphazene, phosphine, oxygen, alkyl, alkene, alkyne, phenyl, aryl, hydroxyl, carboxyl, alkoxy, ether, aldehyde, ester, ketone, amine, amide, nitro, thiol, ions thereof, isomers thereof, salts thereof, derivatives thereof, or combinations thereof. | | Structure 7 |
| 1,8-octanediphosphonic acid | $(HO)_2P(O)(CH_2)_3P(O)(OH)_2$ | | phosphonic acid |
| o-phospho-DlL-serine | $(HO)_2P(O)OCH_2CHNH_2CO_2H$ | | phosphate |
| diethyl ethylamido-phosphate | $(CH_3CH_2O)_2P(O)NHCH_2CH_3$ | | phosphate |

TABLE 1-continued

Exemplary Zeolite Growth Modifiers (ZGMs)

| Compound Name | Chemical Formula | Chemical Structure | Chemical Group |
|---|---|---|---|
| diethyl tert-butylamido-phosphate | $(CH_3CH_2O)_2P(O)NHC(CH_3)_3$ | 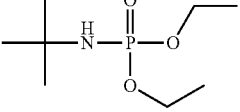 | phosphate |

In some embodiments, the ZGM contains at least one nitrogen-containing compound that includes monoamines (e.g., alkyl amine and hydroxylamine), polyamines (e.g., diamine, triamine, and tetraamine), aromatic amines, anilines, pyridinium amines, amino acids, polymeric amines, as well as other amines.

In some examples, the ZGM contains at least one monoamine compound. Structure 1 of Table 1 is a generic chemical structure for monoamine compounds, wherein each $R_1$, $R_2$, and $R_3$ is independently a chemical group of hydrogen, alkyl, alkene, alkyne, phenyl, aryl, hydroxyl, carboxyl, alkoxy, ether, aldehyde, ester, ketone, amide, nitro, thiol, ions thereof, isomers thereof, salts thereof, derivatives thereof, or combinations thereof. In some examples, the ZGM contains a monoamine such as an alkylamine or a hydroxylamine. Exemplary monoamine compounds include dipropylamine, tert-butylamine, N,N-dimethylbutylamine, 2-dimethylethanolamine (DMEA), ethanolamine, diethanolamine, triethanolamine, methylaminoethanol, tris(hydroxymethyl)aminomethane (THAM), 3-amino-1-propanol, isomers thereof, salts thereof, derivatives thereof, or combinations thereof. In other examples, the monoamine compound is an aromatic amine or an aniline, such as nitroaniline or dopamine, or contains a pyridinium amine such as pyridostigmine, 4-(4-diethylaminostyryl)-N-methylpyridinium, isomers thereof, salts thereof, derivatives thereof, or combinations thereof.

In other examples, the ZGM contains at least one polyamine compound. Structure 2 of Table 1 is a generic chemical structure for polyamine compounds, wherein each $R_4$, $R_5$, $R_6$, and $R_7$ is independently a chemical group of hydrogen, alkyl, alkene, alkyne, phenyl, aryl, hydroxyl, carboxyl, alkoxy, ether, aldehyde, ester, ketone, amine, amide, nitro, thiol, ions thereof, isomers thereof, salts thereof, derivatives thereof, or combinations thereof and Rs is a chemical group of alkyl, alkene, alkyne, phenyl, aryl, hydroxyl, carboxyl, alkoxy, ether, aldehyde, ester, ketone, amine, amide, nitro, thiol, ions thereof, isomers thereof, salts thereof, derivatives thereof, or combinations thereof. In some examples, the ZGM contains a polyamine such as triethylenetetramine (TETA), tris(2-aminoethyl)amine (T2TETA), spermine, isomers thereof, salts thereof, derivatives thereof, or combinations thereof. The polyamine may be a diamine or high-order amine. Exemplary diamines useful as ZGMs include ethylenediamine, tetramethylethylenediamine, tetramethylenediamine, hexamethylenediamine, ethylenediamine tetraacetic acid (EDTA), isomers thereof, salts thereof, derivatives thereof, or combinations thereof.

In other examples, the ZGM contains at least one polymeric amine compound. Structure 3 of Table 1 is a generic chemical formula for polymeric amine compounds, $[R_{10}N(R_9)R_{11}]_n$ wherein Rg is a chemical group of hydrogen, or an organic group including alkyl, alkene, alkyne, phenyl, aryl, hydroxyl, carboxyl, alkoxy, ether, aldehyde, ester, ketone, ions thereof, isomers thereof, salts thereof, derivatives thereof, or combinations thereof and each R10 and R11 is independently a chemical group of alkyl, alkene, alkyne, phenyl, aryl, hydroxyl, carboxyl, alkoxy, ether, aldehyde, ester, ketone, amine, amide, ions thereof, isomers thereof, salts thereof, derivatives thereof, or combinations thereof. Polymeric amine compounds include monomers, polymers, oligomers, or combinations thereof. Exemplary polymeric amine compounds utilized as ZGMs include polyethyleneimine (e.g., liner or branched PEIM), polylysine (e.g., poly-L-lysine), polythreonine (e.g., poly-L-threonine), ions thereof, isomers thereof, salts thereof, derivatives thereof, or combinations thereof. In one example, a polymeric amine compound is poly-L-lysine hydrobromide.

Structure 1

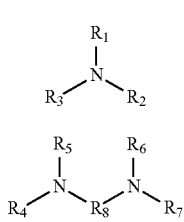

Structure 2

$R_5$   $R_6$
 |       |
$R_4$—N—$R_8$—N—$R_7$

Structure 3

$[R_{10}N(R_9)R_{11}]_n$

Structure 4

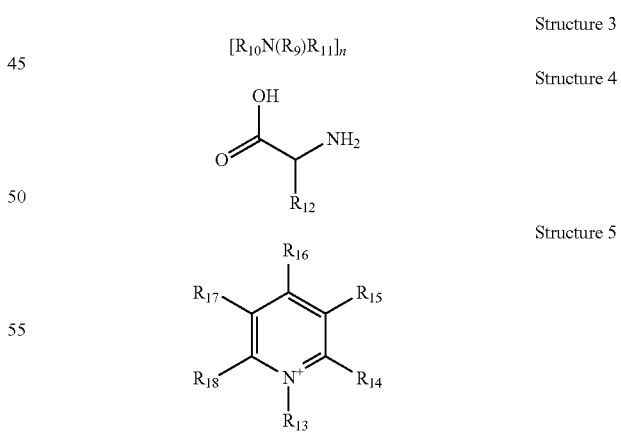

Structure 5

In other examples, the ZGM contains at least one amino acid or amino acid derivative. Structure 4 of Table 1 is a generic chemical structure for amino acid compounds, wherein R12 is a remaining fragment of the amino acid or amino acid derivative, which includes a chemical group of alkyl, alkene, alkyne, phenyl, aryl, hydroxyl, carboxyl, alkoxy, ether, aldehyde, ester, ketone, amine, amide, ions thereof, isomers thereof, salts thereof, derivatives thereof, or combinations thereof. Exemplary amino acid compounds utilized as ZGMs include as arginine, lysine, histidine, threonine, serine, isomers thereof, salts thereof, derivatives thereof, or combinations thereof. In some examples, the amino acid compound is D-arginine (D-Arg), L-lysine, L-threonine, or combinations thereof.

In other examples, the ZGM contains at least one pyridinium amine complex or compound. Structure 5 of Table 1 is a generic chemical structure for pyridinium amine compounds, wherein $R_{13}$ is a chemical group of hydrogen, alkyl, alkene, alkyne, phenyl, aryl, hydroxyl, carboxyl, alkoxy, ether, aldehyde, ester, ketone, amine, amide, thiol, phosphine, phosphazene, ions thereof, isomers thereof, salts thereof, derivatives thereof, or combinations thereof and each $R_{14}$, $R_{15}$, $R_{16}$, $R_{17}$, and $R_{18}$ is independently a chemical group of hydrogen, alkyl, alkene, alkyne, phenyl, aryl, hydroxyl, carboxyl, alkoxy, ether, aldehyde, ester, ketone, amine, amide, nitro, thiol, ions thereof, isomers thereof, salts thereof, derivatives thereof, or combinations thereof. Exemplary pyridinium amine compounds utilized as ZGMs include pyridostigmine bromide, 4-(4-diethylaminostyryl)-N-methylpyridinium iodide, salts thereof, complexes thereof, derivatives thereof, or combinations thereof.

In other embodiments, the ZGM contains at least one phosphorous-containing compound that includes, but is not limited to, phosphines (e.g., alkyl phosphine and hydroxyl phosphine), phosphine oxides, phosphonic acids, phosphates, phosphazenes, salts thereof, derivatives thereof, or combinations thereof.

In some examples, the ZGM contains at least one phosphine oxide compound. Structure 6 of Table 1 is a generic chemical structure for phosphine oxide compounds, wherein each $R_{19}$, $R_{20}$, and $R_{21}$ is independently a chemical group of hydrogen, alkyl, alkene, alkyne, phenyl, aryl, hydroxyl, carboxyl, alkoxy, ether, aldehyde, ester, ketone, amine, amide, nitro, thiol, ions thereof, isomers thereof, salts thereof, derivatives thereof, or combinations thereof. Exemplary phosphine oxide compounds utilized as ZGMs include trimethylphosphine oxide, triethylphosphine oxide, tributylphosphine oxide (TBPO), tris(2-carbamoylethyl) phosphine oxide, salts thereof, derivatives thereof, or combinations thereof.

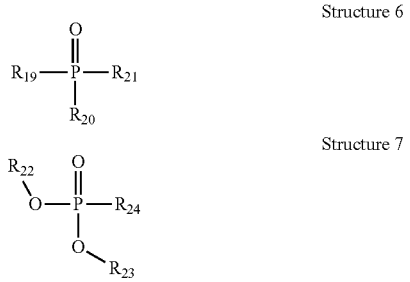

Structure 6

Structure 7

In other examples, the ZGM contains at least one phosphonic acid, phosphate, or combinations thereof. Structure 7 of Table 1 is a generic chemical structure for phosphonic acid compounds and phosphate compounds, wherein each R22 and R23 is independently a chemical group of hydrogen, alkyl, alkene, alkyne, phenyl, aryl, hydroxyl, carboxyl, alkoxy, ether, aldehyde, ester, ketone, amine, amide, nitro, thiol, ions thereof, isomers thereof, salts thereof, derivatives thereof, or combinations thereof and $R_{24}$ is a chemical group of phosphazene, phosphine, oxygen, alkyl, alkene, alkyne, phenyl, aryl, hydroxyl, carboxyl, alkoxy, ether, aldehyde, ester, ketone, amine, amide, nitro, thiol, ions thereof, isomers thereof, salts thereof, derivatives thereof, or combinations thereof. Phosphonic acid compounds may be a monophosphonic acid, a diphosphonic acid, a triphosphonic acid, a tetraphosphonic acid, salts thereof, derivatives thereof, or combinations thereof. Exemplary phosphonic acid compounds utilized as ZGMs include 1,10-decanediphosphonic acid, 1,8-octanediphosphonic acid, 1,7-heptanediphosphonic acid, 1,6-hexanediphosphonic acid, 1,5-pentanediphosphonic acid, 1,4-butanediphosphonic acid, isomers thereof, salts thereof, derivatives thereof, or combinations thereof. Exemplary phosphate compounds utilized as ZGMs include diethyl tert-butylamido phosphate, o-phospho-D/L-serine, diethyl ethylamido phosphate, isomers thereof, salts thereof, derivatives thereof, or combinations thereof.

In an alternative embodiment, unless otherwise noted, each of the $R_1$-$R_{24}$ in Structures 1-7 of the ZGM compounds is independently a chemical group that includes hydrogen, alkyl, alkenyl, alkynyl, aryl, arylalkyl, cycloalkyl, and other linear, branched, or cyclic organic groups (or combinations thereof) of varying molecular weight with functional groups that include, but are not limited to, alcohols, carboxylic acids, amines, and inorganic metals or ions or salts, solvate, or cocrystals, and stereoisomers, tautomers and isotopic variants thereof.

The method further includes that a synthesis mixture contains at least one framework source precursor, the ZGM, an optional mineralizing agent, and the solvent. The solvent generally contains water, an organic solvent, or combinations thereof. The water may be deionized water. The organic solvent may be an alcohol, such as methanol, ethanol, propanol, or butanol. Additionally, the organic solvent may be an ether, ketone, or aromatic solvent. In some examples, the synthesis mixture has a concentration of the ZGM during the synthesis process within a range from about 0.05 wt % to about 20 wt %, more narrowly within a range from about 0.05 wt % to about 10 wt %, more narrowly within a range from about 0.05 wt % to about 5 wt %, more narrowly within a range from about 0.1 wt % to about 3 wt %, and more narrowly within a range from about 0.3 wt % to about 2 wt % of the synthesis mixture. In other examples, the synthesis mixture has a concentration of the ZGM during the synthesis process within a range from about 1 wt % to about 60 wt %, more narrowly within a range from about 5 wt % to about 50 wt %, more narrowly within a range from about 10 wt % to about 45 wt %, and more narrowly within a range from about 20 wt % to about 40 wt % of the synthesis mixture.

In some examples, the method further includes combining a mineralizing agent with the at least one framework source precursor, the ZGM, an optional mineralizing agent, and the solvent to form the synthesis mixture. The mineralizing agent is generally a source of hydroxide (OH⁻) or fluoride (F⁻) for the synthesis mixture. Exemplary hydroxide sources include sodium hydroxide, potassium hydroxide, lithium hydroxide, calcium hydroxide, magnesium hydroxide, ammonium hydroxide, tetraalkylammonium hydroxide, salts thereof, derivatives thereof, or combinations thereof. Exemplary fluoride sources include hydrogen fluoride, hydrofluoric acid, hydrogen fluoride salts, sodium fluoride, potassium fluoride, ammonium fluoride, tetraalkylammonium fluoride, salts thereof, derivatives thereof, or combinations thereof. Furthermore, the addition of one or more ZGM compounds is applicable for a zeolite synthesis that employs inorganic additives that may be used for the purpose of supplying an extra framework cation, such as (but are not limited to), ammonium ($NH_4^+$), acid ($H^+$), alkali metals, transition metals, and salts.

Furthermore, the addition of one or more ZGM compounds is applicable for the synthesis of zeolites with different tetrahedral building units ($TO_4$) that include (but are not limited to) at least one framework source precursor. The framework source precursor is a compound that generally contains the T-atoms silicon, aluminum, phosphorus, germanium, and titanium. Silicon is the basic T-atom and others are commonly referred to as heteroatoms. The methods described by embodiments herein are utilized to form zeolites and crystalline zeolite materials that have a host of compositions including but are not limited to pure silica, a mixture of silica and alumina (aluminosilicate), a mixture of alumina and phosphate (aluminophosphate, AlPO), a mixture of silicon-aluminum-phosphorous oxides (silicoaluminophosphate, SAPO), or a hybrid of these structures with occluded heteroatoms.

Furthermore, the addition of one or more ZGM compounds is applicable for a zeolite synthesis at any temperature or composition that gives rise to homogeneous (or so-called clear solutions) or heterogeneous (gel or sol gel) mediums. A variety of silica sources may be used, such as (but are not limited to) fumed silica, colloidal silica, silica salts, or tetraethylorthosilicate (TEOS). Likewise, a variety of reagents may be used for other heteroatoms (e.g., aluminum or phosphate sources).

The synthesis mixture contains at least one framework source precursor or may contain multiple framework source precursors depending on the desired composition and framework-type of the zeolite. The framework source precursor may include a silica source, an alumina source, a phosphate source, an aluminosilicate source, a silicoaluminophosphate source, a titania source, a germania source, hydrates thereof, derivatives thereof, or combinations thereof. The framework source precursor may be derived from or contain a clay mineral, such as kaolinite, diatomite, or saponite, and utilized as source of silica or alumina. The framework source precursor generally contains a silica source, such as colloidal silica, fumed silica, silica salts, metallic silicates, hydrates thereof, derivatives thereof, or combinations thereof. Other exemplary silica sources include alkyl orthosilicate, orthosilicic acid, silicic acid, salts thereof, hydrates thereof, derivatives thereof, or combinations thereof. Alkyl orthosilicates that are useful as the silica source include tetramethyl orthosilicate, tetraethyl orthosilicate, tetrapropyl orthosilicate, tetrabutyl orthosilicate, salts thereof, hydrates thereof, derivatives thereof, or combinations thereof. In many examples, the framework source precursor also contains an alumina source, such as alumina, aluminum sulfate, aluminum nitrate, aluminum isopropoxide, aluminum butoxide, aluminum chloride, aluminum fluoride, aluminum phosphate, aluminum hydroxide, sodium aluminate, potassium aluminate, aluminates thereof, hydrates thereof, salts thereof, derivatives thereof, or combinations thereof. In several specific examples, the alumina source is aluminum sulfate hydrate or aluminum nitrate hydrate. In other examples, the framework source precursor contains a phosphate source, such as phosphoric acid, trimethylphosphine, triethylphosphine, tripropylphosphine, tributylphosphine, trimethyl phosphate, triethyl phosphate, tripropyl phosphate, tributyl phosphate, aluminum phosphate, aluminophosphate, phosphates thereof, salts thereof, derivatives thereof, or combinations thereof.

In an alternative embodiment, the method further includes combining a structure directing agent (SDA) with the at least one framework source precursor, the ZGM, and the solvent to form a synthesis mixture during the synthesis process. The SDA may be an organic or inorganic molecule or ion. The SDA is occluded within the zeolite nanopores and functions more as a template (or facilitator) of the crystal structure rather than a surface-bound ZGM. There are numerous SDAs or mixed SDAs used in zeolite synthesis, while some zeolites form in the absence of SDA. The SDA may be introduced in various forms, such as salts, bases, acids, as well as in states of a solid, a liquid, or a suspension.

In many examples, the SDA contains at least one ammonium source, such as a tetraalkylammonium compound (e.g., a tetraalkylammonium hydroxide), a quaternary ammonium-type surfactant, or a dimer or a trimer of a tetraalkylammonium compound. Exemplary tetraalkylammonium hydroxides that may be utilized as SDAs include tetramethylammonium hydroxide, tetraethylammonium hydroxide, tetrapropylammonium hydroxide, tetrabutylammonium hydroxide, tetraarylammonium hydroxide, isomers thereof, salts thereof, complexes thereof, derivatives thereof, or combinations thereof.

Exemplary quaternary ammonium-type surfactants that may be utilized as SDAs include compounds or complexes that contain a cation selected from $[C_{22}H_{45}-N(CH_3)_2-C_6H_{12})_2-H]^{2+}$ (22-$N_2$-H), $[C_{18}H_{37}-N(CH_3)_2-C_6H_{12})_3-C_{18}H_{37}]^{3+}$ (18-$N_3$-18), $[C_{22}H_{45}-N(CH_3)_2-C_6H_{12})_4-C_{22}H_{45}]^{4+}$ (22-$N_4$-22), $[(C_3H_7)_3N(C_7H_{14})N(C_3H_7)_3]^{2+}$ (dC7), $[(C_3H_7)_3N(C_6H_{12})N(C_3H_7)_3]^{2+}$ (dC6), $[(C_3H_7)_2N((C_6H_{12})N(C_3H_7)_3)_2]^{3+}$ (tC6), isomers thereof, salts thereof, complexes thereof, derivatives thereof, or combinations thereof. Generally, the quaternary ammonium-type surfactant contains an anion such as bromide, iodide, chloride, or hydroxide. In some examples, the SDA contains piperidine, alkyl piperidine, isomers thereof, salts thereof, complexes thereof, derivatives thereof, or combinations thereof. The alkyl piperidine compounds may be alkylated on the N atom of the piperidine ring, the carbon atoms of the piperidine ring, or both.

The addition of one or more ZGM compounds is applicable for a zeolite synthesis irrespective of the solvent or the use of a template, such as (but are not limited to) surfactants, microemulsions, carbons and polymers, monoliths, self-assembled monolayers, functionalized surfaces, and porous substrates.

In some embodiments, the synthesis process includes combining at least one framework source precursor, the ZGM, an optional mineralizing agent, and the solvent to form a synthesis mixture, wherein the synthesis mixture is initially free of SDAs and/or zeolite seed crystals. However, as the synthesis process progresses, zeolite seed crystals are formed in situ and proceed to grow during the growth process. In other embodiments, zeolite seed crystals are utilized during the synthesis process. In some examples, the synthesis process includes combining a plurality of zeolite seed crystals along with at least one framework source precursor, the ZGM, an optional mineralizing agent, and the solvent to form a synthesis mixture. Therefore, the synthesis mixture may start with zeolite seed crystals for providing the initial crystal framework structure of the zeolite. In other examples, the synthesis process includes combining an SDA along with at least one framework source precursor, the ZGM, an optional mineralizing agent, and the solvent to form a synthesis mixture. In further examples, the synthesis process includes combining a plurality of zeolite seed crystals and an SDA along with at least one framework source precursor, the ZGM, an optional mineralizing agent, and the solvent to form a synthesis mixture.

In some examples, the synthesis mixture or the suspension is generally maintained at a temperature within a range from about 25° C. to about 350° C. for a time period of at least about 2 hours, but generally longer, such as for about 6 hours or greater, such as within a range from about 12 hours to about 40 days during the synthesis step or the growth step. In other examples, the synthesis mixture or the suspension is maintained at a temperature within a range from about 25° C. to about 250° C. for a time period within a range from 1 day to about 30 days during the synthesis step or the growth step. In other examples, the synthesis mixture or the suspension is maintained at a temperature within a range from about 50° C. to about 200° C. for a time period within a range from 2 days to about 14 days during the synthesis step or the growth step.

The zeolites formed by the methods described herein have 0, 1, 2, and 3 dimensional pore networks. A non-porous zeolite is described as a zero dimensional (0-D) pore network and lacks channels passing through the crystalline zeolite material. A porous zeolite is described as a 1, 2, or 3 dimensional (1-D, 2-D, or 3-D) pore network and contains channels passing through the crystalline zeolite material. In general, a zeolite with a 1-D pore network contains a plurality of channels (e.g., vertical channels) extending between the two surfaces (e.g., upper and lower surfaces) on opposite sides or near opposite sides of the zeolite crystalline material. Each vertical channel may have an exclusive diffusion pathway or a non-exclusive diffusion pathway extending from an opening on one surface (e.g., the upper surface), through the crystalline zeolite material, and to an opening on another surface (e.g., the lower surface). A zeolite with a 2-D or 3-D pore network contains channels as described for the 1-D pore network, as well as contains channels in a second dimension (2-D) or in a second and third dimensions (3-D). Therefore, a plurality of channels in the second dimension (e.g., horizontal channels) extending between the two surfaces (e.g., two side surfaces) on opposite sides or near opposite sides of the zeolite crystalline material forms a 2-D pore network and a second plurality of channels extending in the third dimension (e.g., horizontal channels) extending between the two surfaces (e.g., two side surfaces) on opposite sides or near opposite sides of the zeolite crystalline material forms a 3-D pore network. Each horizontal channel may have an exclusive diffusion pathway or a non-exclusive diffusion pathway extending from an opening on one surface (e.g., the upper surface), through the crystalline zeolite material, and to an opening on another surface (e.g., the lower surface).

The composition of the zeolite further contains a plurality of tortuous channels extending between the upper and lower surfaces, the upper surface and the side surfaces, the lower surface and the side surfaces, or two of the side surfaces. The zeolite may contain a plurality of channels extending throughout the crystalline zeolite material. The channels that extend between the upper and lower surfaces are vertical channels, and each vertical channel independently has an exclusive diffusion pathway extending from an opening on the upper surface, through the crystalline zeolite material, and to an opening on the lower surface. In some examples, the plurality of vertical channels contains from about 50 vertical channels to about 1,000 vertical channels. The vertical channels may be coupled with at least one cage or pore within the crystalline zeolite material. In general, each opening of the vertical channels generally has a diameter of less than 20 Å, such as within a range from about 2 Å to about 15 Å, more narrowly within a range from about 3 Å to about 10 Å, and more narrowly within a range from about 4 Å to about 8 Å.

In one type of zeolite, the channels that extend between the side surfaces are horizontal channels, and each horizontal channel independently has an exclusive diffusion pathway extending from an opening on one side surface, through the crystalline zeolite material, and to an opening on another side surface. In some examples, the two openings of the exclusive diffusion pathway are disposed on opposing side surfaces. In other examples, the two openings of the exclusive diffusion pathway are disposed on non-opposing side surfaces, wherein non-opposing side surfaces include adjacent or neighboring sides, as well as staggered or alternating sides. In another type of zeolite, the channels that extend between the side surfaces are horizontal channels, and each horizontal channel independently has a non-exclusive diffusion pathway extending from an opening on one side surface, through the crystalline zeolite material, and to an opening on another side surface. In some examples, the two openings of the non-exclusive diffusion pathway are on opposing side surfaces. In other examples, the two openings of the non-exclusive diffusion pathway are on non-opposing side surfaces. In some examples, the plurality of horizontal channels contains from about 50 horizontal channels to about 1,000 horizontal channels. The horizontal channels may be coupled with at least one cage or pore within the crystalline zeolite material. In general, each opening of the horizontal channels generally has a diameter of less than 20 Å, such as within a range from about 2 Å to about 15 Å, more narrowly within a range from about 3 Å to about 10 Å, and more narrowly within a range from about 4 Å to about 8 Å.

Zeolite crystals and crystalline zeolite materials formed by processes utilizing ZGMs described herein may have any crystal structure with typical zeolite frameworks. The zeolite compositions described herein generally contain zeolite crystals and crystalline zeolite materials having single crystal structures. Exemplary crystal structures of the formed zeolite crystals and crystalline zeolite materials, as well as zeolite seed crystals (that may optionally be used) have a framework of AEI, AEL, AFO, AFT, ANA, APC, ATN, ATT, ATV, AWW, BEA, BIK, GAS, CFI, CHA, CHI, CLO, DAG, DOR, DON, EDI, EMT, ERi, EUO, FAU, FER, GIS, GOO, HEU, KFI, LEV, LOV, LTA, LTL, MEL, MER, MFI, MON, MOR, MTW, MTT, MWW, PAU, PHI, RHO, ROG, SOD, STI, THO, TON, substituted forms thereof, or derivatives thereof. In many examples, the formed zeolite crystals and crystalline zeolite materials, as well as zeolite seed crystals (that may optionally be used) have a framework of AEL, ANA, BEA, CHA, FAU, FER, GIS, LEV, LTL, MFI, MOR, MTW, SOD, STI, substituted forms thereof, and derivatives thereof. In many examples, the zeolite compositions described herein contain crystalline zeolite materials having single crystal structures, but other examples provide zeolite compositions containing crystalline zeolite materials having two or more crystal structures.

The crystalline zeolite materials described herein generally contain at least one material containing oxides of silicon, aluminum, phosphorous, and mixtures thereof, such as silicate, aluminosilicate, silicoaluminophosphate, aluminumphosphate, derivatives thereof, or combinations thereof, but may also contain other elements. In one example, the crystalline zeolite material consists essentially of silicon and oxygen, such as silicalite-1 with the MFI structure. In another example, the crystalline zeolite material contains silicon, aluminum, and oxygen. The crystalline zeolite material may further contain at least one element selected from titanium, germanium, gallium, phosphorous, boron, or combinations thereof. In addition, the crystalline zeolite material may further contain at least one element selected from sodium, potassium, calcium, magnesium, yttrium, or combinations thereof.

Generally, the zeolite crystal containing the crystalline zeolite material has a thickness within a range from about 5 nm to about 450 nm, more narrowly within a range from about 10 nm to about 300 nm, more narrowly within a range from about 50 nm to about 250 nm, and more narrowly within a range from about 100 nm to about 150 nm. Each length of the upper surface and the lower surface of the crystalline zeolite material is independently within a range from about 10 nm to about 50 µm, more narrowly within a range from about 0.1 µm to about 20 µm, more narrowly within a range from about 0.5 µm to about 5 µm, more narrowly within a range from about 0.6 µm to about 4 µm, and more narrowly within a range from about 0.8 µm to about 2 µm. Similarly, each width of the upper surface and the lower surface of the crystalline zeolite material is independently within a range from about 10 nm to about 50 µm, more narrowly within a range from about 0.1 µm to about 20 µm, more narrowly within a range from about 0.5 µm to about 5 µm, more narrowly within a range from about 0.6 µm to about 4 µm, and more narrowly within a range from about 0.8 µm to about 2 µm.

In one embodiment, a composition of a zeolite contains a crystalline zeolite material having a single crystal structure, an upper surface of the crystalline zeolite material extending substantially parallel to a lower surface of the crystalline zeolite material, a length of the upper surface within a range from about 10 nm to about 50 µm, a width of the upper surface within a range from about 10 nm to about 50 µm, a plurality of side surfaces extending between the upper and lower surfaces, a thickness of the crystalline zeolite material measured between the upper and lower surfaces and extending substantially perpendicular to the upper and lower surfaces, an aspect ratio of about 4 or greater, wherein the aspect ratio is determined as a sum of one half of the length and one half of the width of the upper surface relative to the thickness of the crystalline zeolite material, and a plurality of vertical channels extending between the upper and lower surfaces, wherein each vertical channel independently has an exclusive diffusion pathway extending from an opening on the upper surface, through the crystalline zeolite material, and to an opening on the lower surface. In some examples, the aspect ratio is about 6 or greater, such as about 10 or greater, such as about 15 or greater, such as about 20 or greater, such as about 30 or greater, such as about 50 or greater, such as about 100 or greater. In other examples, the aspect ratio is within a range from about 10 to about 100.

The porous zeolites formed by the methods described herein have a network of channels that are described or sized as a particular numbered membered-ring (MR) channel based on the number of T-atoms forming the circumference of the channel. Therefore, the porous zeolites generally have a network of channels with 4-MR, 6-MR, 8-MR, 10-MR, 12-MR, or larger ring structures. The non-porous zeolite crystal framework structures (0-D) and three types of porous zeolite crystal framework structures, as examples, to illustrate the invention AEL (1-D pores with 10-MR), MOR (1-D pores with 12-MR), FER (2-D pores with 8-MR and 10-MR), and MFI (3-D pores with 10-MR). These structures represent possible combinations of pore dimensionality with a variety of common pore diameters or membered-ring (MR) channels. These frameworks were synthesized with variable heteroatom compositions AEL (silicoaluminaphosphate, SAPO-11), MOR (aluminosilicate), and MFI (pure silicate, silicalite-1). The use of ZGMs as growth inhibitors in these materials, which shows the present invention, can be extended to the synthesis of any zeolite, irrespective of framework structure or heteroatom composition. Single crystal structure of a zeolite material or zeolite crystal does not imply or should be construed to mean a perfect crystal since many zeolite materials and zeolite crystals may have abnormalities or defects (e.g., crystal twinning or dislocations) that may be desirable or by design.

Exemplary crystal structures of the zeolite materials containing small pores and channels which form the diffusion pathways have a framework of AEI, AFT, APC, ATN, ATT, ATV, AWW, BIK, GAS, CHA, CHI, DAG, DOR, EDI, ERi, GOO, KFI, LEV, LOV, LTA, MON, PAU, PHI, RHO, ROG, THO, substituted forms thereof, or derivatives thereof. Exemplary crystal structures of the zeolite materials containing medium pores and channels which form the diffusion pathways have a framework of AFO, AEL, EUO, HEU, FER, MEL, MFI, MTW, MTT, TON, substituted forms thereof, or derivatives thereof. Exemplary crystal structures of the zeolite materials containing large pores and channels which form the diffusion pathways have a framework of EMT, FAU, substituted forms thereof, or derivatives thereof. Other exemplary crystal structures of the zeolite materials have a framework of ANA, BEA, CFI, CLO, DON, GIS, LTL, MER, MOR, MWW, SOD, substituted forms thereof, or derivatives thereof.

The crystal structures of the porous zeolite materials are typically described in terms of the size of the ring that forms the channel, hole, or pore, where the size is based on the number of T-atoms in the ring. Small pore zeolite materials generally have up to 8-MR structures and an average pore size less than 5 Å, whereas medium pore zeolite materials generally have 10-MR structures and an average pore size of about 5 Å to about 6 Å. Large pore zeolite materials generally have at least 12-MR structures and an average pore size greater than about 6 Å. Other framework-type characteristics include the arrangement of rings that form a cage, and when present, the dimension of channels, and the spaces between the cages.

Another embodiment of the present invention discloses the specific composition of ZGMs, as examples to illustrate the invention. A rigorous analysis of tailored growth inhibition was performed with silicalite-1 (MFI), mordenite (MOR), silicoaluminaphosphate (AEL), and linde-L (LTL) utilizing a variety of different ZGMs with varying functionality, size, and structure.

Figure 3A:
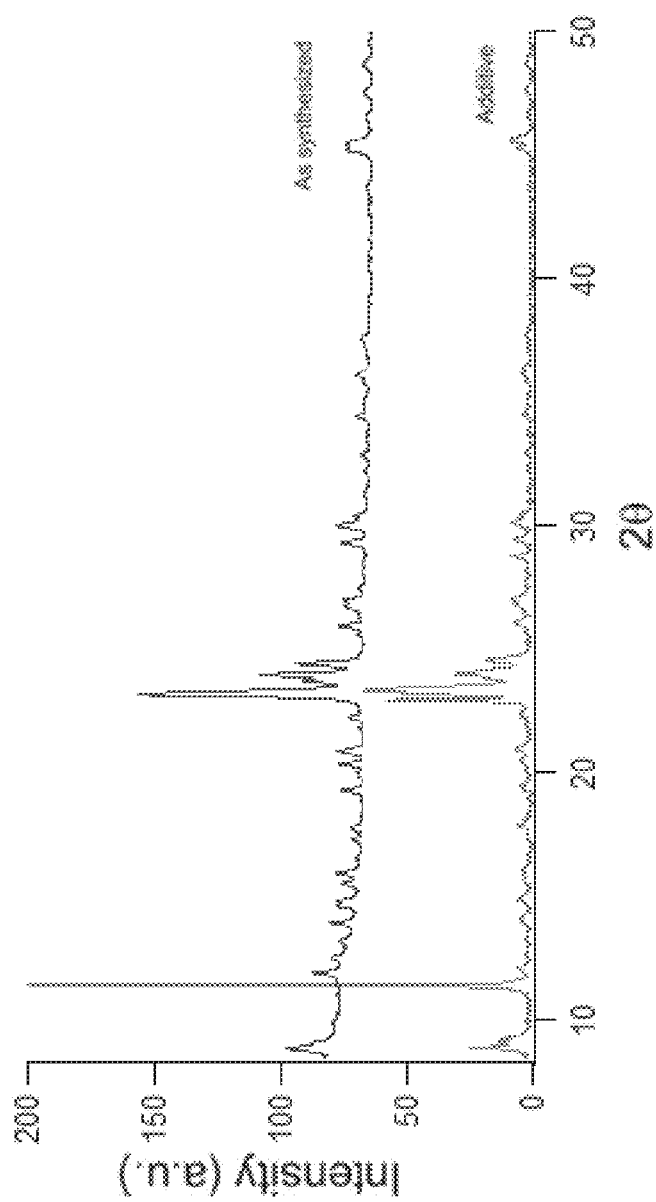
FIGS. 3A-3B are XRD patterns zeolite crystals in the absence (control) and presence of a ZGM.
Figure 3B:
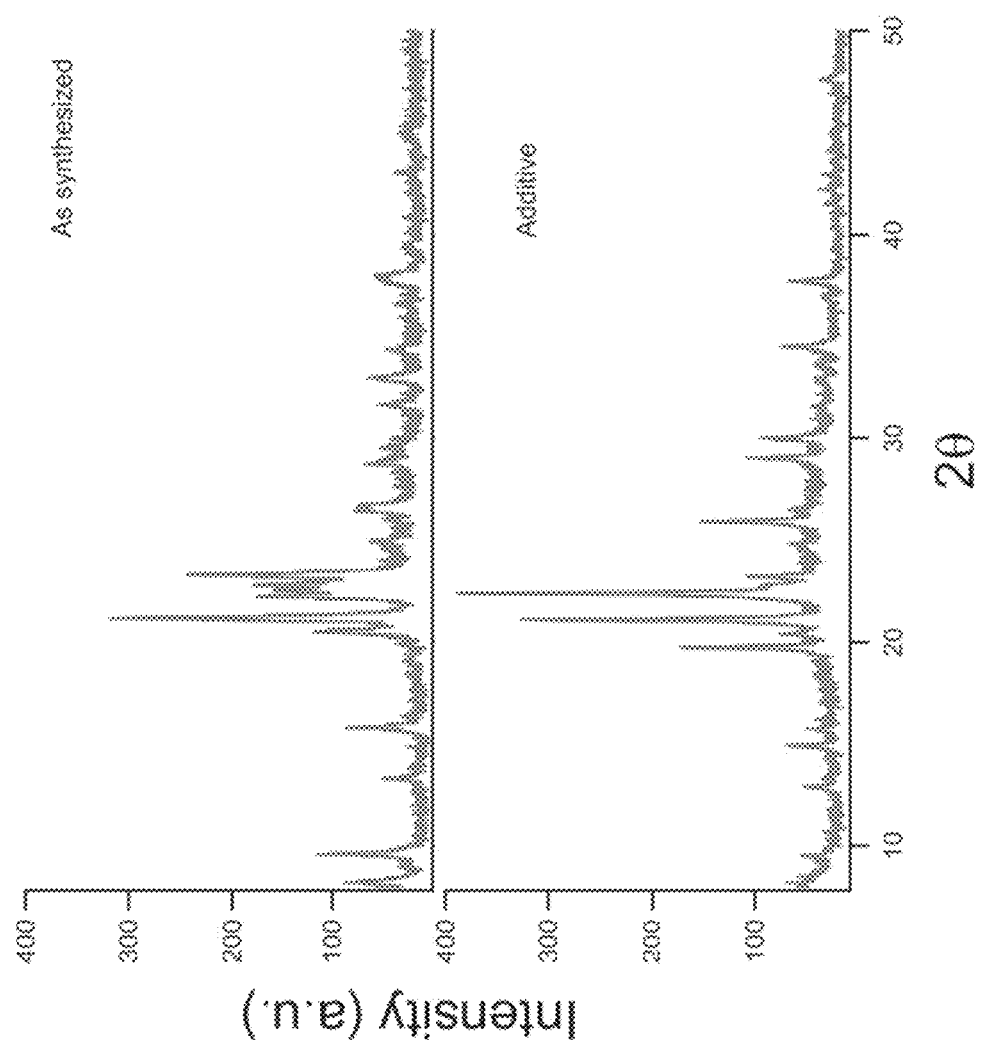

Another embodiment of the present invention discloses that the use of ZGMs does not affect the framework structure of the zeolite. FIG. 3A is an XRD pattern of silicalite-1 crystals in as synthesized (control, in absence of ZGMs) batches and in the presence of spermine exhibits d-spacings of the MFI framework structure which verifies that the presence of additives does not influence the framework structure. FIG. 3B is an XRD pattern of AEL crystals for as synthesized (control, in absence of ZGMs) batches and in the presence of the branched polyethyleneimine (PEIM) exhibit equal d-spacings, which verifies that the presence of additives does not influence the framework structure. More specifically, the comparative characterization using powder X-ray diffraction (or XRD) of zeolites prepared in the absence and in the presence of ZGMs reveal that the d-spacing values remain unchanged. Zeolite crystals prepared without ZGMs (labeled as-synthesized) and those produced in the presence of ZGMs (labeled additive) were examined to test whether the presence of ZGMs in the synthesis mixture alters the zeolite framework structure. The crystal structure was verified using powder XRD wherein reported d-spacing values were compared with the experimental data. XRD patterns for as-synthesized and additive syntheses of MFI (silicalite-1) and AEL framework types are shown in FIGS. 3A and 3B, respectively.

Another embodiment of the present invention discloses use of ZGMs to create zeolites whose crystals have defined aspect ratio with respect to length, width, and thickness. More specifically, the comparative characterization of scanning electron micrographs (or SEM) of zeolites prepared in the absence and in the presence of ZGMs reveals the addition of ZGMs to zeolite syntheses results in changes to the crystal aspect ratio with respect to the length, width, and thickness. Due to the anisotropic crystal structure, changes in aspect ratio reflect a preferential binding of the ZGM to specific crystal surfaces. MFI crystals form hexagonal platelets with a basal (010) surface (see FIG. 1C).

Figures 4A, 4B, 4C:
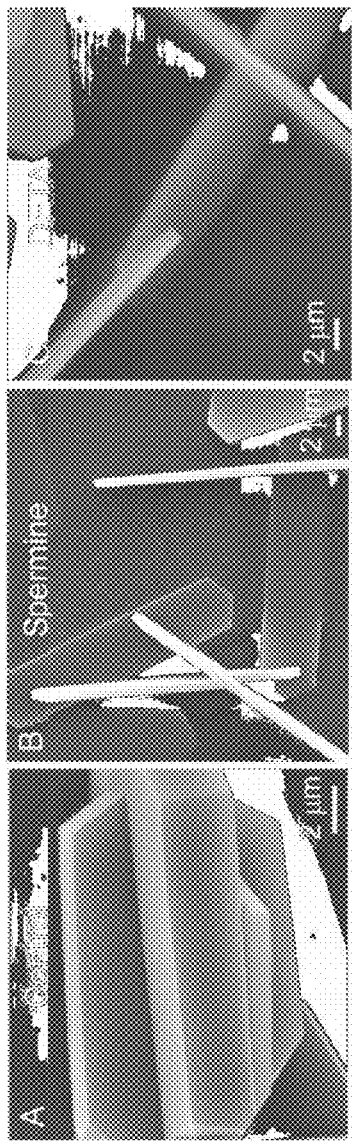
FIGS. 4A-4C are scanning electron micrographs of various silicalite-1 (MFI) crystals.

FIGS. 4A-4C are scanning electron micrographs of silicalite-1 (MFI) crystals for control (FIG. 4A), spermine (FIG. 4B), and DETA (FIG. 4C) syntheses reveal changes in thickness, which corresponds to reduced diffusion pathlength along the [010] direction. The introduction of ZGMs in the MFI synthesis results in thinner platelets, which is a successful achievement in rational design to minimize internal diffusion pathlength along the less tortuous channels of MFI. Therefore, the adsorption of some ZGMs, such as spermine and DETA, on specific zeolite surfaces reduces the thickness of the hexagonal platelets, as revealed in scanning electron micrographs in FIGS. 4A-4C.

Figure 5:
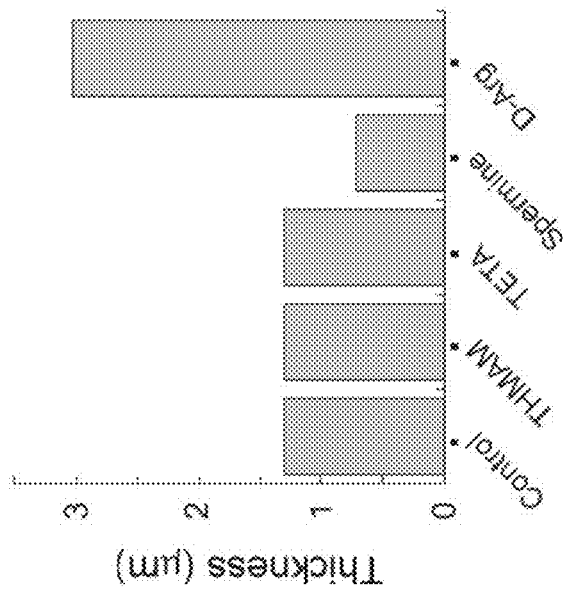
FIG. 5 is a chart illustrating a of comparison of crystal thicknesses.

FIG. 5 is a chart illustrating a comparison of silicalite-1 (MFI) platelet thickness measured from SEM images for control, tris(hydroxymethyl)aminomethane (THAM), triethylenetetramine (TETA), spermine, and D-arginine (D-Arg) syntheses. Binding of ZGMs to the {010} faces reduce growth normal to the basal surface of the hexagonal platelets, resulting in a reduction in thickness (e.g., spermine). The ZGMs bind to the sides of the platelet on the {100} or {x0z} surfaces and provides an increased platelet thickness (e.g., D-Arg). A systematic analysis of silicalite-1 crystals in the presence of ZGMs reveals that several compounds, such as D-arginine, increase platelet thickness in the [010] direction.

Figure 6:
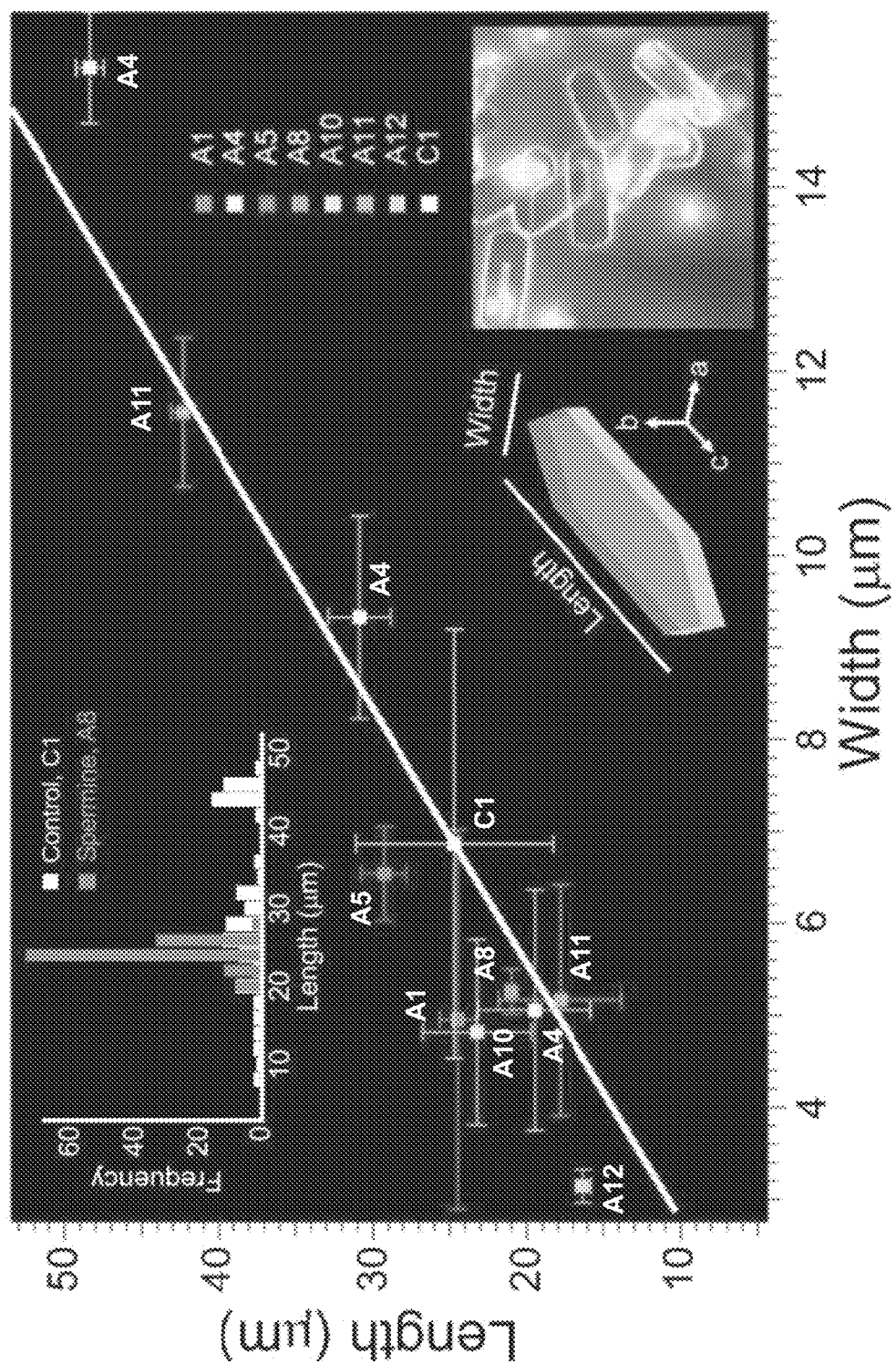
FIG. 6 is a graph illustrating plots of silicalite-1 (MFI) crystal length-to-width aspect ratio in the absence (control) and presence of a ZGM.

Another embodiment of the present invention discloses the use of ZGMs to create zeolites where crystals have defined length-to-width ratio on one or more of the crystallographic surface planes. More specifically, experiments using various ZGMs (FIG. 6) in the synthesis of MFI zeolites (silicalite-1) were compared to the control (as synthesized, in absence of ZGMs). The white line in FIG. 6 is a constant aspect ratio equal to the control. ZGMs that shift the aspect ratio to higher or lower values along this line equally influence crystal growth along the length and width of the basal plane. Deviations from this line above or below suggest a preferential binding of ZGMs to specific crystallographic surfaces, thus altering the net aspect ratio of the hexagonal crystal platelet.

FIG. 6 is a graph illustrating plots of silicalite-1 (MFI) crystal length-to-width aspect ratio. The control ($C_1$) is plotted with a white line to indicate constant aspect ratio. The presence of ZGMs can yield a reduction or increase in the length and/or width of the basal {010} surface. Binding of ZGMs to the faces of MFI crystals equally can result in a change in the growth such that the aspect ratio is fixed. Points that deviate from the solid line suggest that ZGMs exhibit a preferential binding to one or more surfaces, thereby influencing the anisotropic growth rates. In some examples, the ZGMs utilized in the methods include ethanolamine (A1), L-lysine (A4), poly-L-lysine (A5), spermine (A8), triethylenetetramine (A10), tris(hydroxymethyl)-aminomethane (A11), and 2-dimethylethanolamine (A12).

Another embodiment of the present invention discloses the use of ZGMs to create zeolites whose crystals exhibit certain types of morphology. More specifically, the addition of ZGMs to mordenite (MOR) crystals reveals more dramatic changes in crystal habit. The nominal shape of MOR crystals (that is when MOR crystals are grown in absence of ZGMs) are thin hexagonal platelets with the pores accessible on the basal surface of the platelet (see FIG. 1C). By contrast, the addition of ZGMs to MOR syntheses inhibits growth of the edges and elongates the crystal habit to generate long [001]-oriented needles (FIGS. 7A-7F). The shift in aspect ratio is substantial, which leads to a crystal structure with increased internal diffusion pathlength for sorbate molecules. Notably, tris(2-aminoethyl)amine had the most substantial impact on crystal habit, as illustrated in FIG. 7E.

FIGS. 7A-7F are scanning electron micrographs of MOR crystals for (FIG. 7A) control, (FIG. 7B) linear polyethyleneimine (PEIM), (FIG. 7C) DMEA, (FIG. 7D) tris(hydroxymethyl)aminomethane (THAM), and (FIGS. 7E-7F) tris(2-aminoethyl)amine syntheses. The nominal morphology of MOR crystals is that of flat platelets. Introduction of ZGMs in the zeolite synthesis results in a platelet-to-needle transition in crystal habit with a large change in aspect ratio. The methods provide a successful achievement in the design and formation of MOR crystals that have tailored external surface area of pores and internal diffusion pathlengths.

Another embodiment of the present invention discloses the use of ZGMs to create zeolites whose crystals have a significantly reduced number of defects. More specifically, the inclusion of ZGMs in silicalite-1 syntheses can reduce the presence of crystal defects on the (010) surface. Defects are generally present in most silicalite-1 syntheses and result in crystal twinning, as evidenced in scanning electron micrographs (FIG. 8A). Crystal growth in the presence of ZGMs, such as D-arginine, can significantly reduce the number of defects on the basal (010) face.

FIGS. 8A-8B are scanning electron micrographs of silicalite-1 (MFI) crystals for control (FIG. 8A) and D-arginine (FIG. 8B) syntheses reveal changes a reduction in crystal twinning in the presence of ZGMs. Crystals with twinned (010) surfaces are highlighted with circles. Silicalite-1 growth in the presence of D-arginine reduces the number of defect crystals by more than 65%.

Another embodiment of the present invention discloses the use of ZGMs to create zeolites whose crystal size distribution is significantly increased, leading to more homogeneous zeolites. More specifically, the inclusion of ZGM in silicalite-1 growth solutions shifts the particle size distribution from a highly polydisperse distribution in as synthesized (control) silicalite-1 to more uniform, relatively monodisperse population of crystals, as revealed for spermine in FIGS. 9A-9B and 10A-10C and for polyethyleneimine in FIGS. 11A-11D.

FIGS. 9A-9B are scanning electron micrographs of silicalite-1 (MFI) crystals for control (FIG. 9A) and spermine (FIG. 9B) syntheses reveal a narrower size distribution (e.g., less degree of polydispersity) in the presence of ZGMs. FIGS. 10A-10C are graphs that illustrate statistical analysis of optical microscopy images of silicalite-1 (MFI) crystals for control and spermine syntheses. The aspect ratio (length-to-width), length, and width histograms are shown for the measurement of ~100 individual crystals, revealing a narrower distribution in the presence of ZGM. FIGS. 11A-11D are graphs that illustrate size distributions for the length and width of silicalite-1 basal surfaces for syntheses with ZGMs, such as linear polyethyleneimine (PEIM) (FIGS. 11A-11B) and branched PEIM (FIGS. 11C-11D).

Another embodiment of the present invention discloses the use of ZGMs at various concentrations to create zeolites of varies crystals size, aspect ratio, and/or polydispersity. More specifically, the presence of ZGMs alters the size and size distribution of silicalite-1 crystals, as evidenced by optical micrographs (FIGS. 12A-12D). The size can be tailored by adjusting the concentration of ZGMs in the synthesis.

FIGS. 12A-12D are optical micrographs of silicalite-1 (MFI) crystals for (FIG. 12A) control, (FIG. 12B) diethanolamine, (FIG. 12C) D-arginine, and (FIG. 12O) spermine reveal changes in crystal size, aspect ratio, and polydispersity. FIGS. 13A-13B are scanning electron micrographs of silicalite-1 crystals synthesized in the presence of 1.5 g/L D-arginine (FIG. 13A) and synthesized in the presence of 0.12 g/L D-arginine (FIG. 13B). An increase in the concentration of ZGMs leads to dramatically smaller particles and a single distribution (relative to a trimodal distribution at lower concentration.

Figures 14A, 14B, 14C:
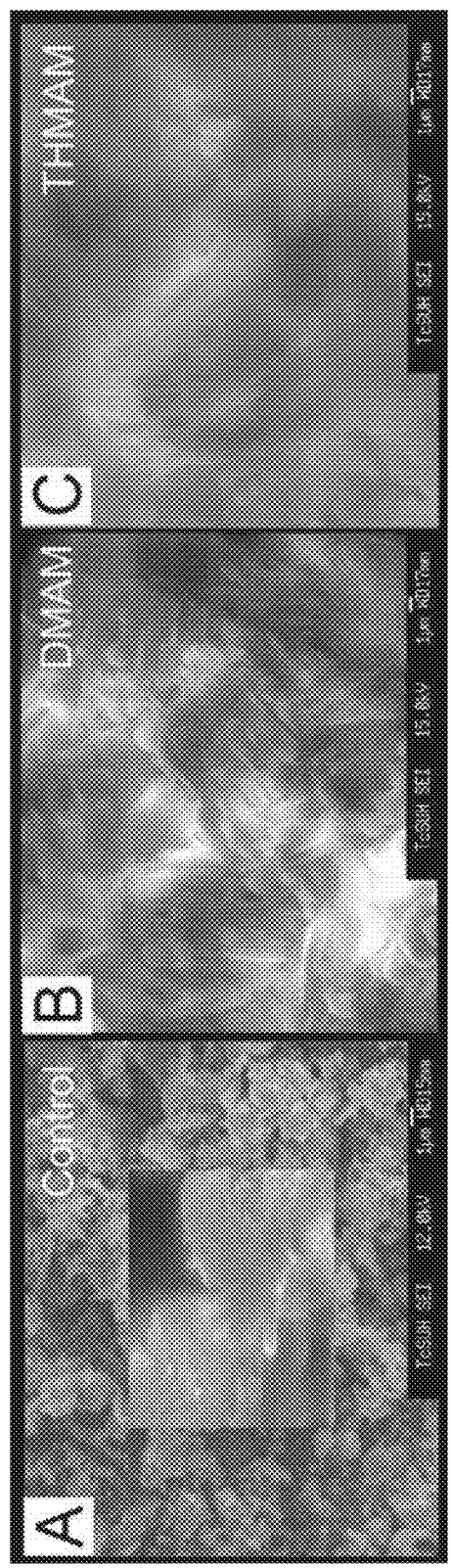
FIGS. 14A-14C are scanning electron micrographs of AEL crystals.

Another embodiment of the present invention discloses the use of ZGMs to change crystal habit. More specifically, studies with AEL reveal that ZGMs alter the crystal habit of the AEL structure (commonly referred to as SAPO-11), as shown in FIGS. 14A-14C, which validates that the growth inhibition method can be applied to silicoaluminophosphates. FIGS. 14A-14C are scanning electron micrographs of AEL crystals for the control (FIG. 14A), 2-dimethylethanolamine (DMAM) (FIG. 14B), and tris(hydroxymethyl) aminomethane (THAM) (FIG. 14C) syntheses reveal changes in crystal habit in the presence of ZGMs.

Another embodiment of the present invention discloses the use of ZGMs with phosphate groups (Group VII compounds). In one example, diethyl t-butylamidophosphate, diethyl ethylamidophosphate, o-phospho-DL-serine are three phosphates utilized as ZGMs to form zeolites. Inclusion of these ZGMs in the synthesis of silicalite-1 resulted in a reduction of crystal size and a shift in crystal habit and morphology (FIG. 15A-15D). In one example, diethyl t-butylamidophosphate provided the thickness of hexagonal platelets, resulting in length-to-thickness aspect ratios that exceed 20:1 (measured as the ratio of distances in the [001] and [010] directions). FIGS. 15A-15D are micrographs of silicalite-1 crystals grown in the presence of Group VII phosphate compounds. The inclusion of diethyl t-butylamidophosphate in the synthesis yields silicalite-1 crystals with reduced size, larger length-to-width ratio on the (010) surface, and dramatically reduced thickness in the [010] direction (e.g., sides of the hexagonal platelet), as illustrated by the micrographs in FIGS. 15A-15B. The inclusion of diethyl ethylamidophosphate yields small, silicalite-1 crystals, as illustrated by the micrograph in FIG. 15C. The inclusion of o-phospho-DL-serine likewise reduces the size of silicalite-1 crystals, as illustrated by the micrograph in FIG. 15D.

Figure 16B:
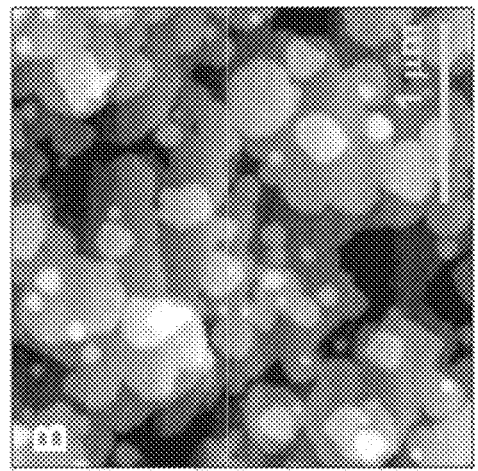
FIGS. 16A-16C are micrographs that illustrate the AFM height images.
Figure 16A:
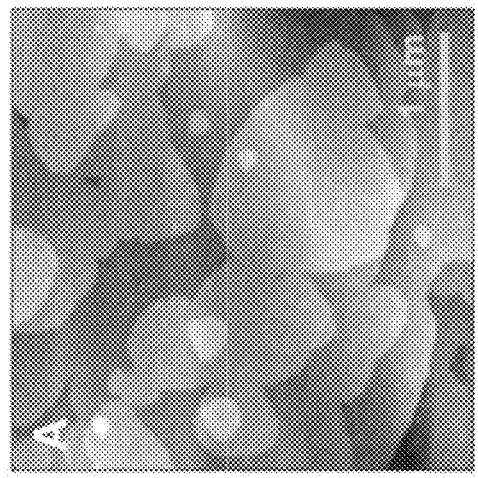
Figure 16C:
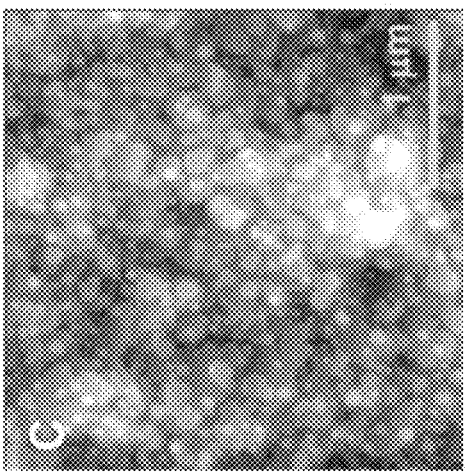
Figure 16D:
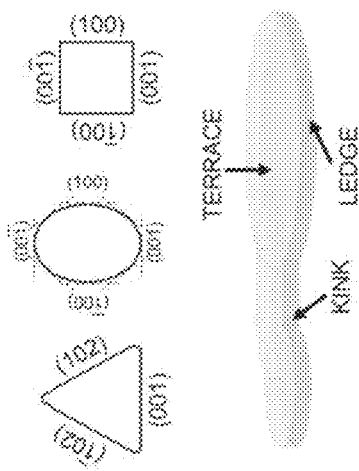
FIG. 16D is a depiction of MFI surface architecture, according to one embodiment.

Another embodiment of the present invention discloses the use of ZGMs to influence the size, density, and orientation of hillocks on crystal surfaces. More specifically, comparative surface characterization using atomic force microscopy (or AFM) of zeolites prepared in the absence and in the presence of ZGMs. More specifically, AFM measurements reveal that silicalite-1 surfaces are composed of 0.7-nm steps with different orientations. For instance, as synthesized silicalite-1 surfaces contain triangular hillocks; and in the presence of ZGMs the step density and shape are altered (FIGS. 16A-16C). Notably, there is a shift from triangular to circular hillocks and a six-fold increase in the step density on the basal (010) face. FIGS. 16A-16C are micrographs that illustrate the AFM height images in contact mode for the (FIG. 16A) control (in absence of ZGM), (FIG. 16B) 2-dimethylethanolamine (DMEA), and (FIG. 16C) tris(hydroxymethyl)aminomethane (THAM) samples. FIG. 16D depicts that the surfaces are composed of multiple sites for molecular binding, including kink, ledge, and terrace sites, which can influence the activity of zeolite catalysts. The presence of ZGMs influences the size, density, and orientation of hillocks. For instance, the triangular shape of hillocks can be changed to more spheroidal shapes of varying sizes.

Figure 17:
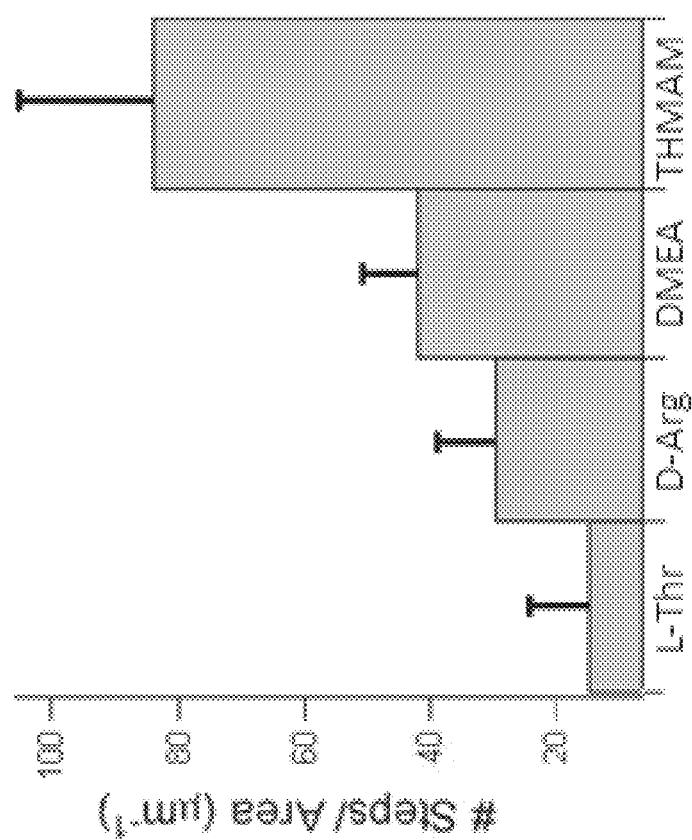
FIG. 17 is a graph that illustrates analysis of AFM topographical images of silicalite-1 crystal surfaces.

FIG. 17 is a graph that illustrates analysis of AFM topographical images of silicalite-1 crystal surfaces that were synthesized in the presence of L-threonine (L-Thr), D-arginine (D-arg), 2-dimethylethanolamine (DMEA), and tris(hydroxymethyl)-aminomethane (THAM). The number of steps was measured on multiple crystal surfaces. The y-axis is the average number of steps per 0.625 $\mu m^2$ area of the crystal surface measured for multiple crystals along systematically drawn "slices", or lines, spanning the entire area of AFM height images. Data are averages of multiple areas on a single crystal (totaling more than 100 measurements per sample). Error bars equal one standard deviation. These results reveal a six-fold difference in the number of steps, which can be tailored by the judicious selection of ZGMs.

Other AFM measurements reveal that circular hillocks on the (010) surface of silicalite-1 formed in the presence of a ZGM can be shifted to anisotropic triangular hillocks when the crystal surface is exposed to growth solution and allowed to crystallize in the absence of a ZGM. FIGS. 18A-18C are atomic force microscopy (AFM) images of a (010) surface during real time in situ growth in a supersaturated silica solution of molar composition 9TPAOH:20SiO$_2$:9500H$_2$O: 40EtOH. The crystals were prepared in the presence of 2-dimethylethanolamine (DMEA) and mounted on an AFM specimen disk. The time-elapsed images (left to right, FIGS. 18A-18C) were taken over a 10-hour period at 80° C. The hillocks grow over time and their shape changes from more spherical to triangular-like morphologies, which is in agreement with the shape of hillocks in control syntheses.

Another embodiment of the present invention discloses the use of ZGMs to tailor the chirality of zeolite crystal structures and the chirality of hillocks on the surfaces of zeolite crystals. Crystal structures of zeolites can be chiral, such as the MFI framework that has a mirror plane inversion along the b-axis at distances of about 0.7 nm. Triangular hillocks on the (010) surface flip their orientation by 180-degrees with each new layer, which mimics the mirror plane inversion. AFM measurements reveal growth by screw dislocations (FIGS. 19A-19D) where each new layer is oriented in the opposite direction (see FIG. 19B). In some examples, the ZGM (whether chiral or non-chiral) bind more favorably to one enantiomeric hillock (L or R step site) on the chiral surface, which could produce homochiral surfaces. There are some zeolite structures, such as beta (BEA), that exhibit polymorph layers (commonly labeled A and B for beta) in the crystal framework. In other examples, ZGMs are employed during the synthesis of chiral zeolites to produce pure polymorphs, such as pure A or B forms of beta. As such, another aspect of this invention is the use of ZGMs to tailor the chirality of zeolite crystal structures and the chirality of hillocks on the surfaces of zeolite crystals.

FIGS. 19A-19B depict that the surface growth of zeolite crystals can occur by either layer-by-layer or spiral dislocation mechanisms. FIG. 19C depicts that spiral dislocations on silicalite-1 crystal surfaces reveal alternating layers a 180° inversion of orientation commensurate with the mirror planes between pentasil layers along the b-axis. FIG. 19D depicts that the triangle-like shape of hillocks and growth terraces flip orientation with each layer, suggesting growth proceeds by the propagation of 0.7 nm steps across the surface of the crystal. The orientation of terraces with triangular morphology (angles measured at about 60°) can be overlayed on the crystallographic structure of the (010) face of MFI crystals. These results suggest that it may be possible to alter the chirality of zeolite surfaces (e.g., terraces and steps on the external surface) by impeding the growth of L- or R-enantiomeric layers. In some examples, the use of chiral ZGMs provides homochiral surfaces of the zeolites, which could be utilized for enantiospecific catalysis or separations.

Figure 20:
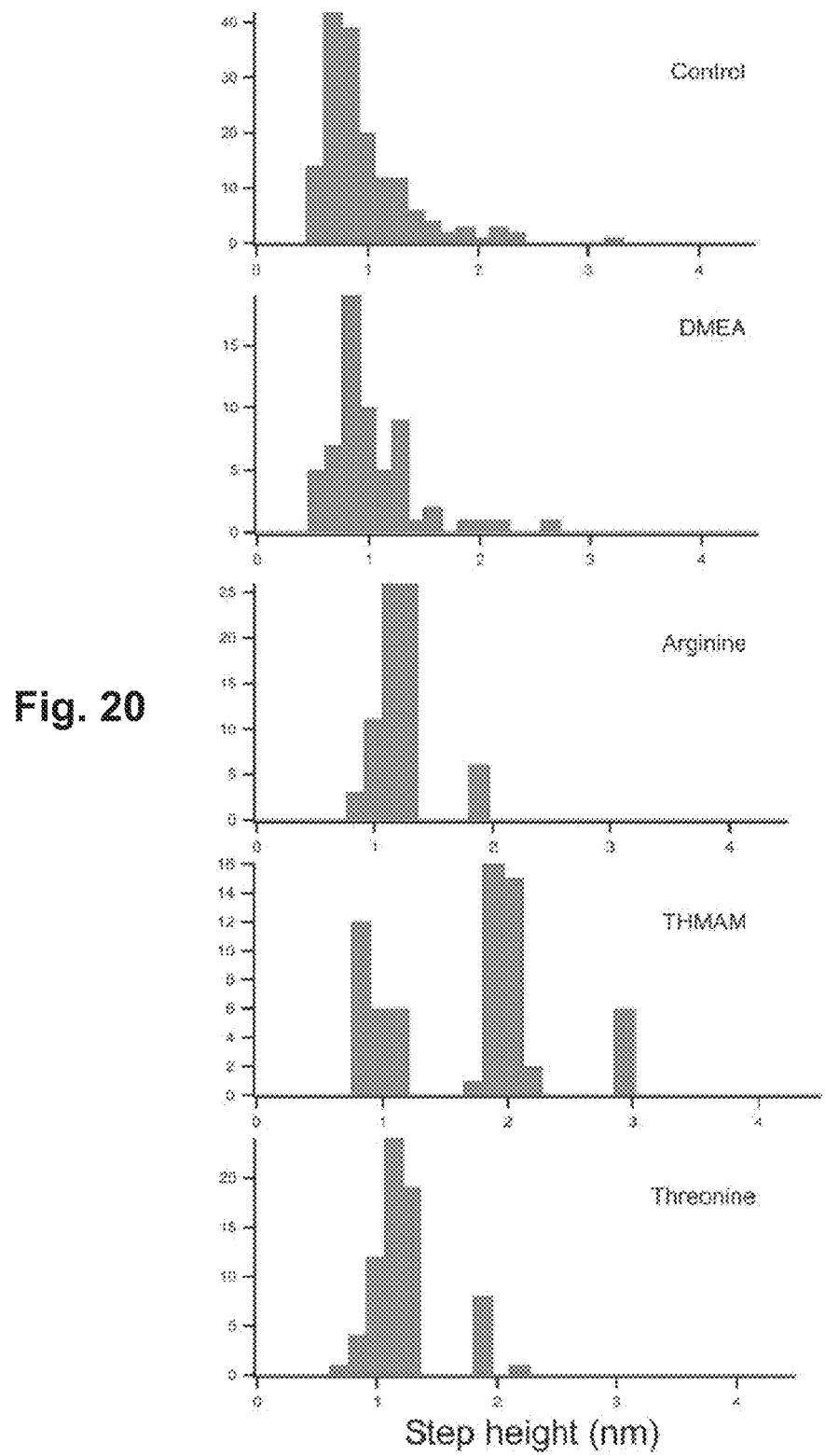
FIG. 20 provides charts that illustrate the step heights of terraces on silicalite-1.

Another embodiment of the present invention discloses the use of ZGMs to control the step bunching, and thus absolute step size, of the grown crystals. More specifically, AFM measurements reveal that ZGMs alter the step height distribution of hillocks on silicalite-1 surfaces (FIG. 20). The control (as synthesized) crystals have a nearly uniform distribution of 0.7-nm step heights on their surfaces corresponding to one layer of pentasil rings (see MFI structure along the b-axis in FIG. 19C). ZGMs examined in these experiments, such as THAM, can induce step bunching on the silicalite-1 surface. This, in turn, produces a broader step height distribution with distinct peaks that appear in multiples of 0.7 nm (FIG. 20).

FIG. 20 provides charts that illustrate the step heights of terraces on silicalite-1 (MFI) crystal surfaces for particles grown in the presence of various ZGMs. There is a uniform step height of 0.7 nm and step bunches with heights that are a multiple of a single step (1.4 nm, 2.1 nm, 2.8 nm). The data suggests that control crystal surfaces (e.g., without ZGM) exhibit terraces and hillocks with single steps whereas crystals grown in the presence of ZGMs exhibit larger fractions of step bunches.

Figure 21:
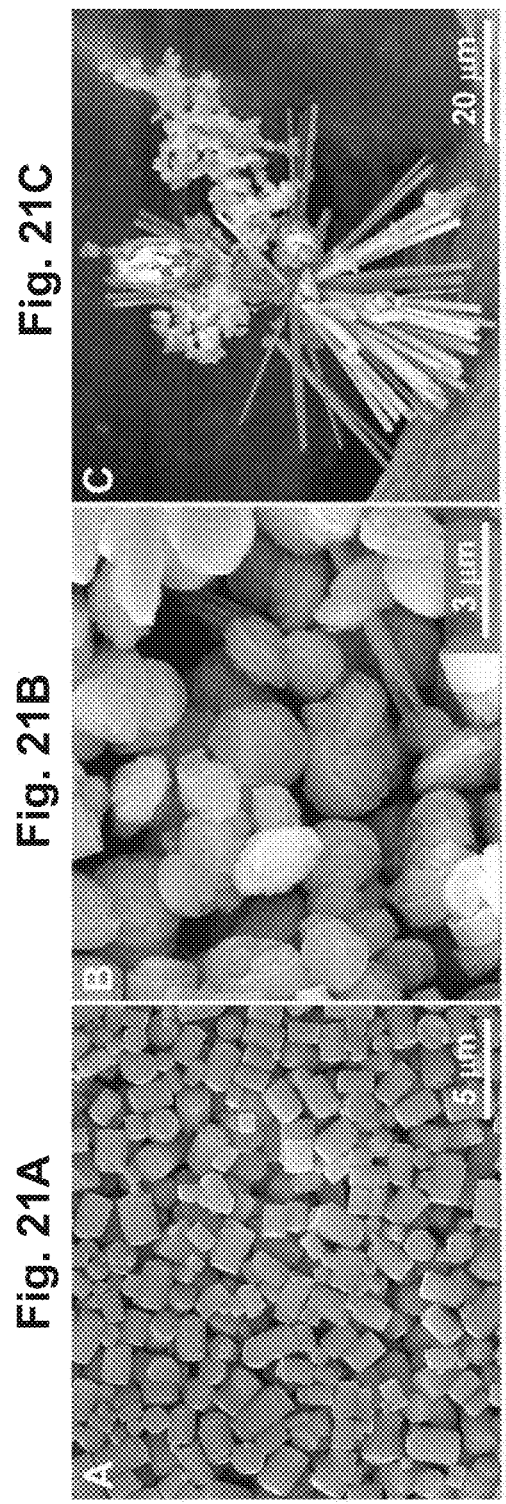
FIGS. 21A-21C are SEM images of LTL crystals.
Figure 22:
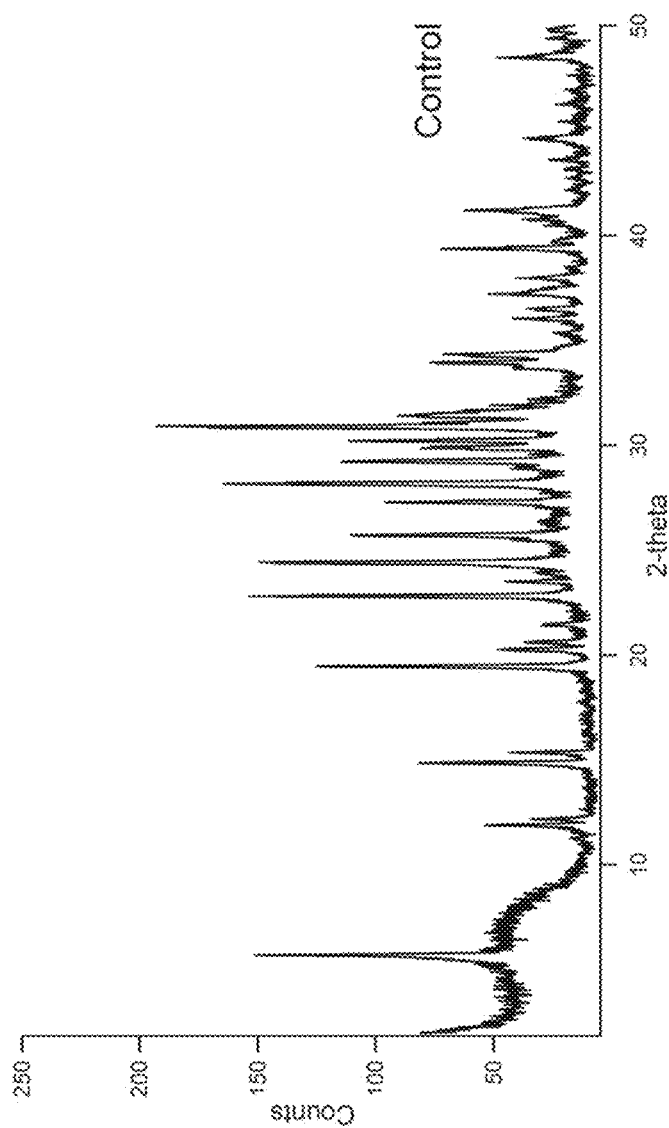
FIG. 22 is an X-ray powder diffraction pattern of LTL crystal.

In another embodiment described herein, the crystal habit may be adjusted by utilizing different ZGMs, such that the aspect ratio may be increased or decreased by utilizing two different ZGMs, but with all other variables held constant. FIGS. 21A-21C are SEM images of LTL crystals. The control crystals have cylindrical morphology (FIG. 21A). In one experiment, the synthesis mixture containing about 3 wt % of 3-amino-1 propanol as the ZGM reduced the aspect ratio to form thinner platelets (FIG. 21B). In another experiment, the synthesis mixture containing about 3 wt % of THAM as the ZGM increased the aspect ratio to form high aspect ratio needles (FIG. 21C). FIG. 22 is an X-ray powder diffraction pattern of LTL crystals grown in the absence of ZGMs.

Another embodiment of the present invention discloses the use of ZGMs to produce hierarchical zeolite structures, which include (but are not limited to) the formation zeolite aggregates or polycrystalline zeolite materials, such as films, prepared by the suspension of zeolite crystals (seeds) in a growth solution containing one or more ZGM compounds of Table 1. The method also applies to the use of ZGMs for zeolite synthesis within templates, such as surfactants, porous carbons, or polymers.

Another embodiment of the present invention discloses the use of the synthesized zeolites as catalysts or enantiospecific catalysts.

Another embodiment of the present invention discloses the use of the synthesized zeolites as a means to separate each enantiomer in an enantiomeric mixture for pharmaceutical and biological purposes.

Another embodiment of the present invention discloses the use of ZGMs to alter the surface area of zeolites for purposes of enhancing the molecular adsorption capacity or selectivity, ion exchange efficiency, or catalytic activity or selectivity of the material.

Another embodiment of the present invention discloses the use of ZGMs to alter the internal diffusion pathlength of a zeolite, which is the end-to-end length of a continuous pore channel from one external surface of a zeolite crystal to another external surface.

Another embodiment of the present invention discloses the use of ZGMs to alter the number and spatial ordering of aluminum and phosphate groups in the crystal framework.

In other examples, the upper and lower surfaces of the crystalline zeolite material or the side surfaces of the crystalline zeolite material contain stepped layers or hillocks having active growth sites. The active growth sites are generally on the steps, kinks, and/or terrace sites of the crystalline zeolite material. In some examples, the stepped layers or hillocks have triangular geometry or rectangular geometry. In other examples, the stepped layers or hillocks have rounded geometry or elliptical geometry. Generally, each of the upper surface, the lower surface, and the side surfaces of the crystalline zeolite material independently has a step density of about 25 steps/$\mu m^2$ or greater, such as about 40 steps/$\mu m^2$ or greater, such as about 80 steps/$\mu m^2$ or greater, such as about 150 steps/$\mu m^2$ or greater, such as about 200 steps/$\mu m^2$ or greater.

Step density is the statistical average of steps per area of a crystal surface. Each step contains a terrace and a ledge, such that the terrace extends parallel or substantially parallel to the crystal surface and the ledge extends perpendicular or substantially perpendicular to the terrace and the crystal surface. Also, each step may be a single, independent step or may be step bunches that are multiples of a single step.

In one example, a composition of a zeolite contains a crystalline zeolite material having a single crystal structure, an upper surface of the crystalline zeolite material extending substantially parallel to a lower surface of the crystalline zeolite material, wherein the upper surface has a step density of about 25 steps/$\mu m^2$ or greater, a length of the upper surface within a range from about 10 nm to about 50 $\mu m$, a width of the upper surface within a range from about 10 nm to about 50 $\mu m$, and a plurality of side surfaces extending between the upper and lower surfaces.

In another embodiment of a method for forming a zeolite material, the method includes combining at least one framework source precursor, an SDA, an optional mineralizing agent, and a solvent to form a plurality of zeolite seed crystals in a first zeolite suspension during a synthesis process, wherein each of the zeolite seed crystals has a single crystalline structure and a first crystal habit. The method further includes combining a ZGM and the plurality of zeolite seed crystals to form a plurality of zeolite crystals in a second zeolite suspension during a growth process, wherein each of the zeolite crystals has the single crystalline structure and a second crystal habit different than the first crystal habit. The method includes maintaining the second zeolite suspension at a predetermined temperature for a predetermined time during the growth step.

In some examples, the method includes growing the zeolite crystals from the zeolite seed crystals at a faster rate in a two-dimension plane than in a third dimension perpendicular to the two-dimension plane during the growth process. Generally, the ZGM is maintained at a concentration within the second zeolite suspension to enable the faster growth rate in the two-dimension plane than in the third dimension. In some examples, the concentration of the ZGM is within a range from about 0.05 wt % to about 5 wt % of the second zeolite suspension, more narrowly within a range from about 0.1 wt % to about 3 wt % of the second zeolite suspension. In other examples, the concentration of the ZGM is within a range from about 5 wt % to about 50 wt % of the second zeolite suspension, more narrowly within a range from about 20 wt % to about 40 wt % of the second zeolite suspension.

In some examples, the second crystal habit of each of the zeolite crystals contains an upper surface of the zeolite crystal extending substantially parallel to a lower surface of the zeolite crystal, a length of the upper surface within a range from about 10 nm to about 50 µm, a width of the upper surface within a range from about 10 nm to about 50 µm, a plurality of side surfaces extending between the upper and lower surfaces, a thickness of the zeolite crystal measured between the upper and lower surfaces and extending substantially perpendicular to the upper and lower surfaces, an aspect ratio of about 4 or greater, wherein the aspect ratio is determined as a sum of one half of the length and one half of the width of the upper surface relative to the thickness of the zeolite crystal, and a plurality of vertical channels extending between the upper and lower surfaces, wherein each vertical channel independently has an exclusive diffusion pathway extending from an opening on the upper surface, through the zeolite crystal, and to an opening on the lower surface. In many examples, the aspect ratio is about 6 or greater, such as about 50 or greater or such as within a range from about 10 to about 100.

In some examples, the second crystal habit of each of the zeolite crystals contains an upper surface of the crystalline zeolite material extending substantially parallel to a lower surface of the crystalline zeolite material, wherein the upper surface has a step density of about 25 steps/µm$^2$ or greater, a length of the upper surface within a range from about 10 nm to about 50 µm, a width of the upper surface within a range from about 10 nm to about 50 µm, and a plurality of side surfaces extending between the upper and lower surfaces. The upper, lower, and side surfaces may each independently have a step density of about 40 steps/µm$^2$ or greater, such as about 80 steps/µm$^2$ or greater.

Atomic force microscopy (AFM) was utilized to examine the interaction of ZGM functional groups with silicalite-1 crystals. AFM adhesion force between Au-coated AFM tips modified with a layer of organothiols and the silicalite-1 (010) surface. The thiol terminal groups mimic ZGM moieties. A solution having a pH value of about 12 was used for —OH and —CH$_3$ tips, and pH value of about 11 (—N$_2$H$_4^+$) and pH value of about 13 (—N$_2$H$_3$) were used for amidinium tips. Each force is an average from 8000 pull-off curves on multiple crystals (error bars equal one standard deviation).

AFM has proven useful for probing ligand-receptor interactions in biological systems through the measurement of the unbinding force (or adhesion force, $F_A$) of tips modified with proteins or peptides. AFM force spectroscopy measures changes in the deflection, $\Delta z$, of a cantilever with an appropriately modified tip as it is retracted from a contacting surface, thereby producing a "pull-off" curve with $F_A \alpha \Delta Z$.

This technique was used to identify strong ZGM binding moieties to help guide the design of ZGMs. Notably, modified AFM tips that mimic silaffin functional groups, such as cationic amines, hydroxyl groups, and hydrophobic residues were tested. Measurements were performed in alkaline solution to examine the adhesion force between negatively-charged (010) surfaces (e.g., SiOH pKa<11) and functionalized AFM tips (see supporting information for details). A trend of increasing $F_A$ was observed for different tip functional groups: amidine or amine (neutral charge) <methyl≈alcohol<amidinium (positive charge). Alcohol groups can form H-bonds with surface silanols, while methyl groups can bury into vacancies on the crystal surface to remove entropically unfavorable solvent layers. AFM tips modified with amidinium groups (pKa of about 12.1) exhibit neutral or positive charge depending on the pH. Tips with positively-charged amidinium groups exhibit a 6-fold increase in $F_A$ relative to neutral tips.

The influence of ZGMs on silicalite-1 growth was assessed by bulk crystallization studies. Additives were introduced to synthesis solutions prior to hydrothermal treatment using tetraethylorthosilicate (TEOS) as the silica source and tetrapropylammonium (TPA+) as the SDA. In one example, the ZGM was spermine ($C_{10}H_{26}N_4$), which is an exact mimic of an amine segment of long-chain polyamines found in diatom cells (FIG. 2).

Figure 23:
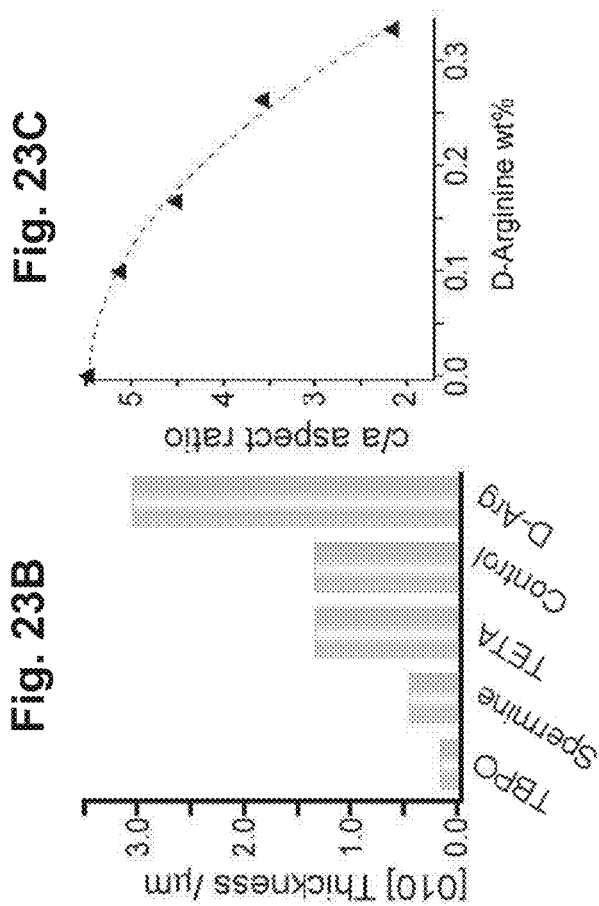
FIG. 23A is an SEM image of silicalite-1 crystals having tailored crystal habits.
FIGS. 23B-23C are graphs that illustrate a comparison of thickness and aspect ratios of silicalite-1 crystals.

In other experiments, the silicalite-1 crystal habit was tailored under the influence of ZGMs. FIG. 23A is an SEM image of silicalite-1 crystals synthesized with D-Arg increase the thickness. FIGS. 23B-23C are graphs that illustrate a comparison of thickness and aspect ratios of silicalite-1 crystals synthesized in the presence of ZGMs. FIG. 23B is a comparison graph of crystalline thicknesses that illustrates how ZGMs selectively tailor the thickness of hexagonal platelets along the b-axis (e.g., diffusion length in less tortuous [010] channels). FIG. 23C is a comparison graph of aspect ratios for the formed silicalite-1 crystals. The D-Arg preferentially binds to (101) faces, causing a monotonic reduction in the c/a aspect ratio of basal (010) faces with increasing D-Arg wt %.

Spermine reduces the thickness of MFI platelets by a factor of 4, consistent with a preferential binding of spermine to basal (010) faces, which reduces the rate of growth along the b-axis. In another example, the ZGM was triethylenetetramine (TETA, $C_6H_{18}N_4$), which has a structure that is similar to spermine, but with fewer carbonyl groups. In some examples, TETA was much less effective at inhibiting silicalite-1 [010] growth (FIG. 23B), which emphasizes how subtle changes in molecular structure impact ZGM efficacy.

Figure 24:
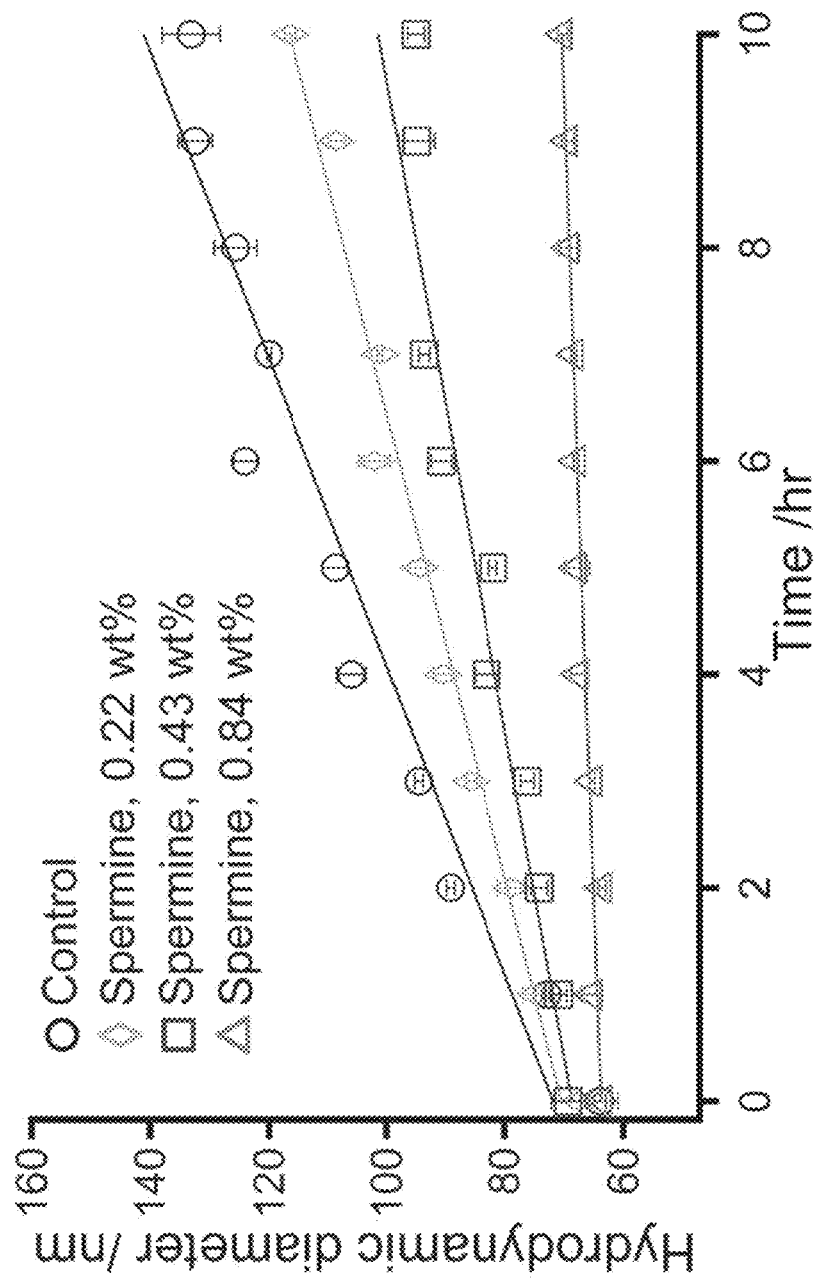
FIG. 24 is a graph that illustrates DLS seeded growth experiments.

Dynamic light scattering (DLS) was utilized to measure temporal changes in the hydrodynamic diameter of silicalite-1 crystals in the presence of spermine. FIG. 24 is a graph that illustrates DLS seeded growth experiments measuring the temporal change in the hydrodynamic diameter of silicalite-1 seeds suspended in a silica growth solution at about 85° C. The growth rate (slope) decreases linearly with increasing spermine concentration. Experimental data (symbols) are an average of 4 measurements and error bars equal two standard deviations. Lines are linear regression.

Figure 25A:
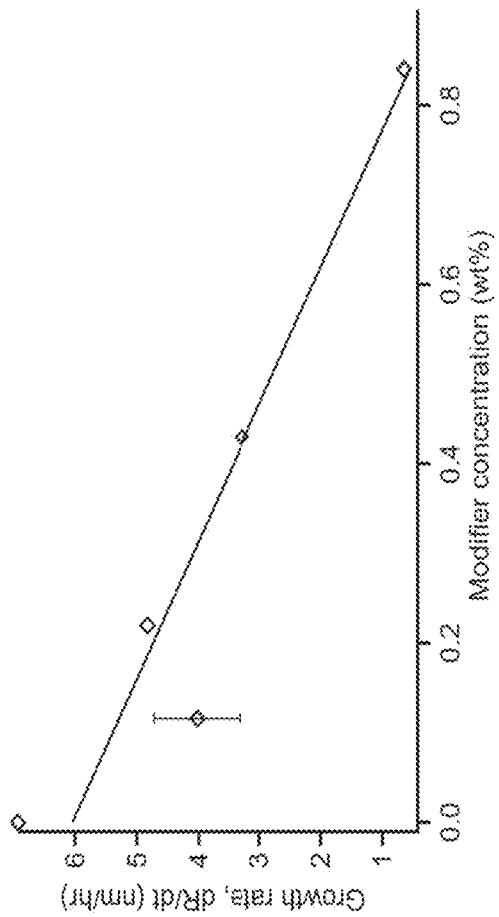
FIGS. 25A-25B are graphs illustrating DLS studies of crystal growth rate.

FIG. 25A is a graph illustrating DLS studies that reveal the rate of crystal growth decreases linearly with spermine concentration. Moreover, spermine produced a narrower particle size distribution and fewer surface defects (crystal twinning) compared to the control. In several experiments, select ZGMs were tested in silicalite-1 growth studies to assess the efficacy and specificity of each ZGM, which included dipropylamine, PEIM, PEIM b, spermine, TETA, T2TETA, DMEA, EDTAA, THAM, D-Arg, poly-L-lysine, L-threonine, TBPO, and tris(2-carbamoylethyl)phosphine oxide. The compounds selected as ZGMs were selected with functional groups similar to silica proteins. Silicalite-1 hexagonal platelet length, c-axis, and width, a-axis, were measured by optical microscopy. Analyses revealed that ZGMs preferentially bind to the (100) and (x0z) surfaces to increase or decrease the c/a aspect ratio, respectively. A systematic study of the dihedral angles in scanning electron micrographs reveals that the (x0z) index varies with synthesis conditions. ZGMs direct the formation of new facets, including the (101) face and a non-indexed face (FIG. 23A, arrow) that is unique to syntheses with the amino acid D-arginine (D-Arg). The latter is a potent inhibitor of the [101] growth rate, as evidenced by the monotonic decrease in c/a aspect ratio with increasing D-Arg concentration (FIG. 23C), wherein a 2.5-fold reduction in aspect ratio is achieved with less than 0.3 wt % D-Arg.

In some experiments, ZGM-crystal interactions yielded a constant c/a aspect ratio with a- and c-dimensions that are either smaller or larger than the control. For example, silica supersaturation was fixed for all syntheses, an increase in silicalite-1 platelet size suggests ZGMs influence crystal number density (e.g., nucleation). In other examples, ZGMs were utilized that have high efficiency for controlling the silicalite-1 [010]thickness. In one example, a ZGM with high efficacy was tributylphosphine oxide (TBPO), which produced micron-sized platelets in the ac-plane with a thickness less than 150 nm in the b-axis. In another example, spermine is an efficient ZGM and yielded slightly thicker platelets than TBPO. In another example, D-Arg used as the ZGM had an opposite effect, leading to a marked increase in platelet thickness (FIG. 23B) and reduction in platelet length (c-axis). Collectively, bulk crystallization studies reveal that ZGM(s) with molecular recognition for specific crystal surfaces can tune anisotropic growth rates to achieve 3-dimensional control of silicalite-1 crystal shape.

FIGS. 16A-16C and 26 are images of silicalite-1 crystals formed by several methods described herein. The AFM height images of silicalite-1 (010) surfaces for the (FIG. 16A) control (no additive) and those synthesized with the following ZGMs: (FIG. 16B) TBPO, (FIG. 16C) THAM, and (FIG. 26A) D-Arg. FIG. 26C is a chart that illustrates a comparison of the (010) step density for different ZGMs (error bars=1 standard deviation). FIG. 26B is a chart that illustrates height cross-section of the image in FIG. 26A (line) and reveals step bunches (single step=about 0.7 nm).

A systematic analysis of silicalite-1 crystals by AFM provides microscopic validation of the phenomena observed in the bulk crystallization studies. AFM images of silicalite-1 (010) surfaces reveal hillocks with a 0.7-nm step height, which corresponds to the dimension of a pentasil chain (a structural subunit of MFI). Images of silicalite-1 control surfaces reveal triangular hillocks with a step density (p) is about 30 steps/µm² or greater (FIG. 16A). ZGMs that preferentially bind to (010) surfaces block the attachment of growth units, thus reducing the rate of hillock nucleation and decreasing step density. Reductions in step density of 2-fold and 4-fold were observed on silicalite-1 crystals grown in the presence of spermine and TBPO, respectively. Therefore, TBPO is the more potent inhibitor of growth along the [010] direction compared to spermine.

A comparison of D-Arg and THAM modifiers reveals that their effect on step density is determined not only by ZGM specificity, but also its binding strength to silicalite-1 surfaces. The effect of THAM on silicalite-1 growth is much less pronounced than D-Arg, which can be attributed to weaker THAM-crystal binding as well as the competitive adsorption between ZGM and TPA$^+$ (e.g., SDA) on silicalite-1 surfaces. Growth solutions containing about 0.2 wt % ZGM also contain about 15 moles of TPA$^+$ for every one mole of ZGM. If the strength of ZGM binding to silicalite-1 surfaces is weaker or comparable to that of TPA$^+$, the latter will have a higher surface coverage. As the free concentration of TPA$^+$ in solution decreases with synthesis time (due to SDA occlusion in MFI pores), ZGM coverage on silicalite-1 surfaces will increase. Likewise, silica supersaturation decreases with synthesis time. Collectively, both effects reduce the rate of step advancement; and if step growth is slow relative to nucleation, fewer step bunches and higher step density are observed (FIG. 16C). The lack of step bunching is consistent with classical models of crystal growth, which invoke the power-law dependence R α σ$^n$ for the rate of step growth, R, and the solute (silica) supersaturation, σ. As the silicalite-1 synthesis approaches equilibrium (σ is about 1), hillocks on (010) terraces do not grow fast enough to generate step bunches. In another experiment, the concentration of THAM in silicalite-1 syntheses was increased to 3.7 wt % (2 TPA$^+$:1 THAM) and observed an appreciable increase in platelet thickness and step bunching (e.g., reduced p). This suggests THAM has a higher coverage on silicalite-1 surfaces at earlier times in the synthesis (when σ>>1).

The ZGMs described herein have been used to selectively control the anisotropic growth rates of silicalite-1 crystallization. Through the judicious selection of ZGMs with molecular recognition for specific crystal faces, this method offers versatility in using a single ZGM or mixture of ZGMs (acting cooperatively) to control of crystal habit in 3-dimensions. Among the ZGMs tested, spermine and TBPO were the most effective for reducing the [010] thickness. Notably, TBPO reduced the internal diffusion pathlength along less tortuous b-channels by an order of magnitude (while still maintaining a large (010) basal surface area within a range from about 10 µm² to about 50 µm²), thereby dramatically improving the mass transport properties of silicalite-1 crystals. ZGMs offer a facile and cost efficient method to control the crystal habit of zeolites wherein molecules can be designed with steric bulk to prevent their occlusion in zeolite pores, which permits recycling. Indeed, elemental analysis of silicalite-1 with about 4.7 wt % TBPO reveals the amount of ZGM in extracted solid crystals is negligible. The framework structures of zeolites, such as mordenite, reveal that crystal habit can be altered in the presence of ZGMs.

Experimental Section

Silicalite-1 was prepared from a clear solution of molar composition 40TEOS:40TPAOH:9420H$_2$O:160EtOH where ZGMs were added to solutions prior to heating (about 160° C. for about 65 hrs). DLS measurements were performed on a Brookhaven Instruments BI-200SM using seeded growth solutions of molar composition 8 TEOS: 7 TPAOH: 9500 H$_2$O: 32 EtOH. AFM studies were performed on an Asylum Research SA-MFP-30. Adhesion force measurements employed AFM tips (Olympus, Au-coated) functionalized with organo-thiols. A detailed description of the experimental methods is provided in the online supporting information.

The following reagents were used for zeolite syntheses: tetraethylorthosilicate (TEOS, 98%), LUDOX® AS-40 colloidal silica (40 wt % suspension in water), sodium hydroxide (>97%), potassium hydroxide (85% pellets), piperidine (>99.5%), methanol (>99.8%), tetrapropylammonium hydroxide (TPAOH, 40%), silicon (IV) oxide (15% in H$_2$O, colloidal dispersion), aluminum sulfate hydrate (98%), aluminum nitrate (9 hydrate crystal), and aluminum isopropoxide (98%).

The following reagents were used as ZGMs in zeolite syntheses: 2-dimethylaminoethanol purum (≥98.0% (GC)), dipropylamine (99%), ethylenediamine (98%), polyethylenimine ($MW_{avg}$ 1300), polyethylenimine branched ($MW_{avg}$ 25000), spermine (≥97%), triethylenetetramine hydrate (98%), tris(2-aminoethyl) amine (96%), ethylenediaminetetraacetic acid (99.4-100.06% ACS reagent), tris(hydroxymethyl) aminomethane (99.8%, A.C.S. reagent), D-arginine (98% (TLC)), L-lysine (97%), poly-L-lysine hydrobromide (0.5-2.0 kDa), L-threonine (98% reagent grade), poly-L-threonine (5 to 15 kDa), tributylphosphine oxide (95%), diethanolamine (98%), polyvinyl alcohol ($MW_{avg}$ 112000, 98.5%), 3-amino-1-propanol (99%), hexamethylenediamine (98%), tert-butylamine (98%), tetramethylethylenediamine (98%), diethyl t-butylamidophosphate, o-phospho-DL-serine (98%), dopamine hydrochloride, diethyl ethylamidophosphate, methylaminoethanol (98%), and N,N-dimethylbutylamine (99%).

The following reagents were used for AFM tip functionalization: 1-pentanethiol (98%), mercaptoethylguanidine hemisulfate salt (98%), (3-aminopropyl)triethoxysilane (99%), 4-mercapto-1-butanol (98%), triethoxypentylsilane, and anhydrous toluene.

Deionized water was purified with an Aqua Solutions ROD1-C-12A purification system (18.2 MΩ). All aforementioned reagents were used without further purification.

Characterization

Silicalite-1 samples were characterized by powder X-Ray diffraction (XRD), inductively-coupled plasma atomic emission spectroscopy (ICP-AES), dynamic light scattering (DLS), atomic force microscopy (AFM), scanning electron microscopy (SEM), and optical microscopy. XRD patterns were collected on a Siemens D5000 X-ray diffractometer using CuKα radiation (40 kV, 30 mA). DLS measurements were conducted using a Brookhaven Instruments BI-200SM machine equipped with a TurboCorr Digital Correlator and a red HeNe laser diode (35 mW, 637 nm). AFM analysis was performed on a MFP-3D-SA instrument (Asylum Research, Santa Barbara, Calif.). Contact mode images were obtained with 256 scans/line at an average scan velocity of 1.4 μm/s using Olympus AC240TS (2 N/m) probes. AFM force measurements were obtained with Olympus RC800PB (Au coated, 0.06 N/m) and RC800PSA ($Si_3N_4$, 0.05 N/m) probes. SEM microscopy was conducted using a Nova NanoSEM 230 instrument with ultra-high resolution FESEM (operated at about 15 kV and about 5 mm working distance). A Leica DM 2500M instrument was used for optical microscopy.

The crystal framework structure of AEL (SAPO-11) has the space group Imma (a=0.83 nm, b=1.87 nm, c=1.34 nm, α=β=γ=90°) with a volume of 2.08 $nm^3$ and a 1-D pore network of 10-MR channels. Crystallization was performed by adding phosphoric acid (1.83 g, 18.28 mmol) and aluminum isopropoxide (3.81 g, 18.28 mmol) to deionized water (8.77 g, 0.487 mol). After stirring for about 1 hour, LUDOX® AS-40 colloidal silica (0.824 g, 5.48 mmol) was added and the solution was stirred for an additional hour prior to the addition of dipropylamine (0.841 g, 8.23 mmol). The homogeneous mixture was transferred to a Teflon liner, which was capped and placed in a stainless steel autoclave. The autoclave was placed in an oven at about 195° C. for about 48 hours. The autoclave was cooled to about 25° C. in a water bath for about 1 hour following synthesis.

The crystal framework structure of mordenite (MOR) has the space group Cmcm (a=1.83 nm, b=2.05 nm, c=0.75 nm, α=β=γ=90°) with a volume of 2.83 nm3 and a 1-D pore network of 12-MR channels. Crystallization was performed by the addition of sodium hydroxide (0.550 g, 13.49 mmol) and piperidine (0.448 g, 5.24 mmol) to silicon dioxide (9.45 g, 23.6 mmol). After stirring for 20 minutes, aluminum sulfate hydrate (0.0824 g, 0.24 mmol) and deionized water (2.58 g, 0.143 mol) were added. The solution was stirred overnight (about 8 hours). The homogeneous mixture was transferred to a Teflon liner, which was capped and placed in a stainless steel autoclave. The autoclave was placed in an oven at about 160° C. for about 120 hours. The autoclave was cooled to about 25° C. in a water bath for about 1 hour following synthesis.

The crystal framework structure of LTL has the P6/mmm space group (a=1.81 nm, b=1.81 nm, c=0.76 nm; α=β=90°, γ=120°) with a volume of 2.49 $nm^3$ and a 1-D pore network of 12-MR channels. The zeolite LTL was synthesized from a milky white solution containing a molar composition of $1.0Al_2O_3:20SiO2:10.2K_2O:1030H_2O$). KOH was dissolved in water, followed by addition of aluminum sulfate hydrate and LUDOX® AS-40 colloidal silica, and stirred overnight (about 8 hours). The growth ZGM of choice was added (in various molar ratios) to about 10 g of growth solution (described above), to yield a mixture with an average pH value of about 14.4. The solution was placed in a Teflon-lined stainless steel acid digestion bomb and heated at autogenous pressure in an oven (ThermoFisher Precision Premium 3050 Series gravity oven) without mixing for 3 days at about 180° C., yielding micron-sized crystals, which were washed and isolated by vacuum filtration (0.4 μm membrane). Samples were dried overnight in fume hood prior to characterization.

The crystal framework structure of ferrierite (FER) has the space group Immm (a=1.90 nm, b=1.43 nm, c=0.75 nm, α=β=γ=90°) with a volume of 2.05 $nm^3$ and a 2-D pore network of 8-MR and 10-MR channels. Crystallization was performed by the addition of sodium hydroxide (0.550 g, 13.49 mmol) and piperidine (0.448 g, 5.24 mmol) to silicon dioxide (9.45 g, 23.6 mmol). After stirring for 20 minutes, aluminum sulfate hydrate (0.0824 g, 0.24 mmol) and deionized water (2.58 g, 0.143 mol) were added. The solution was stirred overnight (about 8 hours). The homogeneous mixture was transferred to a Teflon liner, which was capped and placed in a stainless steel autoclave. The autoclave was placed in an oven at about 160° C. for about 120 hours. The autoclave was cooled to about 25° C. in a water bath for about 1 hour following synthesis.

The crystal structure of the all-silica form of MFI (silicalite-1) has the space group Pnma (a=2.01 nm, b=1.97 nm, c=1.31 nm, α=β=γ=90°) with a volume of 5.21 $nm^3$ and a 3-D pore network of 10-MR channels. Crystallization was performed by adding TPAOH (2.16 g, 4.25 mmol) to deionized water (16.85 g, 0.935 mol). TEOS (0.903 g, 4.25 mmol) was added dropwise, and the solution was stirred for about 2 hours at room temperature (about 25° C.). The homogeneous mixture was transferred to a Teflon liner, which was capped and placed in a stainless steel autoclave. The autoclave was placed in an oven at about 160° C. for about 65 hours. The autoclave was cooled to about 25° C. in water bath for about 1 hour following synthesis.

Silicalite-1 Crystallization.

Silicalite-1 hexagonal platelets were synthesized from clear solutions containing a molar ratio of $40SiO_2$:$40TPAOH$:$9420H_2O$:$160EtOH$, with tetrapropylammonium ($TPA^+$) as the structure-directing agent. TPAOH was added to deionized water followed by drop-wise addition of TEOS. The mixture was stirred at room temperature (about 25° C.) for about 2 hours. The ZGM of choice was added (in various weight percent) to about 10 g of growth solution (described above), to yield a mixture with an average pH value of about 12.7. The solution was placed in a Teflon-lined stainless steel acid digestion bomb and heated at autogenous pressure in an oven (ThermoFisher Precision Premium 3050 Series gravity oven) without mixing at about 160° C. Heating for 65 hours produced micron-sized crystals that were filtered (1-μm Whatman Nuclepore Track-Etch membrane), washed 3 times with deionized water, and dried in air. Crystals synthesized by this procedure in the absence of ZGM are referred to as the control. All samples for microscopy studies (SEM, AFM, optical) were prepared from isolated crystals on 1-μm membranes. In one example, a synthesis mixture for silicalite-1 contained a molar concentration of $165SiO_2$:$40TPAOH$:$9170H_2O$:$660EtOH$.

Synthesis of Silicalite-1 Seeds and Growth Solution for DLS Studies.

Silicalite-1 crystal "seeds" used for DLS studies were synthesized from a clear solution containing a molar composition $25SiO_2$:$9TPAOH$:$360H_2O$:$100EtOH$. The TPAOH was added to deionized water followed by drop-wise addition of TEOS. The mixture was aged at room temperature (about 25° C.) for about 2 hours, then placed in a Teflon-lined stainless steel acid digestion bomb and heated at about 60° C. for 2 weeks. The solution containing silicalite-1 spheroidal crystals—having an average particle size of about 60 nm—was centrifuged at about 12,000 rpm for about 2 hours (using a SORVALL® RC-5B Refrigerated Superspeed Centrifuge). The crystals were washed with deionized water and centrifuged 3 additional times (under the same conditions) and re-dispersed in deionized water to produce a 1.0 wt % suspension, which served as the seed stock solution for all DLS experiments. Prior to DLS measurement, the stock solution was sonicated for about 5 minutes to break apart any potential aggregates.

The growth solutions for DLS measurements had a molar ratio of $8SiO_2$:$7TPAOH$:$9500H_2O$:$32EtOH$, which was prepared by the same procedure as the synthesis solution. A 100 μL aliquot of seed stock solution was added to 100 ml of growth solution while stirring. After about 10 min of mixing, the appropriate amount of ZGM was measured and added to the solution, followed by an additional mixing for about 5 min. The resulting mixture was divided equally into eleven 15-ml plastic centrifuge tubes, and placed in a water bath regulated at about 85° C. At each time point, the tube was removed from the water bath, quenched to room temperature (about 25° C.), sonicated for about 1 min, and filtered through a 0.2 μm membrane prior to DLS measurements. The zero time point was removed after about 5 min of equilibration in the water bath.

Preparation of Solutions for AFM Adhesion Force Measurements.

All AFM adhesion force measurements were performed in basic solutions with molar composition $4SiO_2$:$9TPAOH$:$9500H_2O$. Systematic studies of amidinium-modified tips (using mercaptoethylguanidine) as a function of pH were performed using solutions with molar compositions $10SiO_2$:$11TPAOH$:$55000H_2O$ (pH value of about 10.8) and $10SiO_2$:$125TPAOH$:$55000H_2O$ (pH value of about 12.9) to produce positively-charged and neutral amidinium moieties at pH values below and above the pKa of amidinium (pKa of about 12.1), respectively. The silanol groups on the exterior surface of silicalite-1 crystals are dissociated in alkaline solutions.

Synthesis of Mordenite.

The zeolite mordenite (MOR framework type) was synthesized from a clear solution containing a molar composition of $1.0Al_2O_3$:$100SiO_2$:$22C_5H_{11}N$:$2500H_2O$. The SDA, piperidine, was added dropwise to silicon dioxide. In a separate container, NaOH was dissolved in water, followed by the addition of aluminum sulfate hydrate. Each solution was individually stirred until homogenous (about 3 hrs), after which the two solutions were combined and stirred overnight (about 8 hours). The solution was heated for 6 days at about 160° C. to yield micron-sized crystals, which were isolated by filtration prior to characterization.

X-Ray Diffraction.

Figure 27A:
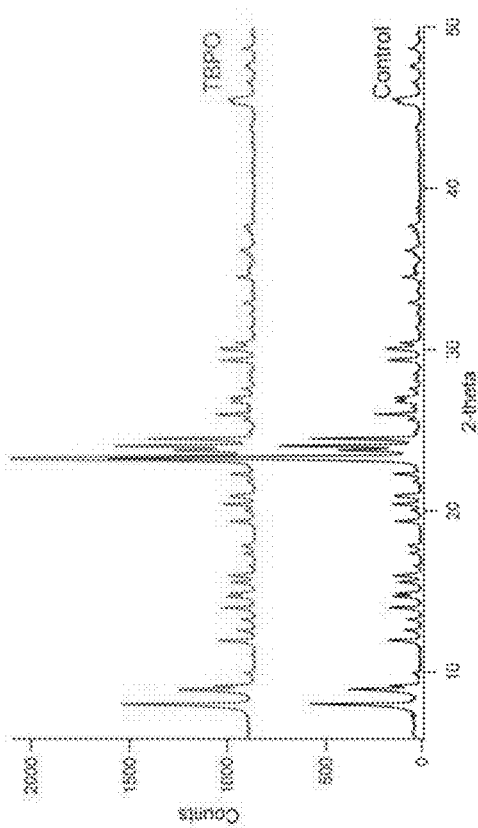
FIG. 27A contains XRD patterns of silicalite-1 control crystals.
Figure 27B:
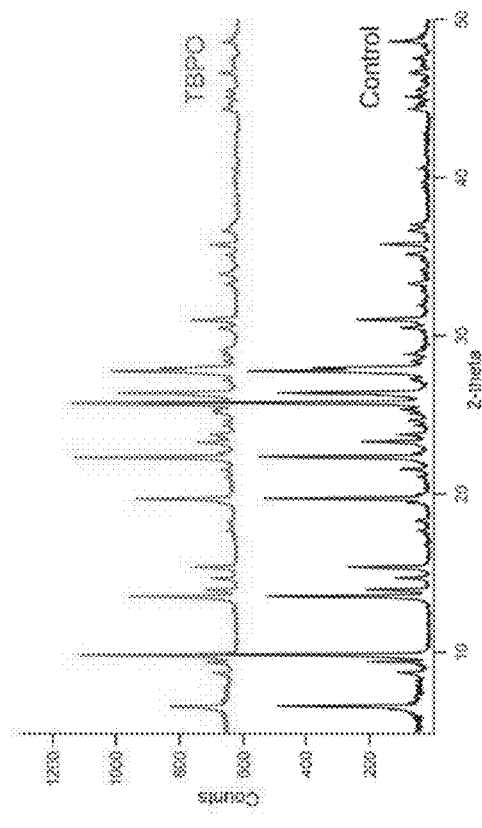
FIG. 27B contains XRD patterns of mordenite control crystals.

XRD measurements verified the framework structures of crystals synthesized in the absence (control) and presence of ZGMs. The MFI framework structure of silicate-1 crystals remains unchanged by the addition of ZGMs (shown here for TBPO). The MOR framework structure of crystals prepared in the presence of TBPO is identical to the control (FIG. 27B). The d-spacing for MFI and MOR diffraction peaks in FIGS. 27A-27B agree with the values reported in the International Zeolite Association crystal structure database. FIG. 27A contains XRD patterns of silicalite-1 control crystals and those synthesized with 0.56 wt % TBPO. FIG. 27B contains XRD patterns of mordenite control crystals and those synthesized with 8.3 wt % TBPO.

Light Scattering.

Figure 25B:
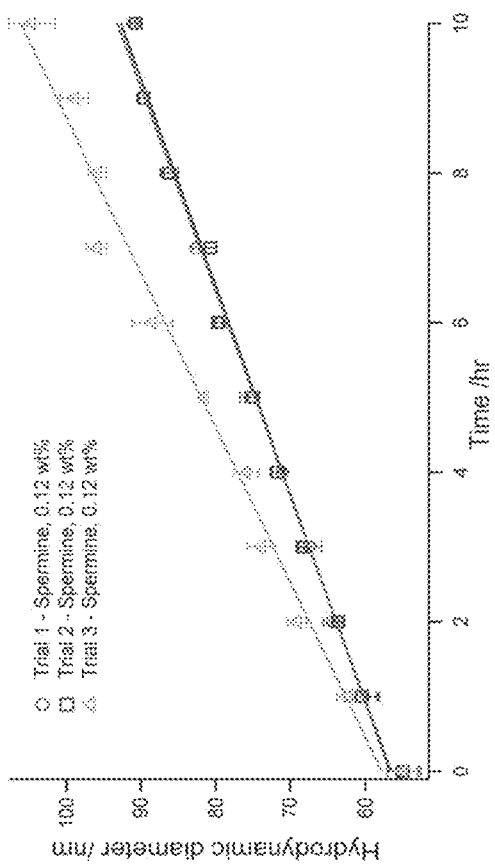
Figure 26C:
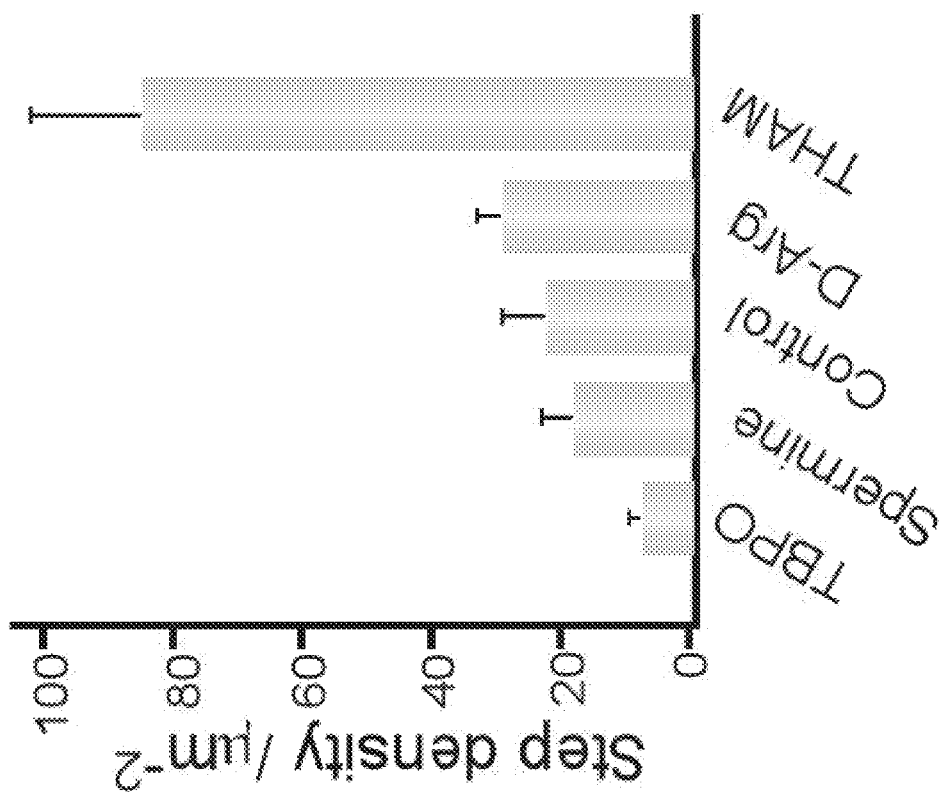
FIG. 26C is a chart that illustrates a comparison of step densities for zeolite crystals formed with different ZGMs by methods described herein.

Dynamic light scattering (DLS) was used to monitor changes in the hydrodynamic diameter of silicalite-1 seeds in growth solutions with and without ZGMs. Seeded growth was performed ex situ at about 85° C., wherein samples were removed from a water bath at various times, quenched to room temperature (about 25° C.), and immediately analyzed. The temperature of the DLS sample was regulated at about 25° C. A total of 4 measurements were taken for each sample (about 2 min for each measurement). The rate of seed growth (e.g., slope of the curves in FIG. 24) is plotted as a function of spermine concentration in FIG. 25A. Linear regression analysis reveals a linear decrease in silicalite-1 growth rate with increasing spermine concentration ($R^2$=0.88). The error bar for the 0.12 wt % data point is equal to 2 standard deviations calculated from 3 different ex situ seeded growth experiments (FIG. 25B).

FIG. 25A is a graph illustrating growth rate of 60-nm silicalite-1 seeds suspended in supersaturated silica solutions at about 85° C. as a function of spermine concentration. Growth rates are reported as the change in hydrodynamic radius with time. FIG. 25B is a graph illustrating DLS measurements of ex situ silicalite-1 growth in a supersaturated silica solution (pH value of about 12.7, about 85° C.) containing 0.12 wt % spermine.

Scanning Probe Microscopy.

AFM imaging reveals microscopic features of zeolite surfaces that can be used to validate observations in bulk crystallization studies. We used AFM topographical images to infer the effects of ZGMs on silicalite-1 step density. For these analyses, samples were prepared by transferring crystals on 1-μm membranes to a thin film of partially-cured epoxy on Ted Pella 15-mm metal disks. The epoxy was fully cured by exposure to UV light for about 1 hour to anchor silicalite-1 platelets with the basal (010) surface normal to the AFM tip. The sample was washed with deionized water to remove loosely-bound crystals and dried before use. Contact mode imaging in air was performed with Olympus probes (0.05 N/m to 2 N/m) using 256 scans/line and an average scan velocity of 1.4 μm/s. A representative image of a silicalite-1 control surface (FIGS. 28-29) reveals triangular hillocks with rounded edges and a step height of about 0.7 nm±0.1 nm, which corresponds to the height of a single pentasil chain reported for MFI layer-by-layer growth.

FIG. 28 is an AFM height image of an area of 1.5×1.5 µm$^2$ on a (010) surface of a silicalite-1 control crystal. FIG. 29 is a graph of the height profile (measured along the red line in the height image) revealing two steps with 0.7-nm height. Analysis of many surface areas on multiple crystals reveals a population of single steps of equal height and very few step bunches.

The step density, $\rho$, of silicalite-1 (010) surfaces was calculated as follows. A square area (average length=1.5 µm) was scanned at multiple (random) locations on the crystal surface. Six cross-sectional lines (similar to the red line in FIG. 28) were placed on each AFM image in a square grid pattern. The line width was adjusted to 0.125 µm to examine an area of about 0.19 µm$^2$ area. The total number of steps in each cross-section were counted and divided by the area. For example, an analysis of the line in FIG. 28 would result in four steps (corresponding to the sides of each hillock). For crystal surfaces with step bunching (e.g., step heights >0.7 nm), each step bunch was counted as a single step.

Elemental Analysis.

The use of small ZGMs in silicalite-1 syntheses can potentially lead to their occlusion within the zeolite framework. All syntheses were performed in the presence of TPA$^+$ the structure-directing agent for MFI. Determination of the organic content in silicalite-1 crystals is rendered difficult by the similarities in elemental composition of TPA$^+$ and ZGMs screened in Table 1; however, one effective ZGM is TBPO—which is distinctly different (e.g., contains a phosphorus atom). As such, elemental analysis of crystals synthesized in the presence of TBPO was performed by Galbraith Laboratories, Inc. (Knoxville, Tenn.). Uncalcined crystals were washed several times with a 50:50 water/ethanol solution to remove organic molecules adsorbed on the external surfaces. An elemental analysis revealed that the carbon, nitrogen, and phosphorus content of crystals extracted from a control synthesis and a synthesis with TBPO using a 2 TPA$^+$:1 TBPO molar composition (e.g., 4.7 wt % TBPO). The elemental analysis showed a trace quantity of TBPO (<0.02 wt %) in silicalite-1 crystals, below the detectable limit of the instrument, which suggests very little, if any, TBPO is occluded within the silicalite-1 pores. Trace amounts of TBPO in the sample may be attributed to adsorbed species on the external surface that were not removed by rinsing.

Bulk Crystallization Studies.

Figure 30A:
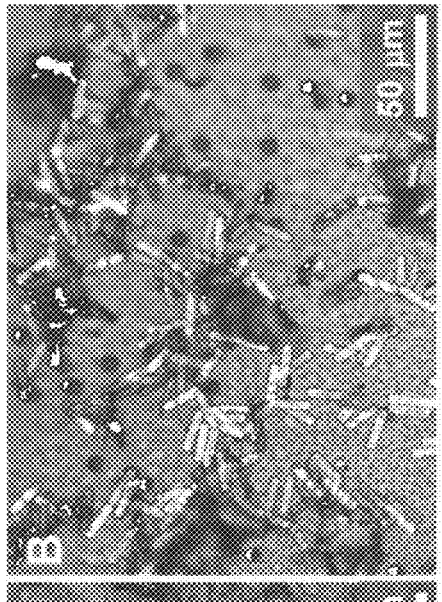
FIGS. 30A-30D are SEM images of silicalite-1 crystals subsequent to being formed by different synthesis methods.
Figure 30B:
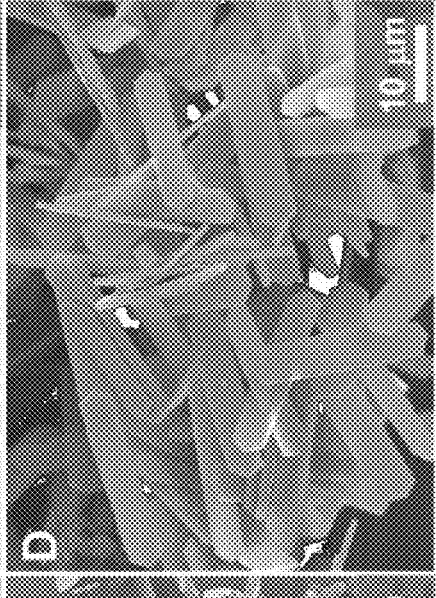
Figure 30C:
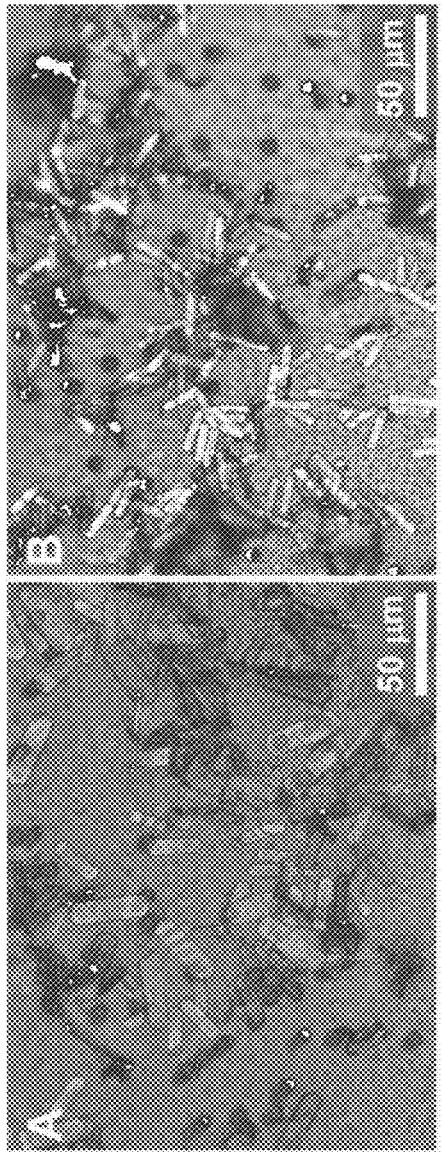
Figure 30D:
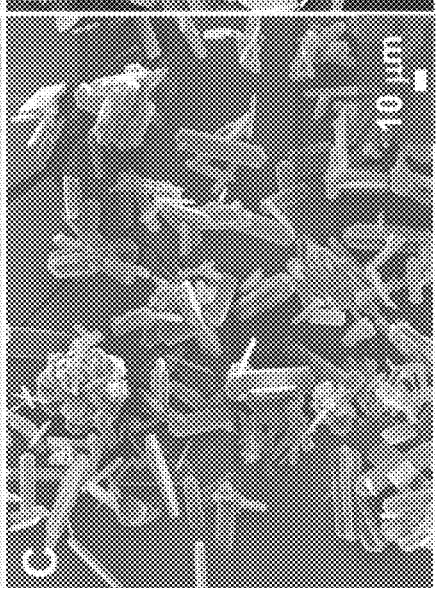

The aspect ratio of silicalite-1 (010) basal surfaces was analyzed using optical microscopy. FIGS. 30A-30D are SEM images of silicalite-1 crystals subsequent to being formed by different synthesis methods. FIGS. 30A-30B depict that the silicalite-1 crystals synthesized in absence of ZGM (FIG. 30A, control) are more polydisperse in size than the silicalite-1 crystals synthesized in the presence of 0.1 wt % spermine (FIG. 30B). FIGS. 30C-30D are SEM images that indicate the silicalite-1 crystals synthesized in the presence of 0.1 wt % spermine (FIG. 30D) have a decrease in the number of surface defects (e.g., crystal twinning) than that the silicalite-1 crystals synthesized in absence of ZGM (FIG. 30C, control). For each aspect ratio calculation, the length (c-axis) and width (a-axis) of the hexagonal platelets were measured for more than 50 crystals.

Figure 31:
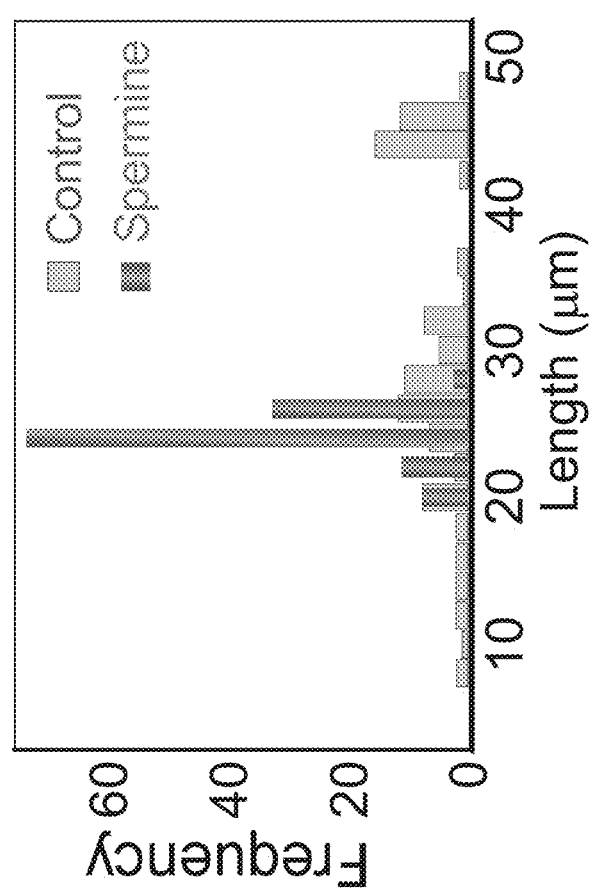
FIG. 31 is a graph illustrating dimensions of zeolite crystals.

FIG. 31 shows a graph of a silicalite-1 platelet size distribution of the length (c-axis) of basal (010) surfaces. The inclusion of 0.1 wt % spermine in silicalite-1 syntheses dramatically narrows the crystal length distribution relative to the control. In some examples, the control crystals exhibit polydisperse sizes. Similarly, several experiments with ZGMs in FIG. 31 resulted in multimodal distributions of crystal size. These experiments employed a dilute ZGM concentration (<0.2 wt %). It was observed that an increase in ZGM concentration can shift the crystal size distribution towards a single population. For example, inclusion of spermine in the growth solution resulted in a dramatic narrowing of the particle size distribution. Moreover, comparison of control crystals and those synthesized with spermine reveal a reduction in crystal twinning in the presence of the ZGM.

FIGS. 32A-32C are SEM images of silicalite-1 crystals synthesized in the presence of THAM at (FIG. 32A) about 0.2 wt % and (FIG. 32B) 3.0 wt % concentration. (FIG. 32C) AFM height image of the (010) surface of silicalite-1 crystals synthesized in the presence of about 3.0 wt % THAM reveals step bunching compared to the single steps observed at low THAM concentration (see FIG. 6C). FIG. 32D is a chart showing a comparison of the step density for crystals synthesized in the presence of D-Arg (about 0.2 wt %), THAM (about 0.2 wt % and about 3.0 wt %), and the absence of ZGM (control). The error bars are equal one standard deviation.

THAM is a weak modifier of silicalite-1 crystallization. To test the potency of THAM, syntheses were performed at two different ZGM concentrations, such as about 0.2 wt % and about 3.0 wt %. An order of magnitude increase in THAM concentration results in a two-fold increase in platelet thickness. An increased THAM concentration produced significantly more step bunches and lower step density, which shows that THAM and TPA$^+$ compete for binding sites on silicalite-1 surfaces. Higher concentrations of THAM increase the probability of interaction with the crystal surface, particularly at earlier times during silicalite-1 crystallization when the silica supersaturation is high and THAM binding to surface sites impedes step advancement, leading to a larger fraction of step bunches (FIG. 32C). Comparison of silicalite-1 (010) surface step density for D-Arg and THAM reveals the latter is less potent (FIG. 32D).

Silicalite-1 growth solutions with ZGMs were adjusted to maintain a pH equal to that of the control. Many of the tested ZGMs are acids, bases, or Zwitterionic compounds. As such, the acid/base chemistry of ZGMs is accounted for in the preparation of zeolite syntheses. The ΔpH expected from ZGM addition to silicalite-1 growth solutions was calculated and hydroxide was added as required to maintain a substantially constant pH value. By eliminating changes in the pH of the synthesis reactions, the observable changes in silicalite-1 size are attributed to the ZGM and not changes in pH. The alkalinity of silicalite-1 synthesis solutions (both with and without ZGM) was experimentally verified with a pH meter.

FIGS. 33A-33B are micrographs of aluminosilicate mordenite (MOR), which has 1-D channels with 12-membered rings and has a Si/Al ratio=100. The control sample in the absence of ZGMs produced hexagonal rods (FIG. 33A) with sharp facets. The addition of tris(2-aminoethyl)amine (about 0.52 wt %) led to the rounding of the hexagonal edges to produce leaf-like crystals (FIG. 33B). The ZGMs also altered the length of MOR crystalline rods.

FIGS. 34A-40D depict aluminosilicate chabazite formed using an adamantane structure-directing agent and an organic ZGM. The adamantane structure-directing agent has a formula $C_{10}H_{16}$ and is a cycloalkane. Adamantane molecules consist of four connected cyclohexane rings and can exist in both the chair and boat configurations. In an exemplary embodiment, the adamantine structure directing agent can be N,N,N-trimethyl-1-1-adamantammonium hydroxide (ADA-OH). The organic ZGM may have one or more alcohol groups, one or more amine group or combinations thereof. The amine group may be a primary amine, a secondary amine or a tertiary amine. In one embodiment, the organic compound can be 1,3-butanediol, 1,2,3-hexandetriol, 1,2-hexanediol, poly(diallyldimethylammonium chloride) (PDDAC), polyethyleneimine (PEIM), polyvinyl alcohol, Hexadecyltrimethylammonium bromide, isomers thereof, derivatives thereof or combinations thereof.

In the examples described below, the following chemicals were used as reagents for chabazite zeolite syntheses: Cab-O-Sil (available from Spectrum Chemical, located in New Brunswick, N.J.) Sodium hydroxide (98% pellets), aluminum hydroxide (76.5 wt % $Al_2O_3$), N,N,N-trimethyl-1-1-adamantammonium hydroxide (25 wt % in water), Ludox LS colloidal silica (available from Sigma Aldrich, Inc., located in St. Louis, Mo.), poly(diallyldimethylammonium chloride) (available from Sigma Aldrich, Inc., located in St. Louis, Mo.), 1,2-hexanediol (available from Sigma Aldrich, Inc., located in St. Louis, Mo.), polyethyleneimine (PEIM), 1,2-hexanetriol, 1,3-butanediol, triethylenetetramine (TETA), Poly (vinyl alcohol) (PVA) 80% hydrolysed, molecular weight: 9,000-10,000 (available from Sigma Aldrich, Inc., located in St. Louis, Mo.) and hexadecyltrimethylammonium bromide (available from Sigma Aldrich, Inc., located in St. Louis, Mo.). The deionized water used in all experiments was purified with an Aqua Solutions ROD1-C-12A purification system, available from Aqua Solutions, Inc., located in Jasper, Ga. All reagents were used as received without further purification.

Figures 34A, 34B:
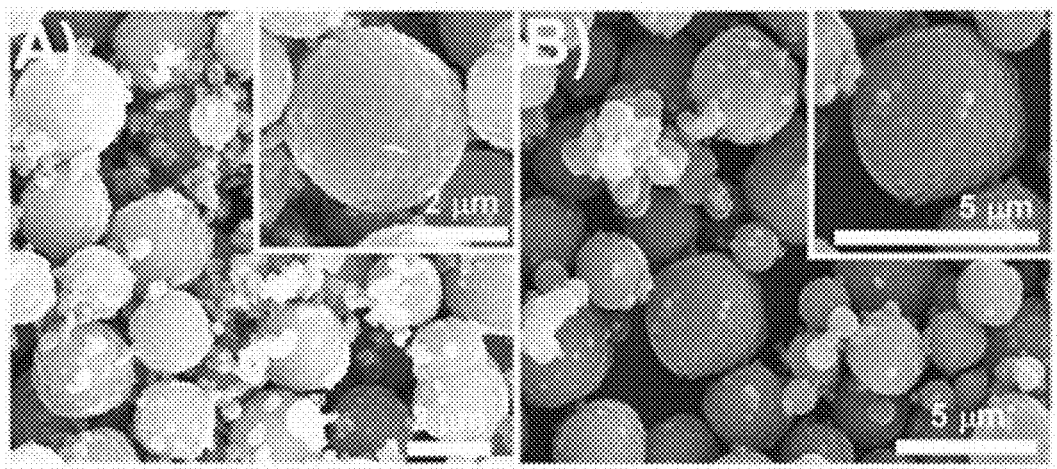
FIG. 34A is an SEM of chabazite crystals formed in the presence of a 0.2 ADA-OH molar ratio, according to one embodiment.
FIG. 34B is an SEM of chabazite crystals formed in the presence of a 0.1 ADA-OH molar ratio, according to one embodiment.

FIGS. 34A-34B depict scanning electron micrographs (SEM) of crystalline zeolite materials grown with an adamantane structure directing agent and in the absence of the organic ZGM. Chabazite crystals were synthesized in the presence of a structure-directing agent (N,N,N-trimethyl-1-1-adamantammonium hydroxide, represented as ADA-OH: Scheme 1) using solutions with a molar ratio of 0.025 $Al_2O_3$:1 $SiO_2$:0.2 NaOH:44$H_2O$:0.2 ADA-OH. Sodium hydroxide (0.09 g, 0.0022 mol) was first dissolved in water (ca. 8.21 g, 0.4959 mol), followed by addition of ADA-OH (0.95 g, 0.0011 mol). This solution was stirred until clear (a period of approximately 15 min). Aluminum hydroxide (0.05 g, 0.0005 mol) was then added to the solution and left to stir for 15 minutes at room temperature. Subsequently, a medium surface fumed silica, such as Cab-O-Sil (0.67 g, 0.0112 mol), was added to the clear solution and left for stirring for 4 hrs.

Crystals synthesized by this procedure in the absence of growth modifier are referred to as the control. 10 g of growth solution (described above) was placed in a Teflon-lined stainless steel acid digestion bomb and heated with mixing (~30 RPM) at autogenous pressure in an oven for 6 days at 180° C. An exemplary oven which may be employed with embodiments described herein is a ThermoFisher Precision Premium 3050 Series gravity oven, available from ThermoFisher Scientific, located in Waltham, Mass. The reaction product was isolated as a white powder by centrifuging the mother liquor three times with sufficient amount of deionized water at the speed of about 13000 RPM for 45 minutes. For the preparation of microscopy samples, a small amount of powder was re-dispersed in deionized water and shaken vigorously. An aliquot of this solution was then placed on a glass slide and dried overnight. All samples for microscopy studies were prepared via transfer of crystals from the glass slide to scanning electron microscopy (SEM) or atomic force microscopy (AFM) sample holders.

Chabazite samples were characterized by powder X-ray diffraction (XRD), atomic force microscopy (AFM), and scanning electron microscopy (SEM). XRD patterns were collected with an X-ray diffractometer using CuKα radiation (40 kV, 30 mA). An exemplary diffractometer useable with embodiments described herein is a Siemens D5000 X-ray diffractometer, available from Siemens Corporation, located in Washington, D.C. AFM analysis was performed on a MFP-3D-SA instrument, available from Asylum Research, located in Santa Barbara, Calif. Tapping mode images were obtained with 256 scans/line at an average scan velocity of 1.2 μm/s. SEM was conducted using a FEI 235 Dual-Beam (Focused Ion-beam) System, available from FEI Company, located in Hillsboro, Oreg. The focused ion-beam system was operated at 15 kV and a 5 mm working distance. All zeolite samples were coated with a carbon layer prior to imaging.

Figure 34C:
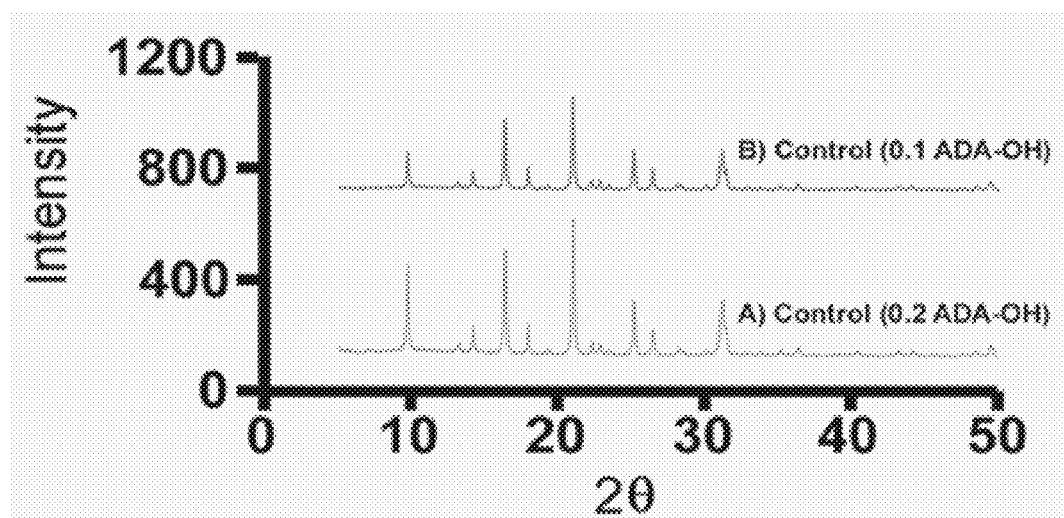
FIG. 34C is a graph of the powder XRD patterns of chabazite; formed according to embodiments described herein.

FIG. 34A is an SEM of chabazite crystals formed in the presence of a 0.2 ADA-OH molar ratio (the control sample) and FIG. 34B is an SEM of chabazite crystals formed in the presence of a 0.1 ADA-OH molar ratio. The form and structure of the crystals grown at either ratio are visibly indistinguishable. FIG. 34C is a graph of the powder XRD patterns of chabazite as shown in FIG. 34A (1 $SiO_2$:0.2 ADA-OH molar ratio) and as shown for FIG. 34B, using reduced SDA concentration (1 $SiO_2$:0.1 ADA-OH molar ratio). The diffraction patterns show the same peak position and intensity. Therefore, lowering the concentration of ADA-OH did not have a significant influence on crystal size, purity, or yield.

Figures 35A, 35B:
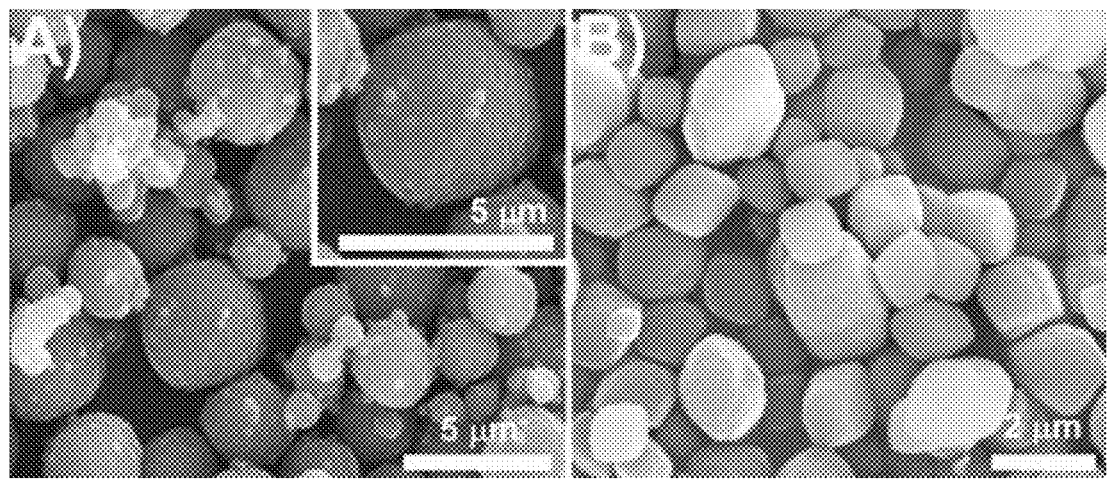
FIG. 35A is a SEM image of chabazite crystals grown using fumed silica, according to one embodiment.
FIG. 35B is a SEM image of chabazite crystals grown using a colloidal silica source, according to one embodiment.

FIGS. 35A-35B depict scanning electron micrographs (SEM) of crystalline zeolite materials grown with an adamantane structure directing agent and in the absence of the organic ZGM, according to another embodiment. The chabazite crystals were grown in a substantially similar way as described with reference to FIGS. 34A-34C. FIG. 35A is a SEM image of chabazite crystals grown using fumed silica and FIG. 35B is a SEM image of chabazite crystals grown using a colloidal silica source. Replacing the above described silica source (fumed silica) with a colloidal silica source results in a dramatic reduction in crystal size, as shown by the comparison of FIGS. 35A and 35B, producing nanometer-sized crystals that appear to be agglomerates.

Figure 35C:
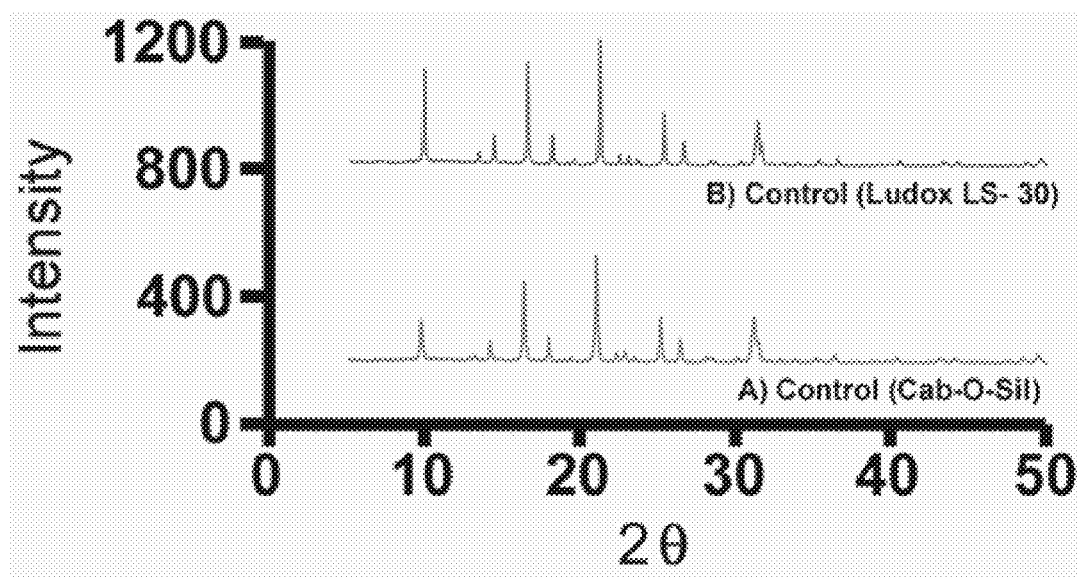
FIG. 35C is a graph of the powder XRD patterns of chabazite formed with fumed or colloidal silica, according to embodiments described herein.

FIG. 35C is a graph of the powder XRD patterns of chabazite as shown in FIG. 35A (using fumed silica or Cab-O-Sil) and as shown for FIG. 35B, using the colloidal silica source (Ludox LS-30). The diffraction patterns show the same peak position and intensity with a stable baseline, indicating that the final product is fully crystalline for both sources.

Figures 36A, 36B:
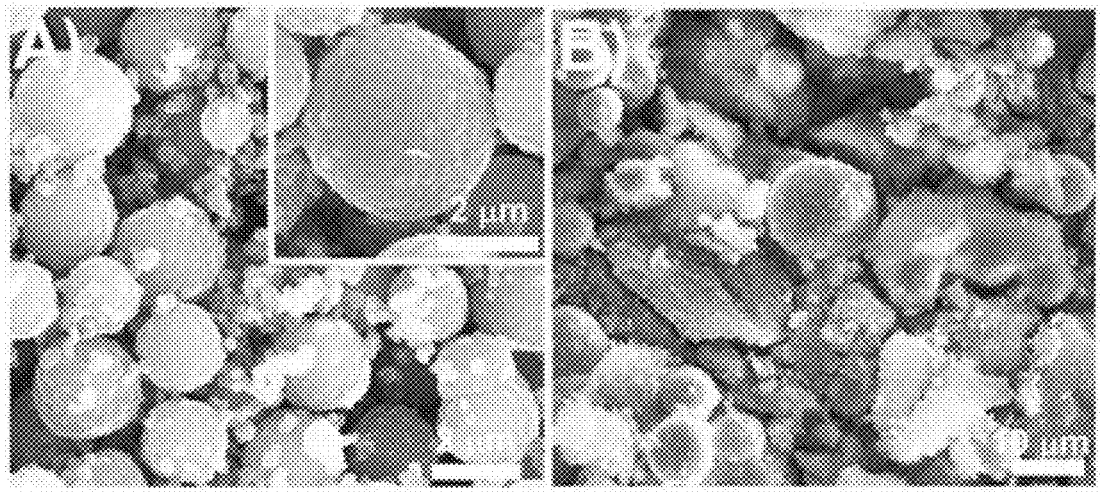
FIG. 36A is a SEM image of chabazite crystals grown according to embodiments described herein
FIG. 36B is a SEM image of chabazite crystals grown at a reduced temperature, according to embodiments described herein.

FIGS. 36A-36B depict scanning electron micrographs (SEM) of crystalline zeolite materials grown with an adamantane structure directing agent and in the absence of the organic ZGM, according to another embodiment. The chabazite crystals were grown in a substantially similar way as described with reference to FIGS. 34A-34C. FIG. 36A is a SEM image of chabazite crystals grown with chemistry as described above with reference to FIG. 34A-34C and temperature (approximately 160 degrees Celsius) and FIG. 36B is a SEM image of chabazite crystals grown with chemistry as described above with reference to FIG. 34A-34C at a reduced temperature (approximately 150 degrees Celsius). Reducing the temperature resulted in a change in the visible form of the crystals, as shown by the comparison of FIGS. 36A and 36B, producing smaller crystals among an amorphous structure.

Figure 36C:
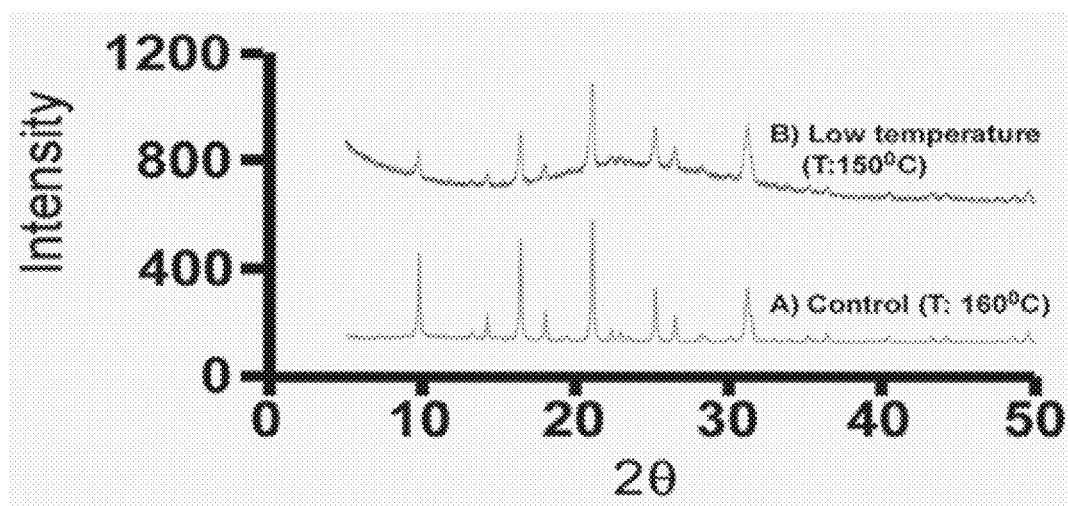
FIG. 36C is a graph of the powder XRD patterns of chabazite grown using either standard temperature or lower temperature, according to embodiments described herein.

FIG. 36C is a graph of the powder XRD patterns of chabazite as shown in FIG. 36A (using chemistry and temperature as described above with reference to FIG. 34A-34C) and as shown for FIG. 36B, using the lower temperature. The diffraction patterns show the same peak position and intensity with an unstable baseline, indicating that the latter produced a product containing amorphous material. FIGS. 36A-36C suggest that if lower temperatures are used for the production of chabazite as described herein, longer times may be needed to obtain a fully crystalline material.

FIGS. 37A-37C depict scanning electron micrographs (SEM) of crystalline zeolite materials grown with an adamantane structure directing agent and in the presence of the organic ZGM, PEIM, according to another embodiment. Polyethylene amine is a neutral polymer. As shown at the above concentration of PEIM, crystals on the order of 100-200 nm can be grown.

FIG. 37A is a SEM image of chabazite crystals grown with chemistry as described above with reference to FIG. 34A-34C grown at 180 degrees Celsius in the absence of a ZGM. FIG. 37B is a SEM image of chabazite crystals grown with chemistry as described above with reference to FIG. 34A-34C grown at 180 degrees Celsius in the presence of PEIM at a concentration of 1.0 wt %. FIG. 37C is a SEM image of chabazite crystals grown with chemistry as described above with reference to FIG. 34A-34C grown at 180 degrees Celsius in the presence of PEIM at a concentration of 1.6 wt %. In FIG. 37A, the zeolite crystals have the standard size and shape, at about 3-4 µm in diameter. As shown in FIG. 37B, the crystal size is approximately 1 µm in diameter and in FIG. 37C, the crystal size is approximately 100-200 nm in diameter. Further, there is a distinction in the shape of the crystal in the presence of PEIM. In FIG. 37A, the crystal is largely circular whereas the addition of PEIM to the zeolite forming mixture described above creates a cubic shape in the resulting crystals.

Without intending to be bound by theory, the polymer may be blocking the initial aggregation of the zeolite crystal. Stated another way, the polymer may be preventing the initial crystals from coming together. Further, the crystals prior to aggregation are believed to have a largely cubic shape, which is distorted as the crystals aggregate. By preventing initial aggregation, the crystals may be able to be maintained at a smaller size and in a more clearly defined shape.

FIG. 37D is a graph of the powder XRD patterns of chabazite as shown in FIG. 37A (using chemistry as described above with reference to FIG. 34A-34C at 180 degrees Celsius), as shown for FIG. 37B (using 1.0 wt % PEIM at 180 degrees Celsius), and as shown for FIG. 37C (using 1.6 wt % PEIM at 180 degrees Celsius). The diffraction patterns show the same peak position and intensity with a stable baseline, indicating that the final product is fully crystalline for all sources.

Figure 38A:
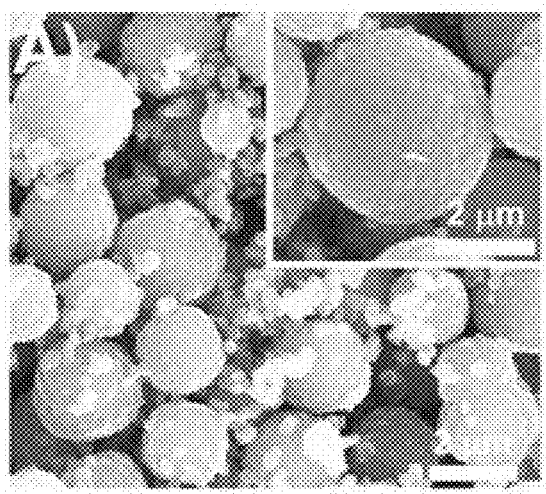
FIG. 38A is a SEM image of chabazite crystals grown according to further embodiments described herein.
Figure 38B:
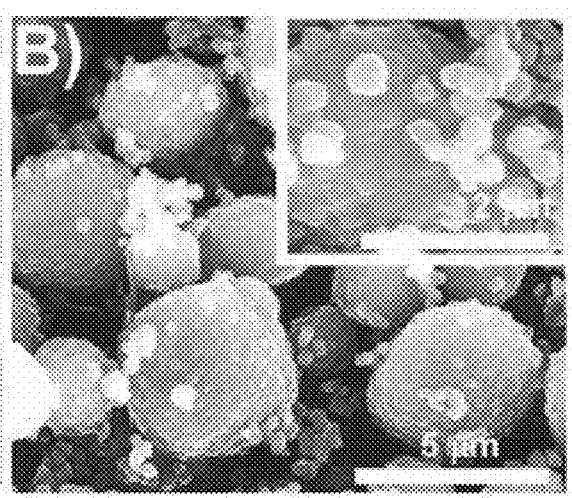
FIG. 38B is a SEM image of chabazite crystals grown in the presence of 1,2-hexanediol at a first concentration ratio, according to embodiments described herein.
Figure 38C:
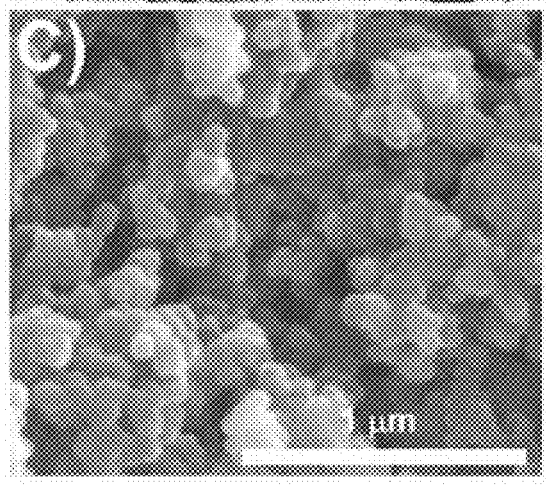
FIG. 38C is a SEM image of chabazite crystals grown in the presence of 1,2-hexanediol at a second concentration ratio, according to embodiments described herein.

FIGS. 38A-38C depict scanning electron micrographs (SEM) of crystalline zeolite materials grown with an adamantane structure directing agent and in the presence of the organic ZGM, 1,2-hexanediol, according to another embodiment.

Figure 38D:
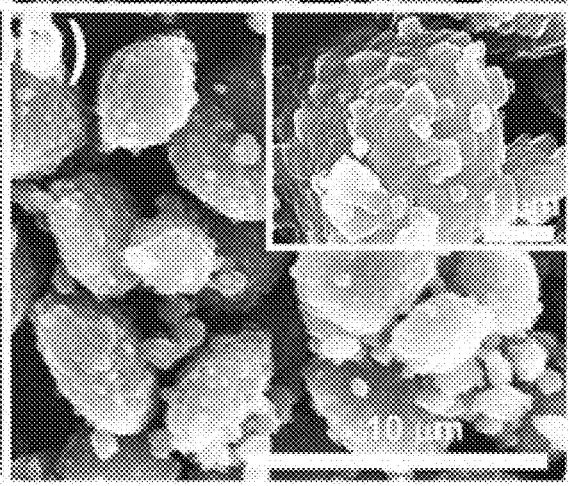
FIG. 38D is a SEM image of chabazite crystals grown with chemistry as described above with reference to FIG. 34A-34C.

FIG. 38A is a SEM image of chabazite crystals grown with chemistry as described above with reference to FIG. 34A-34C grown at 160 degrees Celsius in the absence of a ZGM. FIG. 38B is a SEM image of chabazite crystals grown with chemistry as described above with reference to FIG. 34A-34C grown at 160 degrees Celsius in the presence of 1,2-hexanediol at a concentration ratio of 0.8 ZGM:1.0 $SiO_2$. FIG. 38C is a SEM image of chabazite crystals grown with chemistry as described above with reference to FIG. 34A-34C grown at 160 degrees Celsius in the presence of 1,2-hexanediol at a concentration ratio of 1.1 ZGM:1.0 $SiO_2$. FIG. 38D is a SEM image of chabazite crystals grown with chemistry as described above with reference to FIG. 34A-34C grown at 180 degrees Celsius in the presence of 1,2-hexanediol at a concentration ratio of 1.2 ZGM:1.0 $SiO_2$. In FIG. 38A, the zeolite crystals have the standard size and shape, at about 3-4 µm in diameter. As shown in FIG. 38B, the crystal size is approximately 3-4 µm in diameter with an altered surface shape, becoming less round. In FIG. 38C, the crystal size is approximately 100 nm in diameter but appears to have accumulated in a largely amorphous structure. In FIG. 38D, the crystal size is approximately 3-4 µm in diameter and has taken on a more disk-like shape. Further, there is a distinction in the surface texture of the crystal in the presence of 1,2-hexanediol. In FIG. 38A the crystal is largely circular whereas the addition of 1,2-hexanediol to the zeolite forming mixture described above creates cubic shapes in the surface texture of the resulting crystals. The change in surface texture increases the available surface area on the zeolite crystal.

Figure 39:
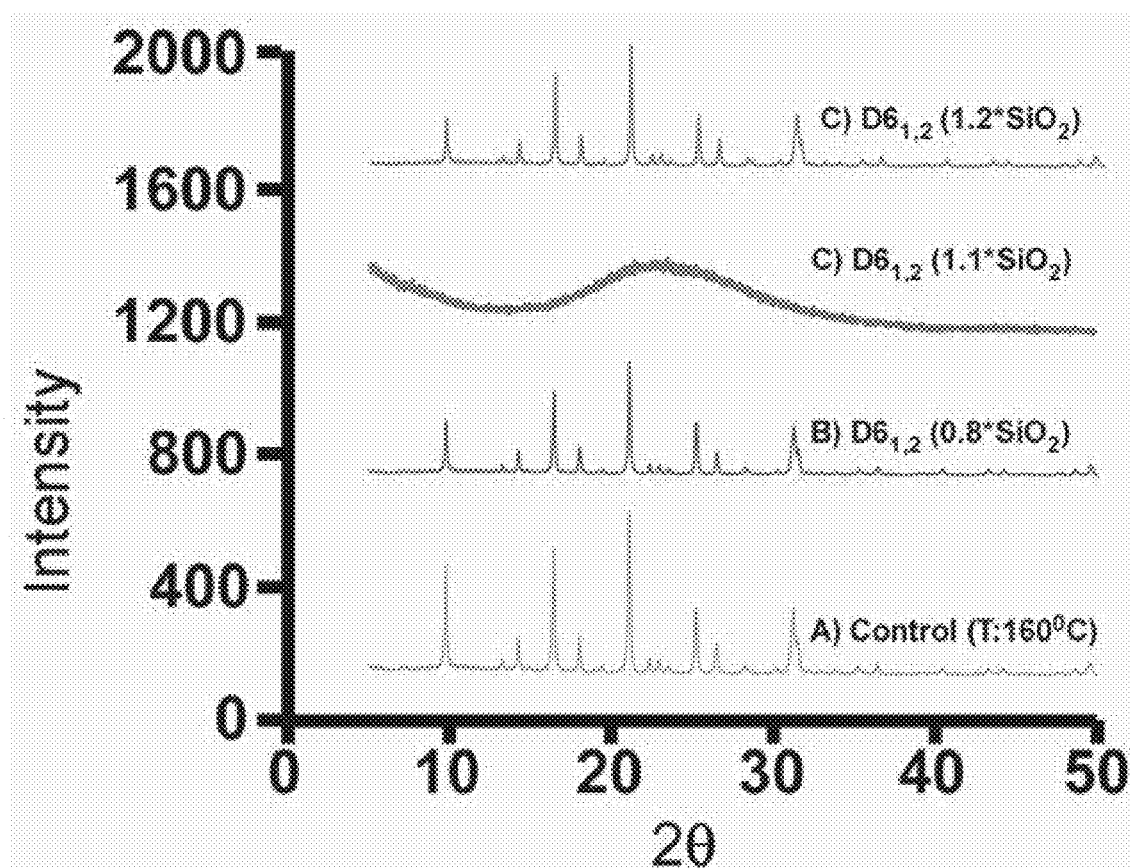
FIG. 39 depicts powder XRO patterns for chabazite crystals grown using 1,2-hexanediol, according to embodiments described herein.

FIG. 39 depicts powder XRD patterns for chabazite crystals prepared at the following conditions: (FIG. 38A) control at 160° C., (FIG. 38B) 1,2-hexanediol (0.8 ZGM: 1.0 $SiO_2$) at 160° C., (FIG. 38C) 1,2-hexanediol (1.1 ZGM: 1.0 $SiO_2$) at 160° C., and (FIG. 38D) 1,2-hexanediol (1.2 ZGM: 1.0 $SiO_2$) at 180° C. The samples prepared from the crystals grown in FIGS. 38A, 38B and 38D have diffraction patterns show the same peak position and intensity with a stable baseline, indicating that the final product is fully crystalline for all sources. FIG. 38C is missing all parameters, which indicates limited crystallinity in the final product. Without intending to be bound by theory, at 1,2-hexanediol concentrations above a threshold value, the presence of the organic ZGM suppresses crystal growth (within the timeframe analyzed), as indicated in FIG. 38C. Increasing the temperature, however, results in crystallization at higher ZGM concentrations, as shown in FIG. 38D. Thus, it is believed that, by increasing temperature or time of the resulting mixture described with reference to FIG. 38C, higher 1,2-hexanediol concentrations can result in crystalline products as shown in FIG. 38D.

FIGS. 40A-40C depict scanning electron micrographs (SEM) of crystalline zeolite materials grown with an adamantane structure directing agent and in the presence of the organic ZGM, PDDAC, according to another embodiment.

FIG. 40A is a SEM image of chabazite crystals grown with chemistry as described above with reference to FIG. 34A-34C grown at 180 degrees Celsius in the absence of a ZGM. FIG. 40B is a SEM image of chabazite crystals grown with chemistry as described above with reference to FIG. 34A-34C grown at 160 degrees Celsius in the presence of PDDAC at a concentration of 0.5 wt %. FIG. 40C is a SEM image of chabazite crystals grown with chemistry as described above with reference to FIG. 34A-34C grown at 180 degrees Celsius in the presence of PDDAC at a concentration of 0.5 wt %. In FIG. 40A, the zeolite crystals have the standard size and shape, at about 3-4 µm in diameter. As shown in FIG. 40B, the crystal size is approximately 10-20 µm in diameter and in FIG. 40C, the crystal size is approximately 40 µm in diameter. Further, there is a distinction in the shape of the crystal in the presence of PEIM. In FIG.

40A, the crystal is largely circular whereas the addition of PDDAC to the zeolite forming mixture described above creates a cubic shape in the resulting crystals.

FIG. 40D depicts powder XRD patterns for chabazite crystals prepared at the following conditions: (FIG. 40A) control at 160° C., and (FIG. 40B) PDDAC at a concentration of 0.5 wt % at 160° C. The samples prepared from the crystals grown in FIGS. 40A and 40B have diffraction patterns show the same peak position and intensity with a stable baseline, indicating that the final product is fully crystalline for all sources.

PDDAC produces larger zeolite crystals in a counterintuitive fashion. The particle size increased by an order of magnitude. FIG. 40A depicts control deposition in the absence of the PDDAC ZGM. Adding the ZGM at a concentration of 0.5 wt % at 160 degrees Celsius creates crystals that appear to be 5 fold larger than control. Adding the ZGM at a concentration of 0.5 wt % and increasing the temperature to 180 degrees Celsius increases the particle size to approximately 10 fold larger than control. Thus, unexpectedly, the particles are getting larger as temperature is increased. Without intending to be bound by theory, the initial starting zeolite mixture is very negatively charged. PDDAC has a positive charge on it, which is believed to facilitate aggregation. Increased temperature exacerbates this effect creating much larger particles.

FIGS. 41A-41F depicts further ZGM molecules useable in the formation of zeolites, according to one or more embodiments. The concentrations listed here for the various ZGM molecules are exemplary and are not intended to be limiting of all possible concentrations.

FIG. 41A is the name, formula and chemical structure of 1,3-butanediol alongside a SEM image of chabazite crystals grown with chemistry and temperature as described above with reference to FIG. 34A-34C in the presence of 1,3-butanediol at a concentration of 8.1 wt %. The crystal size is approximately 3-4 μm with a visibly smooth surface texture and a cubic to spheric shape.

FIG. 41B is the name, formula and chemical structure of 1,2,3-hexandetriol alongside a SEM image of chabazite crystals grown with chemistry and temperature as described above with reference to FIG. 34A-34C in the presence of 1,2,3-hexandetriol at a concentration of 11.9 wt %. The crystal size is approximately 3-4 μm with a visibly smooth surface texture and a cubic to spheric shape.

FIG. 41C is the name, formula and chemical structure of polyvinyl alcohol alongside a SEM image of chabazite crystals grown with chemistry and temperature as described above with reference to FIG. 34A-34C in the presence of polyvinyl alcohol at a concentration of 1.0 wt %. The crystal size is approximately 6-7 μm with a visibly smooth surface texture and a cubic to spheric shape.

FIG. 41D is the name, formula and chemical structure of triethylenetetramine alongside a SEM image of chabazite crystals grown with chemistry and temperature as described above with reference to FIG. 34A-34C in the presence of triethylenetetramine at a concentration of 19.5 wt %. The crystal size is approximately 10-12 μm with a visibly smooth surface texture and a cubic to spheric shape.

FIG. 41E is the name, formula and chemical structure of 1,2-hexanediol and PDDAC alongside a SEM image of chabazite crystals grown with chemistry and temperature as described above with reference to FIG. 34A-34C in the presence of 1,2-hexanediol and PDDAC at a concentration of 13.3 wt % and 0.19 wt % respectively. The crystal size is approximately 2-3 μm with a rough surface texture and a cubic shape.

FIG. 41F is the name, formula and chemical structure of hexadecyltrimethylammonium bromide alongside a SEM image of chabazite crystals grown with chemistry and temperature as described above with reference to FIG. 34A-34C in the presence of hexadecyltrimethylammonium bromide at a concentration of 5.0 wt %. The crystal size is approximately 500 nm with a visibly smooth surface texture and an amorphous shape.

In one embodiment, a method for forming a zeolite material is provided and includes combining at least one framework source precursor, a ZGM, an optional mineralizing agent, and a solvent to form a plurality of zeolite crystals within a suspension during a synthesis process. The method further includes that each of the zeolite crystals contains a crystalline zeolite material having a single crystal structure, an upper surface of the crystalline zeolite material extending substantially parallel to a lower surface of the crystalline zeolite material, a length of the upper surface within a range from about 10 nm to about 50 μm, a width of the upper surface within a range from about 10 nm to about 50 μm, a plurality of side surfaces extending between the upper and lower surfaces, a thickness of the crystalline zeolite material extending substantially perpendicular between the upper and lower surfaces, an aspect ratio of about 4 or greater, wherein the aspect ratio is determined as a sum of one half of the length and one half of the width of the upper surface relative to the thickness of the crystalline zeolite material, and a plurality of vertical channels extending between the upper and lower surfaces, wherein each vertical channel independently has an exclusive diffusion pathway extending from an opening on the upper surface, through the crystalline zeolite material, and to an opening on the lower surface. In many examples, the method provides forming the crystalline zeolite material with an aspect ratio of about 6 or greater, about 10 or greater, about 15 or greater, is about 20 or greater, is about 30 or greater, is about 50 or greater, is about 100 or greater.

In another embodiment of a method for forming a zeolite material, the method includes that each of the zeolite crystals contains a crystalline zeolite material having a single crystal structure, an upper surface of the crystalline zeolite material extending substantially parallel to a lower surface of the crystalline zeolite material, wherein the upper surface has a step density of about 25 steps/μm² or greater, a length of the upper surface within a range from about 10 nm to about 50 μm, a width of the upper surface within a range from about 10 nm to about 50 μm, and a plurality of side surfaces extending between the upper and lower surfaces. In many examples, the method provides forming the crystalline zeolite material with an upper surface having a step density of about 40 steps/μm² or greater, such as about 80 steps/μm² or greater, such as about 150 steps/μm² or greater, such as about 200 steps/μm² or greater.

In another embodiment of a method for forming a zeolite material, the method includes combining at least one framework source precursor, a ZGM, an optional mineralizing agent, and a solvent to form a synthesis mixture, forming zeolite seed crystals within the synthesis mixture during a synthesis step, wherein each of the zeolite seed crystals has a single crystalline structure and a first crystal habit, and maintaining the synthesis mixture at a predetermined temperature for a predetermined time during a growth step, wherein the ZGM is adsorbed to outer surfaces of the zeolite seed crystals within the synthesis mixture and each of the zeolite seed crystals form a zeolite crystal having the single crystalline structure and a second crystal habit different than the first crystal habit.

In some examples, the ZGM binds or adsorbs to upper and lower surfaces of the zeolite seed crystals while side surfaces of the zeolite seed crystals remain substantially free of the ZGM during the growth step. In other examples, the ZGM binds or adsorbs to the side surfaces of the zeolite seed crystals while the upper and lower surfaces of the zeolite seed crystals remain substantially free of the ZGM during the growth step. The method further includes growing the zeolite crystals from the zeolite seed crystals at a faster rate in a two-dimension plane than in a third dimension/direction perpendicular to the two-dimension plane during the growth process. Also, the ZGM is generally maintained at a concentration within the second zeolite suspension to enable the faster growth rate in the two-dimension plane than in the third dimension/direction.

The formed zeolite crystal have an aspect ratio of about 4 or greater (e.g., about 10 to about 100 or greater), wherein the aspect ratio is determined as a sum of one half of a length and one half of a width of an upper surface of the zeolite crystal relative to a thickness of the zeolite crystal. In addition, the zeolite seed crystal generally have an aspect ratio of less than 4 (e.g., about 0.5 to about 3.5), wherein the aspect ratio is determined as a sum of one half of a length and one half of a width of an upper surface of the zeolite seed crystal relative to a thickness of the zeolite seed crystal.

In another embodiment of a method for forming a zeolite material, the method includes combining at least one framework source precursor, an SDA, and a solvent to form a plurality of zeolite seed crystals within a first zeolite suspension during a synthesis process, combining a ZGM and the plurality of zeolite seed crystals to form a plurality of zeolite crystals within a second zeolite suspension during a growth process, and maintaining the second zeolite suspension at a predetermined temperature for a predetermined time during the growth step. Each of the formed zeolite crystals contains a crystalline zeolite material having a single crystal structure, an aspect ratio of about 4 or greater and/or a step density of about 25 steps/$\mu m^2$ or greater.

In one example, each of the formed zeolite crystals contains a crystalline zeolite material having a single crystal structure, an upper surface of the crystalline zeolite material extending substantially parallel to a lower surface of the crystalline zeolite material, a length of the upper surface within a range from about 10 nm to about 50 μm, a width of the upper surface within a range from about 10 nm to about 50 μm, a plurality of side surfaces extending between the upper and lower surfaces, a thickness of the crystalline zeolite material measured between the upper and lower surfaces and extending substantially perpendicular to the upper and lower surfaces, an aspect ratio of about 4 or greater, wherein the aspect ratio is determined as a sum of one half of the length and one half of the width of the upper surface relative to the thickness of the crystalline zeolite material, and a plurality of vertical channels extending between the upper and lower surfaces, wherein each vertical channel independently has an exclusive diffusion pathway extending from an opening on the upper surface, through the crystalline zeolite material, and to an opening on the lower surface.

In another example, each of the formed zeolite crystals contains a crystalline zeolite material having a single crystal structure, an upper surface of the crystalline zeolite material extending substantially parallel to a lower surface of the crystalline zeolite material, wherein the upper surface has a step density of about 25 steps/$\mu m^2$ or greater, a length of the upper surface within a range from about 10 nm to about 50 μm, a width of the upper surface within a range from about 10 nm to about 50 μm, and a plurality of side surfaces extending between the upper and lower surfaces.

While the foregoing is directed to embodiments of the invention, other and further embodiments of the invention may be devised without departing from the basic scope thereof, and the scope thereof is determined by the claims that follow.

The invention claimed is:

1. A composition of a zeolite, comprising:
    a crystalline zeolite material comprised of a plurality of zeolite crystals, each zeolite crystal having a single cubic crystal structure, wherein each zeolite crystal has a crystal structure of chabazite;
    an upper surface of the zeolite crystal extending substantially parallel to a lower surface of the zeolite crystal;
    a length of the upper surface within a range from about 10 nm to about 1 μm;
    a width of the upper surface within a range from about 10 nm to about 1 μm;
    a plurality of side surfaces extending between the upper and lower surfaces;
    a thickness of the crystalline zeolite material extending substantially perpendicular between the upper and lower surfaces;
    an aspect ratio of about 4 or greater, wherein the aspect ratio is determined as a sum of one half of the length and one half of the width of the upper surface relative to the thickness of the crystalline zeolite material; and
    a plurality of vertical channels extending between the upper and lower surfaces, wherein each vertical channel independently has an exclusive diffusion pathway extending from an opening on the upper surface, through the crystalline zeolite material, and to an opening on the lower surface.

2. The composition of claim 1, wherein the crystalline zeolite material comprises a material selected from the group consisting of silicate, aluminosilicate, silicoaluminophosphate, aluminumphosphate, derivatives thereof, and combinations thereof.

* * * * *

UNITED STATES PATENT AND TRADEMARK OFFICE
CERTIFICATE OF CORRECTION

PATENT NO. : 10,662,070 B2  
APPLICATION NO. : 16/183862  
DATED : May 26, 2020  
INVENTOR(S) : Jeffrey D. Rimer et al.

Page 1 of 2

It is certified that error appears in the above-identified patent and that said Letters Patent is hereby corrected as shown below:

In the Specification
1. In Column 2, Line 1, delete "capable forming" and insert -- capable of forming --, therefor.
2. In Column 4, Line 30, delete "liner" and insert -- linear --, therefor.
3. In Column 5, Line 18, delete "tetraarylammonium" and insert -- tetraamylammonium --, therefor.
4. In Column 5, Lines 64-65, delete "GAS, CFI, CHA, CHI, CLO, DAG, DOR, DON, EDI, EMT, ERi," and insert -- CAS, CFI, CHA, CHI, CLO, DAC, DDR, DON, EDI, EMT, ERI, --, therefor.
5. In Column 12, Line 12, delete "illustrating a of" and insert -- illustrating a --, therefor.
6. In Column 13, Line 57, delete "XRO" and insert -- XRD --, therefor.
7. In Column 14, Line 4, delete "XRO" and insert -- XRD --, therefor.
8. In Column 14, Line 10, delete "POOAC," and insert -- PDDAC, --, therefor.
9. In Column 14, Line 13, delete "POOAC," and insert -- PDDAC, --, therefor.
10. In Column 14, Line 15, delete "XRO" and insert -- XRD --, therefor.
11. In Column 14, Line 16, delete "POOAC," and insert -- PDDAC, --, therefor.
12. In Column 18, Line 26, delete "praline," and insert -- proline, --, therefor.
13. In Columns 23 & 24, Table 1, Under "Chemical Formula", Line 5, delete "alkyl," and insert -- alkyl, alkene, --, therefor.
14. In Columns 23 & 24, Table 1, Under "Chemical Formula", Line 12, delete "HO2CCH(NH2)(CH2)4NH3" and insert -- HO2CCH(NH2)(CH2)4NH2 --, therefor.
15. In Column 29, Line 60, delete "Rs" and insert -- R8 --, therefor.
16. In Column 30, Line 24, delete "Rg" and insert -- R9 --, therefor.
17. In Column 30, Line 36, delete "liner" and insert -- linear --, therefor.
18. In Column 34, Line 19, delete "tetraarylammonium" and insert -- tetraamylammonium --, therefor.
19. In Column 38, Line 15, delete "GAS, CHA, CHI, DAG, DOR, EDI, ERi," and insert -- CAS, CHA, CHI, DAC, DDR, EDI, ERI, --, therefor.
20. In Column 41, Line 17, delete "(FIG. 120)" and insert -- (FIG. 12D) --, therefor.
21. In Column 48, Lines 18-19, delete "supersaturation, cr." and insert -- supersaturation, σ --, therefor.
22. In Column 48, Line 25, delete "reduced p)." and insert -- reduced ρ). --, therefor.
23. In Column 48, Line 57, delete "SA-MFP-30." and insert -- SA-MFR-3D. --, therefor.
24. In Column 49, Line 29, delete "ROD1-C-12A" and insert -- RODI-C-12A --, therefor.

Signed and Sealed this  
Seventeenth Day of August, 2021

Drew Hirshfeld  
*Performing the Functions and Duties of the  
Under Secretary of Commerce for Intellectual Property and  
Director of the United States Patent and Trademark Office*

25. In Column 49, Line 63, delete "liner," and insert -- linear, --, therefor.
26. In Column 50, Line 11, delete "liner," and insert -- linear, --, therefor.
27. In Column 50, Line 45, delete "liner," and insert -- linear, --, therefor.
28. In Column 50, Line 58, delete "liner," and insert -- linear, --, therefor.